(12) United States Patent
Machida et al.

(10) Patent No.: US 11,128,823 B2
(45) Date of Patent: Sep. 21, 2021

(54) IMAGING APPARATUS, DRIVING METHOD, AND ELECTRONIC DEVICE

(71) Applicant: SONY CORPORATION, Tokyo (JP)

(72) Inventors: Takashi Machida, Tokyo (JP); Ryoji Suzuki, Kanagawa (JP); Hiroshi Tayanaka, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/088,142

(22) PCT Filed: Mar. 17, 2017

(86) PCT No.: PCT/JP2017/010866
§ 371 (c)(1),
(2) Date: Dec. 22, 2020

(87) PCT Pub. No.: WO2017/169885
PCT Pub. Date: Oct. 5, 2017

(65) Prior Publication Data
US 2021/0112214 A1    Apr. 15, 2021

(30) Foreign Application Priority Data
Mar. 31, 2016    (JP) .............................. JP2016-070061

(51) Int. Cl.
*H04N 5/355*    (2011.01)
*H04N 5/369*    (2011.01)
(Continued)

(52) U.S. Cl.
CPC ........... *H04N 5/3559* (2013.01); *H04N 5/355* (2013.01); *H04N 5/369* (2013.01); *H04N 5/3742* (2013.01);
(Continued)

(58) Field of Classification Search
CPC .............. H04N 5/3559; H04N 5/37452; H01L 27/14609
See application file for complete search history.

(56) References Cited

U.S. PATENT DOCUMENTS 8,786,745 B2 *    7/2014   Kawahito ............ H04N 5/3559
                                                                348/296
8,917,341 B2 *   12/2014   Sakano ............... H04N 5/37452
                                                                348/308
(Continued)

FOREIGN PATENT DOCUMENTS

CN    102170533 A    8/2011
CN    103685999 A    3/2014
(Continued)

OTHER PUBLICATIONS

International Search Report and Written Opinion of PCT Application No. PCT/JP2017/010866, dated May 30, 2017, 12 pages of ISRWO.

*Primary Examiner* — John Villecco
(74) *Attorney, Agent, or Firm* — Chip Law Group

(57) ABSTRACT

Provided is an imaging apparatus that includes a pixel array portion, a plurality of unit pixels in the pixel array portion, and a driving unit that controls an operation of the unit pixel. The unit pixel includes a photoelectric converter, a charge retention unit that retains a charge, a charge-voltage converter that converts the charge into a voltage, a first transmitting unit that transmits the charge from the photoelectric converter to the charge retention unit, a second transmitting unit that transmits the charge from the photoelectric converter to the charge-voltage converter, and a third transmitting unit that transmits the charge from the charge retention unit to the charge-voltage converter.

18 Claims, 27 Drawing Sheets

(51) Int. Cl.
*H04N 5/374* (2011.01)
*H04N 5/3745* (2011.01)
*H01L 27/146* (2006.01)

(52) U.S. Cl.
CPC ... *H04N 5/37452* (2013.01); *H01L 27/14609* (2013.01)

(56) References Cited

U.S. PATENT DOCUMENTS

| | | | |
|---|---|---|---|
| 9,106,851 B2* | 8/2015 | Fenigstein | H04N 5/355 |
| 9,118,883 B2* | 8/2015 | Wan | H04N 5/335 |
| 9,905,604 B2* | 2/2018 | Murata | H01L 27/1461 |
| 9,942,492 B2* | 4/2018 | Innocent | H01L 27/14643 |
| 9,942,503 B2* | 4/2018 | Velichko | H04N 5/3597 |
| 10,072,974 B2* | 9/2018 | Geurts | G01J 1/4228 |
| 10,134,788 B2* | 11/2018 | Lyu | H01L 27/14609 |
| 10,142,574 B2* | 11/2018 | Morimoto | H04N 5/23258 |
| 10,204,957 B2* | 2/2019 | Murata | H01L 27/1461 |
| 10,397,499 B2* | 8/2019 | Shigeta | H04N 5/3532 |
| 10,440,297 B2* | 10/2019 | Innocent | H04N 5/363 |
| 10,455,177 B2* | 10/2019 | Tsuboi | H04N 5/35572 |
| 10,469,775 B2* | 11/2019 | McCarten | H04N 5/35581 |
| 2008/0018763 A1* | 1/2008 | Sato | H04N 5/335 348/308 |
| 2011/0211103 A1* | 9/2011 | Sakano | H04N 5/37452 348/308 |
| 2011/0242378 A1* | 10/2011 | Mabuchi | H04N 5/353 348/296 |
| 2012/0327281 A1* | 12/2012 | Mabuchi | H04N 5/347 348/302 |
| 2013/0044247 A1* | 2/2013 | Kawahito | H04N 5/37452 348/296 |
| 2013/0135486 A1* | 5/2013 | Wan | H04N 5/335 348/207.99 |
| 2013/0222681 A1 | 8/2013 | Wan | |
| 2014/0077058 A1 | 3/2014 | Sakano | |
| 2015/0076330 A1* | 3/2015 | Lyu | H04N 5/37457 250/214.1 |
| 2016/0049438 A1* | 2/2016 | Murata | H01L 27/14603 257/229 |
| 2017/0353675 A1* | 12/2017 | Onuki | H04N 5/3745 |
| 2017/0366764 A1* | 12/2017 | Innocent | H04N 5/3559 |
| 2018/0175097 A1* | 6/2018 | Murata | H04N 5/3696 |
| 2018/0191969 A1* | 7/2018 | Innocent | H04N 5/363 |
| 2018/0288343 A1* | 10/2018 | McCarten | H04N 5/3592 |
| 2019/0026902 A1* | 1/2019 | Kiyamura | H04N 19/139 |
| 2019/0067348 A1* | 2/2019 | Yamasaki | H01L 27/14609 |
| 2019/0172867 A1* | 6/2019 | Murata | H01L 27/14627 |
| 2019/0356872 A1* | 11/2019 | Manabe | H04N 5/3535 |
| 2020/0329208 A1* | 10/2020 | Ando | H04N 5/3745 |
| 2020/0411572 A1* | 12/2020 | Sekine | H01L 27/14831 |
| 2021/0014438 A1* | 1/2021 | Yang | H04N 5/3575 |
| 2021/0112212 A1* | 4/2021 | Oh | H04N 5/3559 |
| 2021/0112214 A1* | 4/2021 | Machida | H04N 5/355 |
| 2021/0127079 A1* | 4/2021 | Shim | H04N 5/35581 |
| 2021/0136299 A1* | 5/2021 | Hynecek | H04N 5/378 |

FOREIGN PATENT DOCUMENTS

| | | | | |
|---|---|---|---|---|
| CN | 104937719 A | 9/2015 | | |
| EP | 2362642 A1 | 8/2011 | | |
| JP | 3071891 B2 | 7/2000 | | |
| JP | 2001-346096 A | 12/2001 | | |
| JP | 2006-217410 A | 8/2006 | | |
| JP | 2006217410 A * | 8/2006 | ........... | H04N 5/3559 |
| JP | 2008-028678 A | 2/2008 | | |
| JP | 2008-035395 A | 2/2008 | | |
| JP | 2008035395 A * | 2/2008 | | |
| JP | 4317115 B2 | 8/2009 | | |
| JP | 2011-199816 A | 10/2011 | | |
| JP | 2014-060519 A | 4/2014 | | |
| KR | 10-2011-0098624 A | 9/2011 | | |
| KR | 10-2015-0087322 A | 7/2015 | | |
| TW | 200810540 A | 2/2008 | | |
| TW | 201143067 A | 12/2011 | | |
| TW | 201426987 A | 7/2014 | | |
| WO | 2014/080625 A1 | 5/2014 | | |

\* cited by examiner

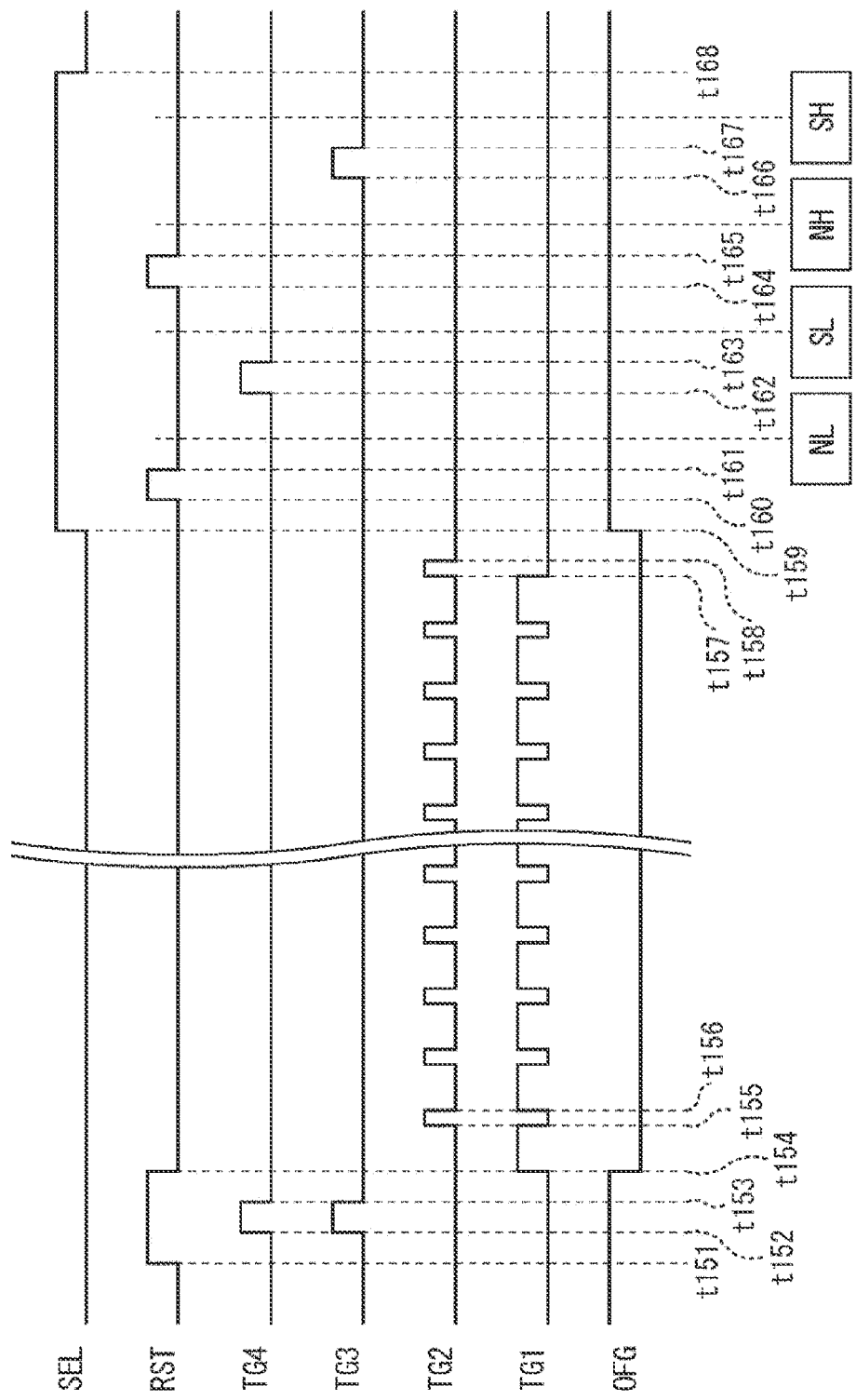

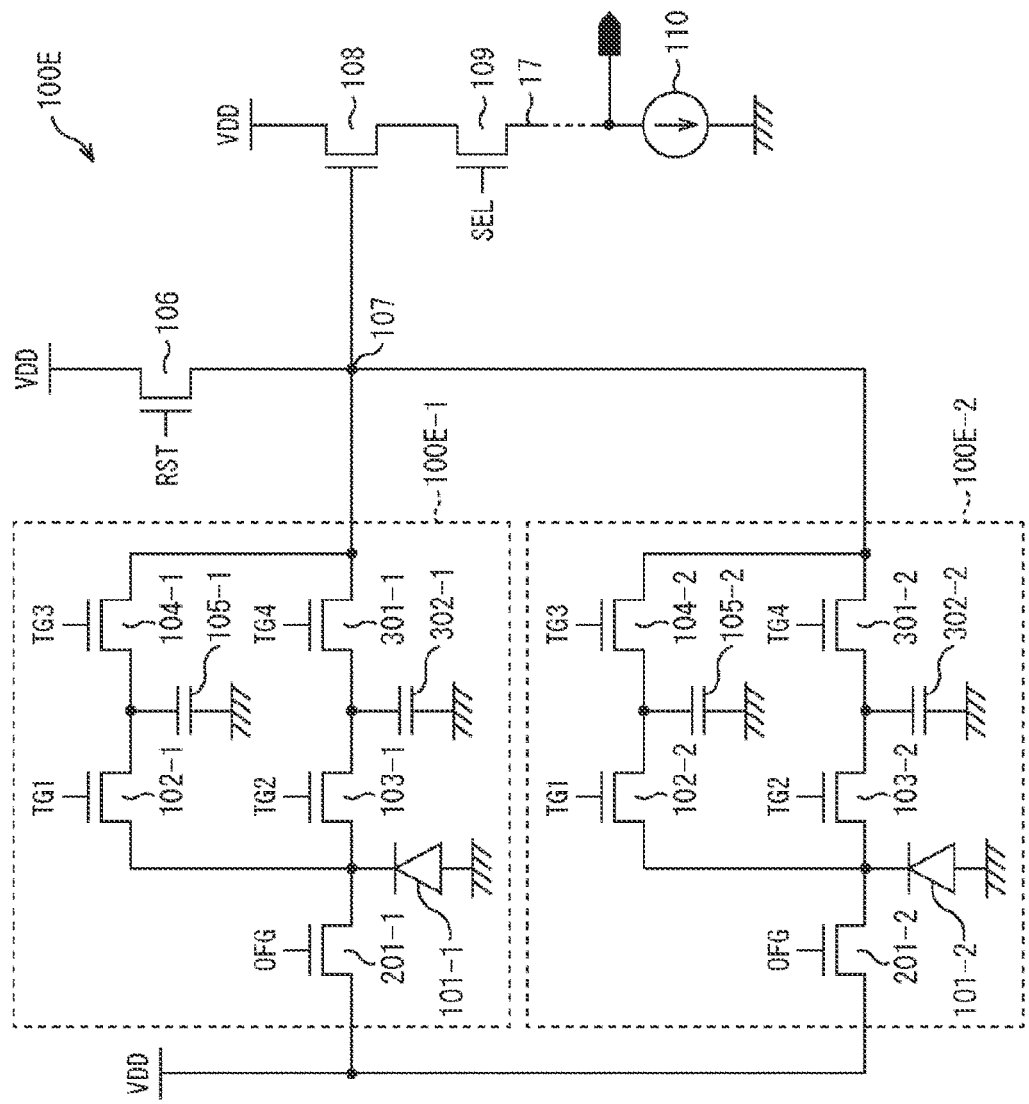

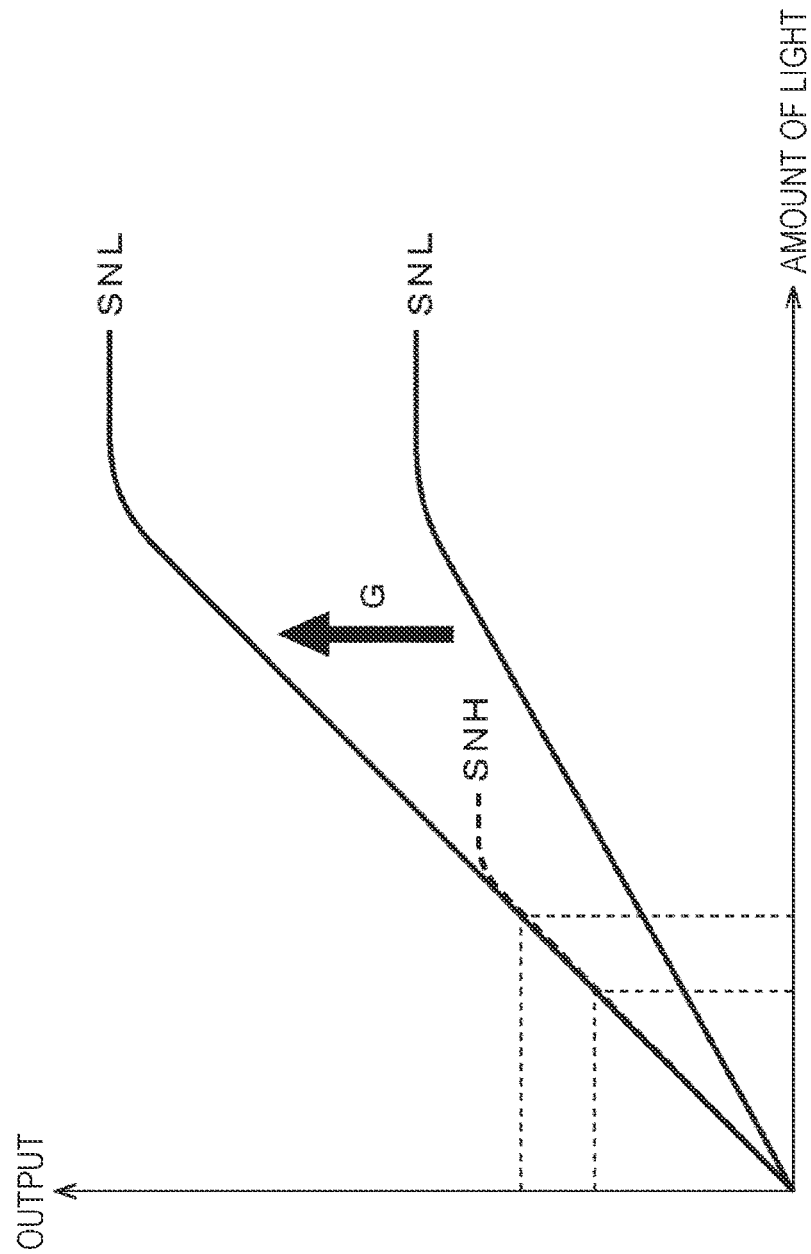

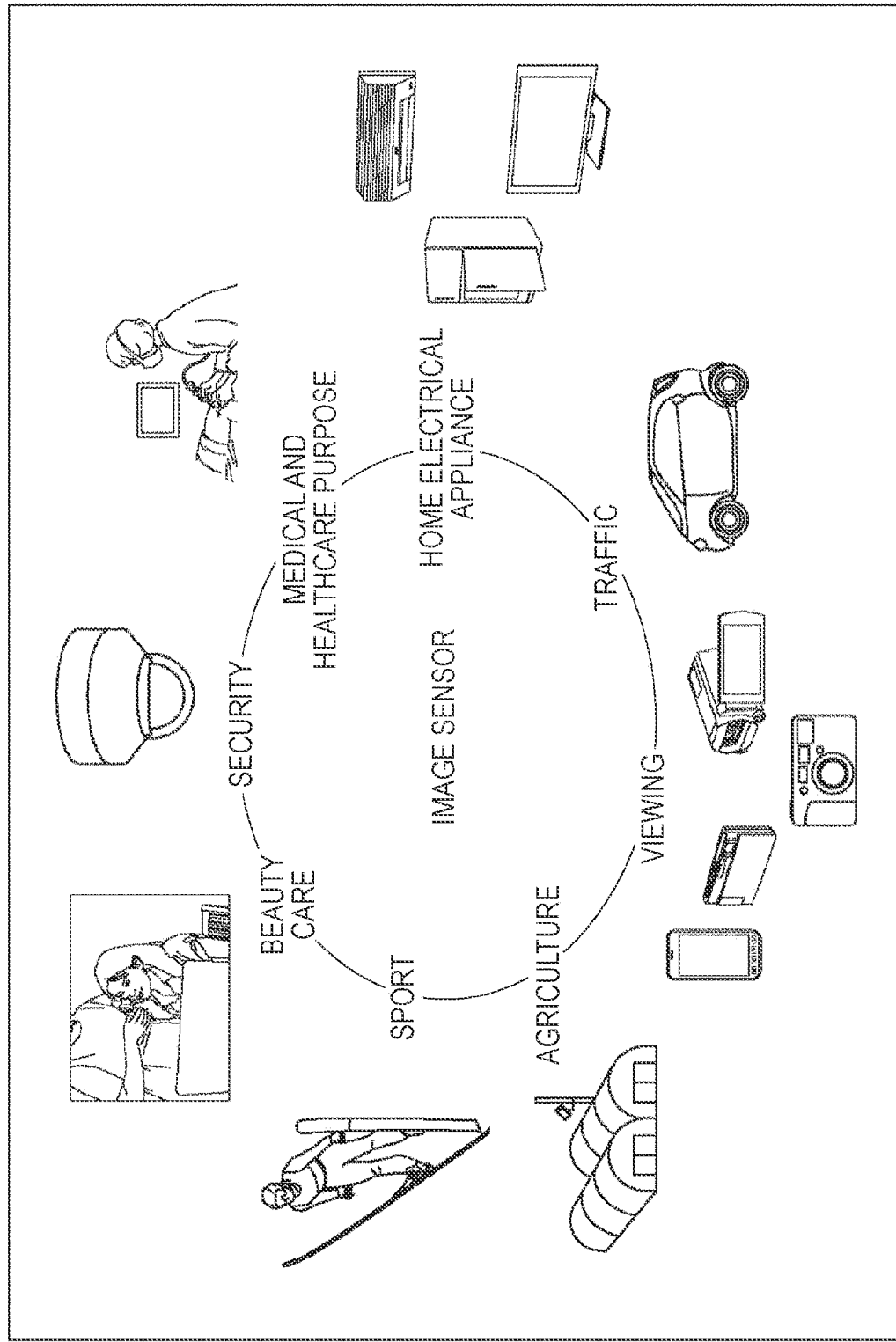

IMAGING APPARATUS, DRIVING METHOD, AND ELECTRONIC DEVICE

CROSS REFERENCE TO RELATED APPLICATIONS

This application is a U.S. National Phase of International Patent Application No. PCT/JP2017/010866 filed on Mar. 17, 2017, which claims priority benefit of Japanese Patent Application No. JP 2016-070061 filed in the Japan Patent Office on Mar. 31, 2016. Each of the above-referenced applications is hereby incorporated herein by reference in its entirety.

TECHNICAL FIELD

The present technology relates to an imaging apparatus, a driving method, and an electronic device, and in particular, relates to an imaging apparatus, a driving method, and an electronic device, which are capable of expanding a dynamic range.

BACKGROUND ART

In the related art, there is a dynamic range expansion technology of various types of imaging apparatuses.

For example, a time-division manner is known in which capturing is performed at different sensitivities in a time-division manner, and a plurality of images captured in a time-division manner are synthesized (for example, refer to Patent Document 1).

Furthermore, for example, a space-division manner is known in which light receiving elements having different sensitivities are disposed, and a plurality of images respectively captured by the light receiving elements having different sensitivities are synthesized, and thus, a dynamic range expands (for example, refer to Patent Document 2).

Moreover, for example, an in-pixel memory system is known in which a memory accumulating a charge overflowed from a photodiode is disposed in each pixel, and a charge amount capable of being accumulated in one exposure period increases, and thus, a dynamic range expands (for example, refer to Patent Document 3).

CITATION LIST

Patent Document

Patent Document 1: Japanese Patent Application Laid-Open No. 2001-346096
Patent Document 2: Japanese Patent No. 3071891
Patent Document 3: Japanese Patent No. 4317115

SUMMARY OF THE INVENTION

Problems to be Solved by the Invention

However, in the time-division manner or the space-division manner, the number of divisions increases, and thus, it is possible to expand the dynamic range, but in a case where the number of divisions increases, there is a possibility that an image quality is impaired due to the occurrence of an artifact, a decrease in a definition, or the like.

Furthermore, in the in-pixel memory system, the capacity of the memory is limited, and thus, there is limitation in the dynamic range capable of expanding.

The present technology has been made in consideration of such circumstances described above, and is capable of expanding a dynamic range of an imaging apparatus without impairing an image quality.

Solutions to Problems

An imaging apparatus of one aspect of the present technology includes: a pixel array portion, a plurality of unit pixels being arranged in the pixel array portion; and a driving unit configured to control an operation of the unit pixel, in which the unit pixel includes a photoelectric converter, a charge retention unit configured to retain a charge, a charge-voltage converter configured to convert the charge into a voltage, a first transmitting unit configured to transmit the charge from the photoelectric converter to the charge retention unit, a second transmitting unit configured to transmit the charge from the photoelectric converter to the charge-voltage converter, and a third transmitting unit configured to transmit the charge from the charge retention unit to the charge-voltage converter.

A driving method of one aspect of the present technology is a driving method performed by an imaging apparatus including a pixel array portion, a plurality of unit pixels being arranged in the pixel array portion, and a driving unit configured to control an operation of the unit pixel, the unit pixel including a photoelectric converter, a charge retention unit configured to retain a charge, a charge-voltage converter configured to convert the charge into a voltage, a first transmitting unit configured to transmit the charge from the photoelectric converter to the charge retention unit, a second transmitting unit configured to transmit the charge from the photoelectric converter to the charge-voltage converter, and a third transmitting unit configured to transmit the charge from the charge retention unit to the charge-voltage converter, the driving method including alternately performing the transmission of the charge from the photoelectric converter to the charge retention unit and the transmission of the charge from the photoelectric converter to the charge-voltage converter by alternately turning on the first transmitting unit and the second transmitting unit in an exposure period.

An electronic device of one aspect of the present technology includes an imaging apparatus including a pixel array portion, a plurality of unit pixels being arranged in the pixel array portion, and a driving unit configured to control an operation of the unit pixel, in which the unit pixel includes a photoelectric converter, a charge retention unit configured to retain a charge, a charge-voltage converter configured to convert the charge into a voltage, a first transmitting unit configured to transmit the charge from the photoelectric converter to the charge retention unit, a second transmitting unit configured to transmit the charge from the photoelectric converter to the charge-voltage converter, and a third transmitting unit configured to transmit the charge from the charge retention unit to the charge-voltage converter.

In the imaging apparatus of one aspect of present technology, the unit pixel of the pixel array portion in which the plurality of unit pixels are arranged, includes the photoelectric converter, the charge retention unit configured to retain the charge, the charge-voltage converter configured to convert the charge into the voltage, the first transmitting unit configured to transmit the charge from the photoelectric converter to the charge retention unit, the second transmitting unit configured to transmit the charge from the photoelectric converter to the charge-voltage converter, and the third transmitting unit configured to transmit the charge from the charge retention unit to the charge-voltage converter.

In the driving method of one aspect of the present technology, in the exposure period of the imaging apparatus, the transmission of the charge from the photoelectric converter to the charge retention unit and the transmission of the charge from the photoelectric converter to the charge-voltage converter are alternately performed by alternately turning on the first transmitting unit and the second transmitting unit.

The electronic device of one aspect of the present technology includes the imaging apparatus.

Effects of the Invention

According to one aspect of the present technology, it is possible to expand a dynamic range of an imaging apparatus without impairing an image quality.

Note that, effects described here are not necessarily limited, and may be any effect described in the present disclosure.

BRIEF DESCRIPTION OF DRAWINGS

FIG. 9 is a diagram for illustrating time when a transmission transistor is turned on.

FIG. 10 is a diagram for illustrating the time when the transmission transistor is turned on.

FIG. 25 is a diagram for illustrating an operation of the unit pixel in the sixth embodiment.

FIG. 26 is a diagram for illustrating a configuration of a shared pixel.

FIG. 27 is a (first) characteristic diagram of an amount of incident light-output provided for describing signal processing.

FIG. 29 is a diagram illustrating a usage example of an imaging apparatus.

MODE FOR CARRYING OUT THE INVENTION

Hereinafter, embodiments for carrying out the present technology (hereinafter, referred to as embodiments) will be described.

Note that, the description will be performed in the following order.

1. Imaging Apparatus to which Present Technology is Applied
2. First Embodiment
3. Second Embodiment
4. Third Embodiment
5. Fourth Embodiment
6. Fifth Embodiment
7. Sixth Embodiment
8. Description relevant to Denoising Processing and Arithmetic Processing
9. Modification Example
10. Usage Example of Imaging Apparatus <Imaging Apparatus to which Present Technology is Applied>
{Basic System Configuration}

Figure 1:
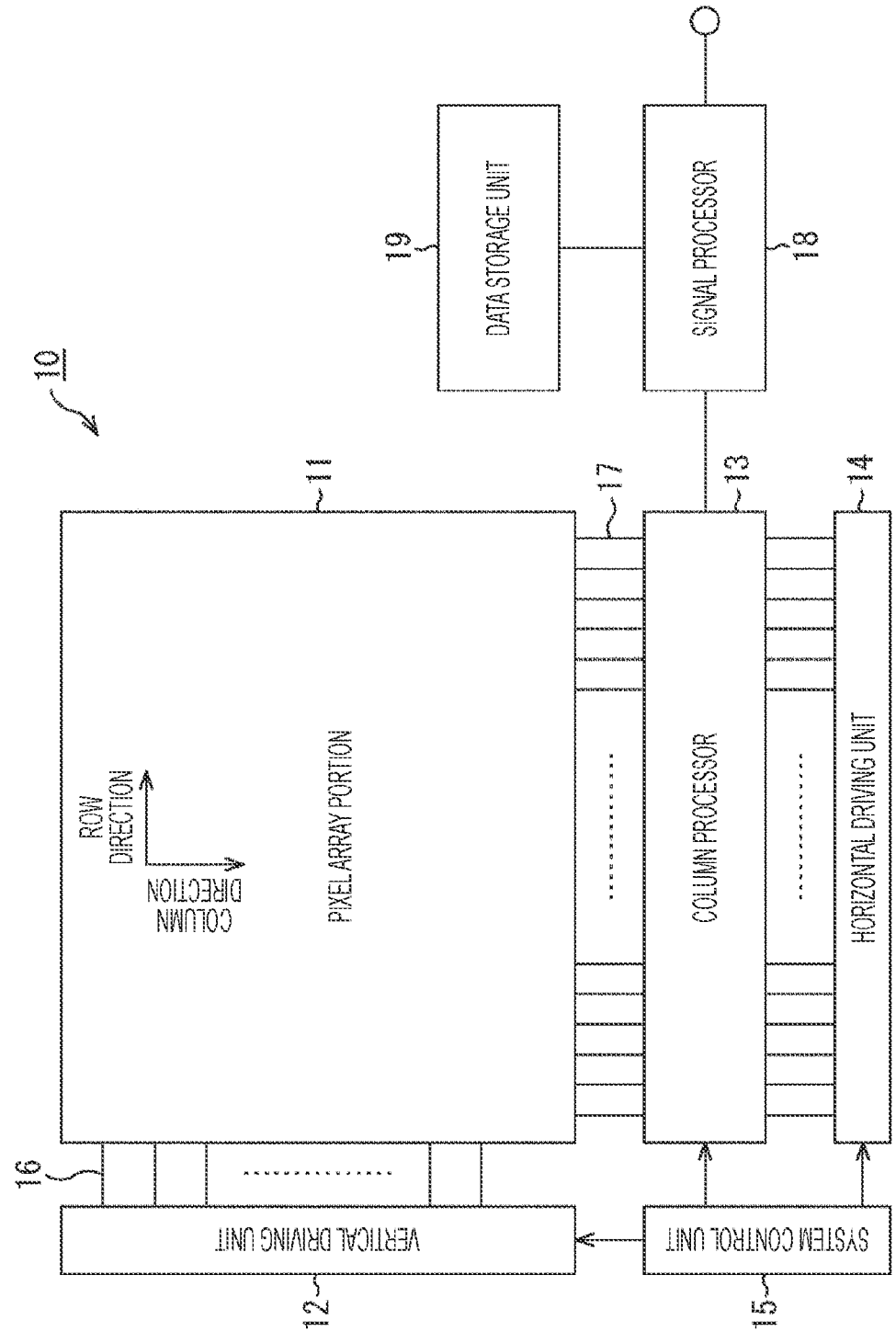
FIG. 1 is a system configuration diagram illustrating an outline of a configuration of a CMOS image sensor to which the present technology is applied.

FIG. 1 is a system configuration diagram illustrating an outline of a configuration of a CMOS image sensor, which is one type of imaging apparatus to which the present technology is applied, for example, one type of X-Y addressing scheme imaging apparatus. Here, the CMOS image sensor is an image sensor prepared by applying a CMOS process or by partially using the CMOS process.

A CMOS image sensor 10 according to this application example includes a pixel array portion 11 formed on a semiconductor substrate (a chip) (not illustrated), and a peripheral circuit portion integrated on the same semiconductor substrate as that of the pixel array portion 11. The peripheral circuit portion, for example, includes a vertical driving unit 12, a column processor 13, a horizontal driving unit 14, and a system control unit 15.

Moreover, the CMOS image sensor 10 includes a signal processor 18 and a data storage unit 19. The signal processor 18 and the data storage unit 19 may be mounted on the same substrate as that of the CMOS image sensor 10, or may be arranged on a substrate different from that of the CMOS image sensor 10. Furthermore, each processing of the signal processor 18 and the data storage unit 19 may be processing according to an external signal processor disposed on a substrate different from that of the CMOS image sensor 10, for example, a digital signal processor (DSP) circuit or software.

In the pixel array portion 11, unit pixels including a photoelectric converter configured to generate and accumulate a charge according to the amount of received light (hereinafter, may be simply referred to as "pixels") are arranged in a row direction and a column direction, in other words, are two-dimensionally arranged into the shape of a matrix. Here, the row direction indicates an arrangement direction of pixels of a pixel row (in other words, a horizontal direction), and the column direction indicates an arrangement direction of pixels of a pixel column (in other words, a vertical direction). A specific circuit configuration or a pixel structure of the unit pixel will be described later in detail.

In the pixel array portion 11, a pixel driving line 16 is wired along the row direction for each pixel row, a vertical signal line 17 is wired along the column direction for each pixel column, with respect to the matrix-like pixel array. The pixel driving line 16 transmits a driving signal for performing driving at the time of reading out a signal from a pixel. In FIG. 1, one pixel driving line 16 is wired, but the number of pixel driving lines 16 is not limited to 1. One end of the pixel driving line 16 is connected to an output end corresponding to each row of the vertical driving unit 12.

The vertical driving unit 12 includes a shift register, an address decoder, or the like, and all of the pixels of the pixel array portion 11 are simultaneously driven, each of the pixels of the pixel array portion 11 is driven in row unit, or the like. In other words, the vertical driving unit 12 configures a driving unit controlling the operation of each of the pixels of the pixel array portion 11, along with the system control unit 15 controlling the vertical driving unit 12. A specific configuration of the vertical driving unit 12 is not illustrated in the drawings, but in general, the vertical driving unit 12 includes two scanning systems of a read-out scanning system and a sweep-out scanning system.

The read-out scanning system sequentially performs selection scanning with respect to the unit pixel of the pixel array portion 11 in the row unit, in order to read out a signal from the unit pixel. The signal read out from the unit pixel is an analog signal. The sweep-out scanning system precedently performs sweep-out scanning with respect to a read-out row to which read-out scanning is performed by the read-out scanning system, to the read-out scanning, by an exposure time.

According to the sweep-out scanning of the sweep-out scanning system, an unnecessary charge is swept out from the photoelectric converter of the unit pixel of the read-out row, and thus, the photoelectric converter is reset. Then, according to the sweeping-out (reset) of the unnecessary charge of sweep-out scanning system, a so-called electronic shutter operation is performed. Here, the electronic shutter operation indicates an operation of discarding the charge of the photoelectric converter, and of newly starting exposure (starting accumulation of the charge).

The signal read out by the read-out operation of the read-out scanning system corresponds to the amount of received light after the last read-out operation or the last electronic shutter operation. Then, a period from a read-out timing of the last read-out operation or a sweep-out timing of the last electronic shutter operation, to a read-out timing of the current read-out operation, is an exposure period of the charge in the unit pixel.

A signal output from each of the unit pixels of the pixel row subjected to the selection scanning by the vertical driving unit 12, is input into the column processor 13 through each of the vertical signal lines 17 for each pixel column. The column processor 13 performs predetermined signal processing with respect to the signal output from each of the pixels of the selected row through the vertical signal line 17 for each pixel column of the pixel array portion 11, and temporarily retains a pixel signal after the signal processing.

Specifically, the column processor 13 performs at least denoising processing, for example, correlated double sampling (CDS) processing or double data sampling (DDS) processing, as the signal processing. For example, according to the CDS processing, a pixel-specific fixed pattern noise such as a reset noise or a threshold value variation of an amplification transistor in a pixel, is eliminated. In addition to the denoising processing, for example, the column processor 13 has an analog-digital (AD) conversion function, and thus, is capable of converting an analog pixel signal into a digital signal, and of outputting the converted digital signal.

The horizontal driving unit 14 includes a shift register, an address decoder, or the like, and a unit circuit corresponding to the pixel column of the column processor 13 is sequentially selected. According to the selection scanning of the horizontal driving unit 14, in the column processor 13, a pixel signal subjected to the signal processing for each unit circuit is sequentially output.

The system control unit 15 includes a timing generator generating various timing signals, or the like, and performs driving control with respect to the vertical driving unit 12, the column processor 13, the horizontal driving unit 14, and the like, on the basis of the various timings generated by the timing generator.

The signal processor 18 has at least an arithmetic processing function, and performs various signal processings such as arithmetic processing, with respect to the pixel signal output from the column processor 13. Furthermore, the signal processor 18 includes an amplifier for performing gain multiplication processing of the present technology, as described later.

In the signal processing of the signal processor 18, the data storage unit 19 temporarily stores data necessary for the processing.

{Other System Configurations}

The CMOS image sensor 10 to which the present technology is applied is not limited to the system configuration described above. The following system configurations can be exemplified as other system configurations.

Figure 2:
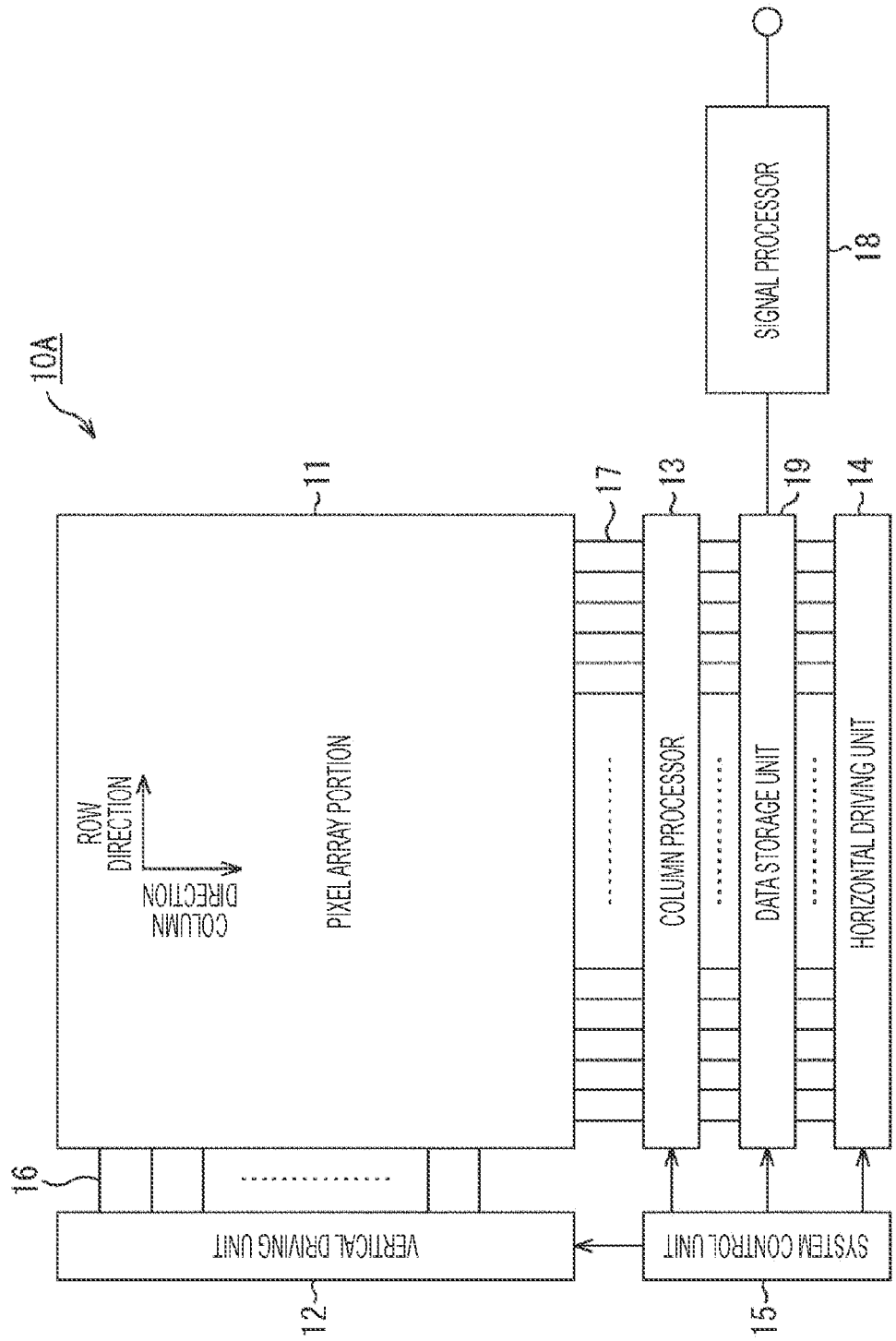
FIG. 2 is a (first) system configuration diagram illustrating another system configuration of the CMOS image sensor to which the present technology is applied.

For example, as illustrated in FIG. 2, a CMOS image sensor 10A of a system configuration in which the data storage unit 19 is disposed in the latter part of the column processor 13, and the pixel signal output from the column processor 13 is supplied to the signal processor 18 through the data storage unit 19, can be exemplified.

Figure 3:
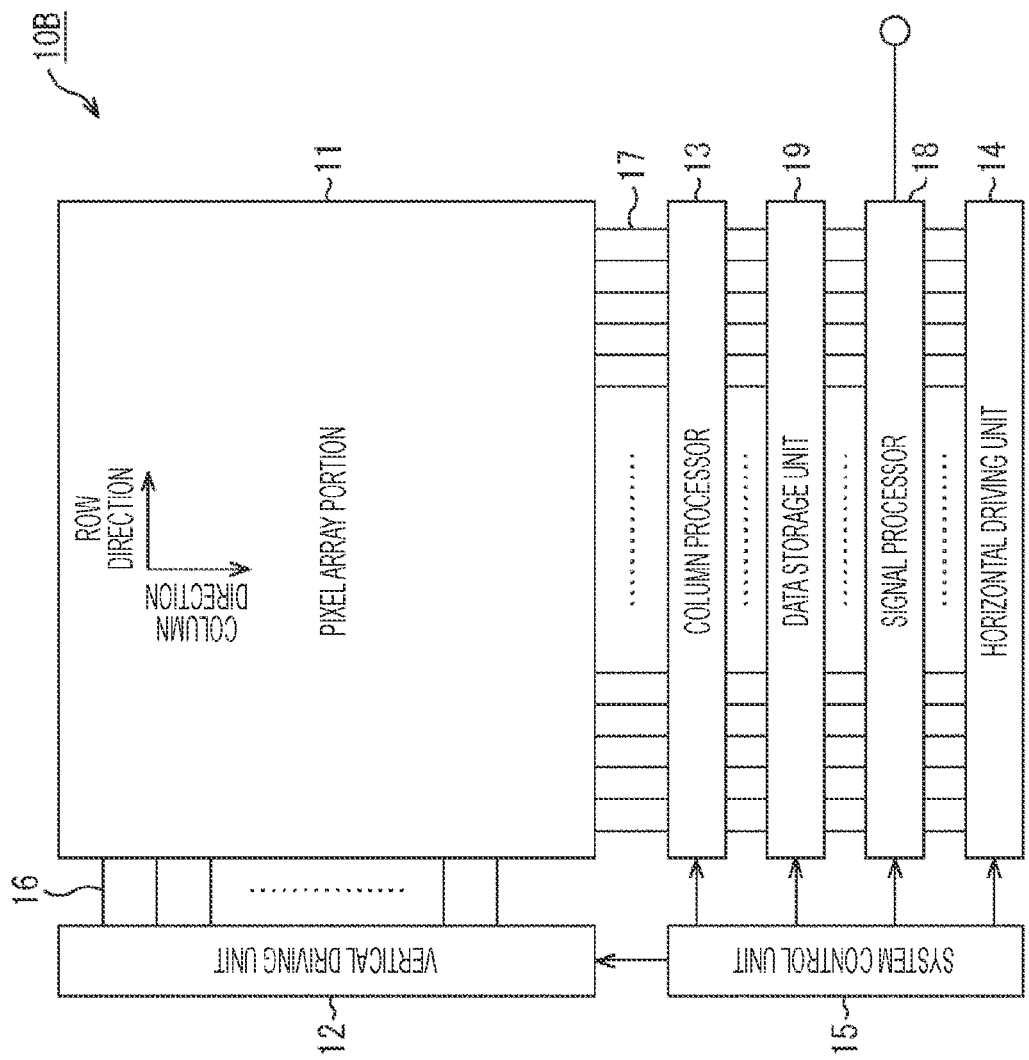
FIG. 3 is a (second) system configuration diagram illustrating another system configuration of the CMOS image sensor to which the present technology is applied.

Further, as illustrated in FIG. 3, a CMOS image sensor 10B of a system configuration in which the column processor 13 has an AD conversion function of performing AD conversion for each column or for each of a plurality of columns of the pixel array portion 11, and the data storage unit 19 and the signal processor 18 are arranged in parallel with respect to the column processor 13, can be exemplified.

First Embodiment

Next, a first embodiment of the present technology will be described with reference to FIGS. 4, 5, 6, 7, 8A, 8B, 8C, 8D, 9, and 10.

{Circuit Configuration of Unit Pixel 100A}

Figure 4:
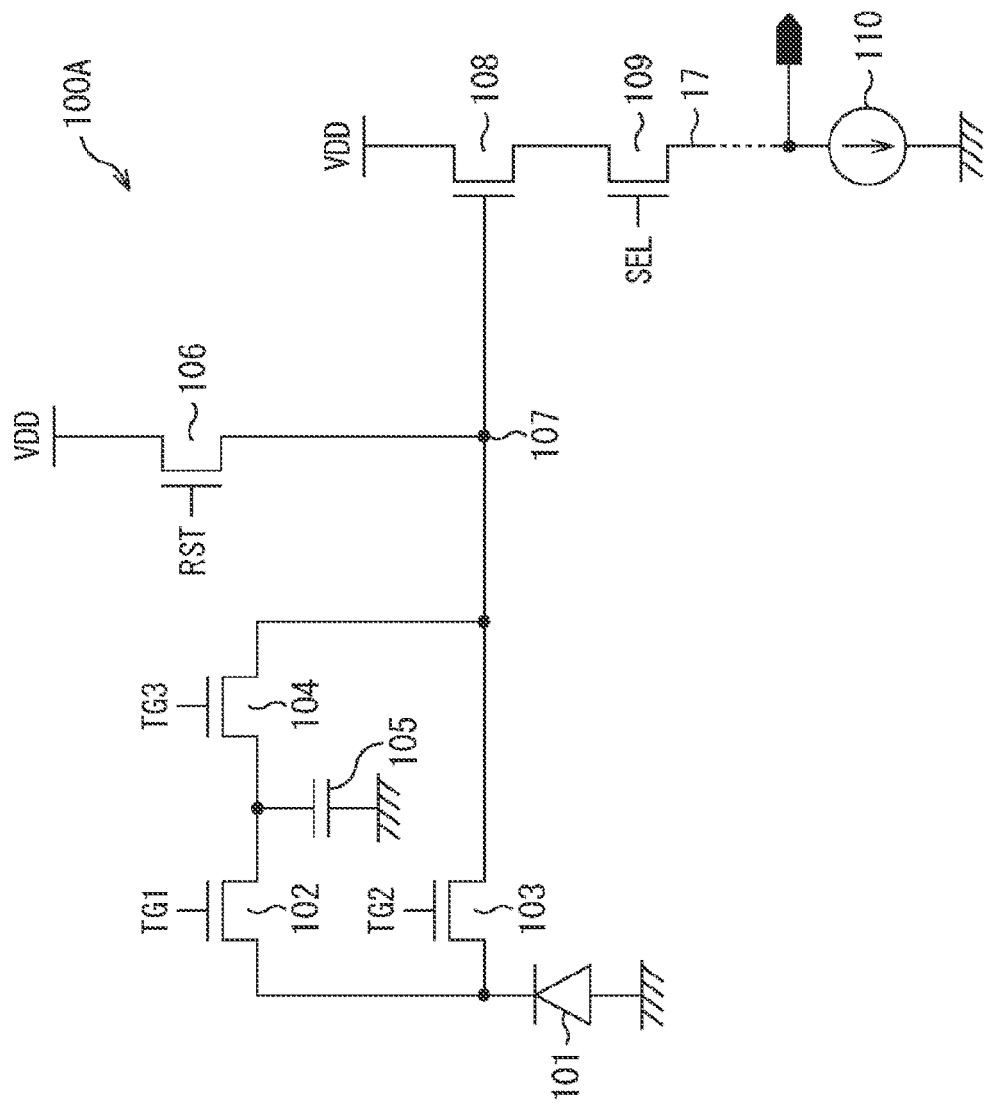
FIG. 4 is a circuit diagram illustrating a configuration example of a unit pixel in a first embodiment of the present technology.

FIG. 4 is a circuit diagram illustrating a configuration example of unit pixels 100A arranged in the pixel array portion 11 of FIGS. 1 to 3, and FIG. 5 is a plan layout diagram illustrating a configuration example of the unit pixel 100A. Furthermore, in FIG. 5, a structure is illustrated as an example, in which the unit pixel 100A is a so-called rear surface irradiation type imaging apparatus.

The unit pixel 100A includes a photodiode (PD) 101, a first transmission transistor 102, a second transmission transistor 103, a third transmission transistor 104, a memory portion 105, a reset transistor 106, an FD portion 107, an amplification transistor 108, and a selection transistor 109.

The PD 101 is a photoelectric converter configured to convert incident light into a charge by photoelectric conversion, and to accumulate the converted charge, an anode terminal is grounded, and a cathode terminal is connected to each of the first transmission transistor 102 and the second transmission transistor 103.

The first transmission transistor 102 is driven according to a transmission signal TG1 supplied from the vertical driving unit 12 (FIG. 1), and in a case where the first transmission transistor 102 is turned on, the charge accumulated in the PD 101 is transmitted to the memory portion 105. The memory portion 105 functions as a charge retention unit temporarily retaining a charge.

The second transmission transistor 103 is driven according to a transmission signal TG2 supplied from the vertical driving unit 12 (FIG. 1), and in a case where the second transmission transistor 103 is turned on, the charge accumulated in the PD 101 is transmitted to the FD portion 107.

The third transmission transistor 104 is driven according to a transmission signal TG3 supplied from the vertical driving unit 12 (FIG. 1), and in a case where the third transmission transistor 104 is turned on, the charge accumulated in the memory portion 105 is transmitted to the FD portion 107.

The FD portion 107 is a floating diffusion region having predetermined accumulation capacity, which is connected to a gate electrode of the amplification transistor 108, and accumulates the charge directly and indirectly (through the memory portion 105) transmitted from the PD 101.

The amplification transistor 108 outputs the pixel signal of a level according to the charge accumulated in the FD portion 107 (in other words, the voltage of the FD portion 107) to the vertical signal line 17 through the selection transistor 109. In other words, the FD portion 107 is connected to the gate electrode of the amplification transistor 108, and thus, the FD portion 107 and the amplification transistor 108 function as a converter converting the charge generated in the PD 101 into the pixel signal of the level according to the charge (a charge-voltage converter).

The selection transistor 109 is driven according to a selection signal SEL supplied from the vertical driving unit 12 (FIG. 1), and in a case where the selection transistor 109 is turned on, a state is obtained in which the pixel signal output from the amplification transistor 108 can be output to the vertical signal line 17. A constant current source 110 configuring a source follower circuit is connected to the vertical signal line 17.

The reset transistor 106 is driven according to a reset signal RST supplied from the vertical driving unit 12, and in a case where the reset transistor 106 is turned on, the charge accumulated in the FD portion 107 is discharged to power source wiring Vdd, and the FD portion 107 is reset.

Note that, hereinafter, each of the driving signals being in an active state indicates that each of the driving signals is turned on, and each of the driving signals being in an inactive state indicates that each of the driving signals is turned off. Furthermore, hereinafter, each gate portion or each transistor being in a conductive state indicates that each of the gate portions or each of the transistors is turned on, and each of the gate portions or each of the transistors being in a non-conductive state indicates that each of the gate portions or each of the transistors is turned off.

Figure 5:
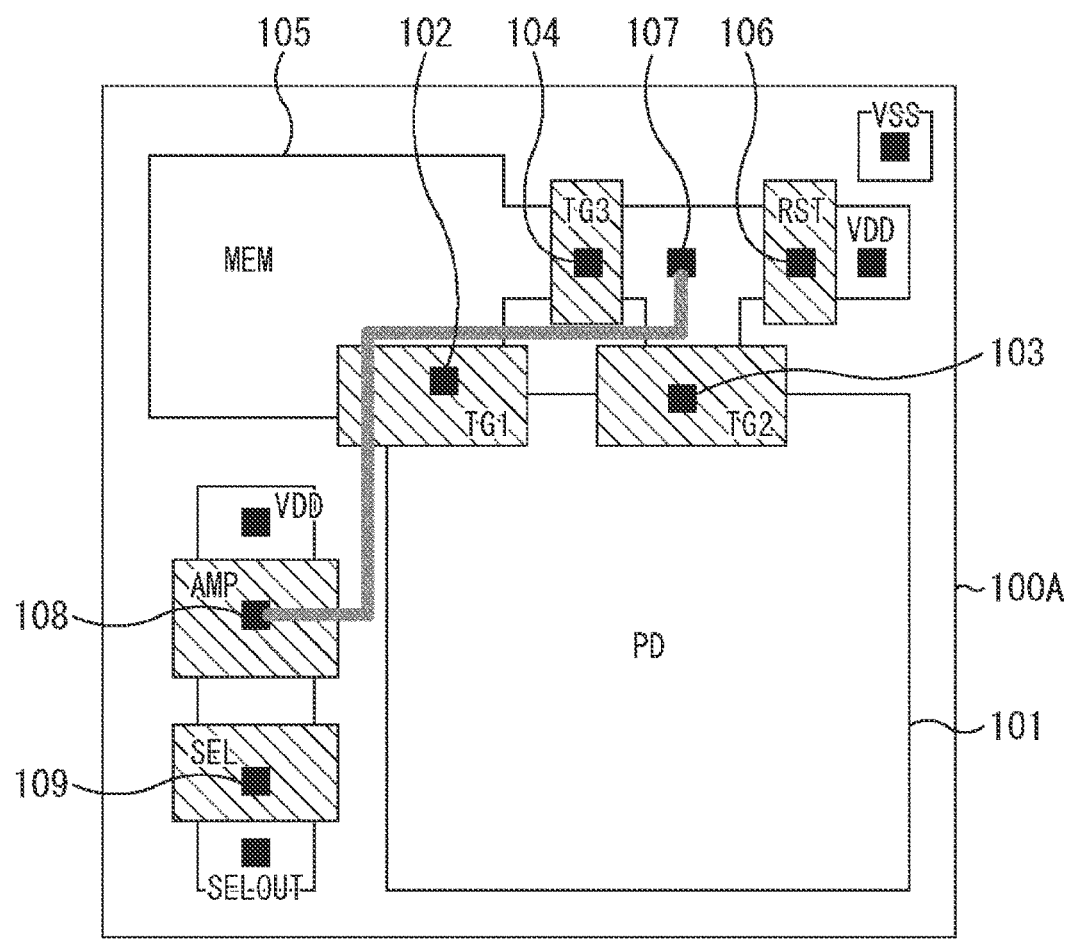
FIG. 5 is a plan layout diagram of the unit pixel in the first embodiment.

In the rear surface irradiation type imaging apparatus, a silicon substrate on which the PD 101 is formed, includes a first surface which is an incident surface of light with respect to the photodiode, and a second surface facing the first surface. FIG. 5 is a plan layout diagram of the second surface of the silicon substrate relevant to the unit pixel 100A, and is a plan layout diagram of an active region, the photoelectric converter, a pixel transistor, the charge accumulation unit, and wiring connecting the constituents described above to each other, of the unit pixel 100A.

In FIG. 5, PD 101, the first transmission transistor 102, the second transmission transistor 103, the third transmission transistor 104, the memory portion 105, the reset transistor 106, the FD portion 107, and a connection portion with respect to a power source VDD are formed on a continuous first active region.

Separately from the first active region, a connection portion with respect to the amplification transistor 108, the selection transistor 109, and the power source VDD, and a connection portion with respect to the vertical signal line 17 are formed on a continuous second active region.

In FIG. 5, the FD portion 107 and the gate electrode of the amplification transistor 108 are connected to each other by the wiring arranged on an upper layer from the gate electrode.

Note that, for example, when a first voltage (for example, a negative voltage) is applied to the gate portion, in the first transmission transistor 102, an impurity concentration of a channel region can be set such that an overflow path is formed in the channel region under the gate electrode.

In such a configuration, in a case where high-intensity light is incident on the PD 101, and a charge generated by the incident light is greater than a saturated cumulative amount of the PD 101, the charge overflowed from the PD 101 can be transmitted to the memory portion 105 through the overflow path.

Figure 6:
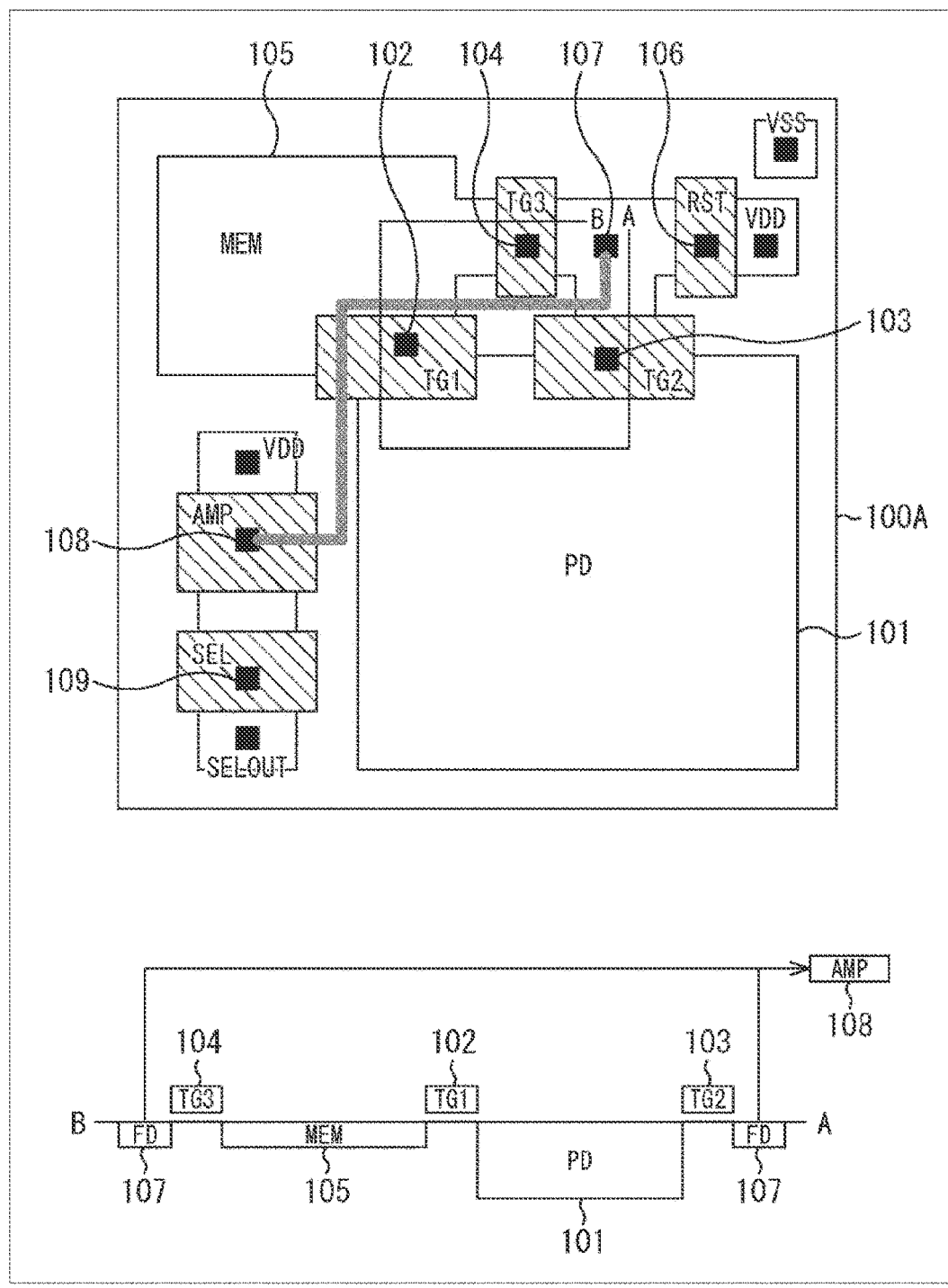
FIG. 6 is a sectional view of the unit pixel in the first embodiment.

FIG. 6 illustrates a sectional view of the unit pixel 100A. For reference, a plan view of the unit pixel 100A illustrated in FIG. 5 is illustrated in the upper portion of FIG. 6, and a sectional view of the unit pixel 100A is illustrated in the lower portion. A sectional view of straight lines A and B illustrated in the plan view in the upper portion of FIG. 6 is drawn in a lower diagram corresponding to a plane of the upper diagram of FIG. 6, and the same reference numerals are applied to the same portions.

As illustrated in FIG. 6, the second transmission transistor 103 is formed between the FD portion 107 and the PD 101. Furthermore, the first transmission transistor 102 is formed between the PD 101 and the memory portion 105. Furthermore, the third transmission transistor 104 is formed between the memory portion 105 and the FD portion 107. Then, the FD portion 107 is connected to the amplification transistor 108 by the wiring.

Thus, the unit pixel 100A to which the present technology is applied, includes the first transmission transistor 102 and the third transmission transistor 104 for transmitting the charge accumulated in the PD 101 to the FD portion 107 after accumulating the charge in the memory portion 105 once. Furthermore, the unit pixel 100A includes the second transmission transistor 103 for transmitting the charge accumulated in the PD 101 to the FD portion 107.

Thus, the unit pixel 100A in the first embodiment, includes three transmission transistors and the memory, and includes the transmission transistor directly transmitting the charge from the PD 101 to the FD portion 107, and the transmission transistor indirectly transmitting the charge through the memory.

{Operation of Unit Pixel}

The operation of the unit pixel 100A having such a configuration will be described with reference to FIG. 7.

Figure 7:
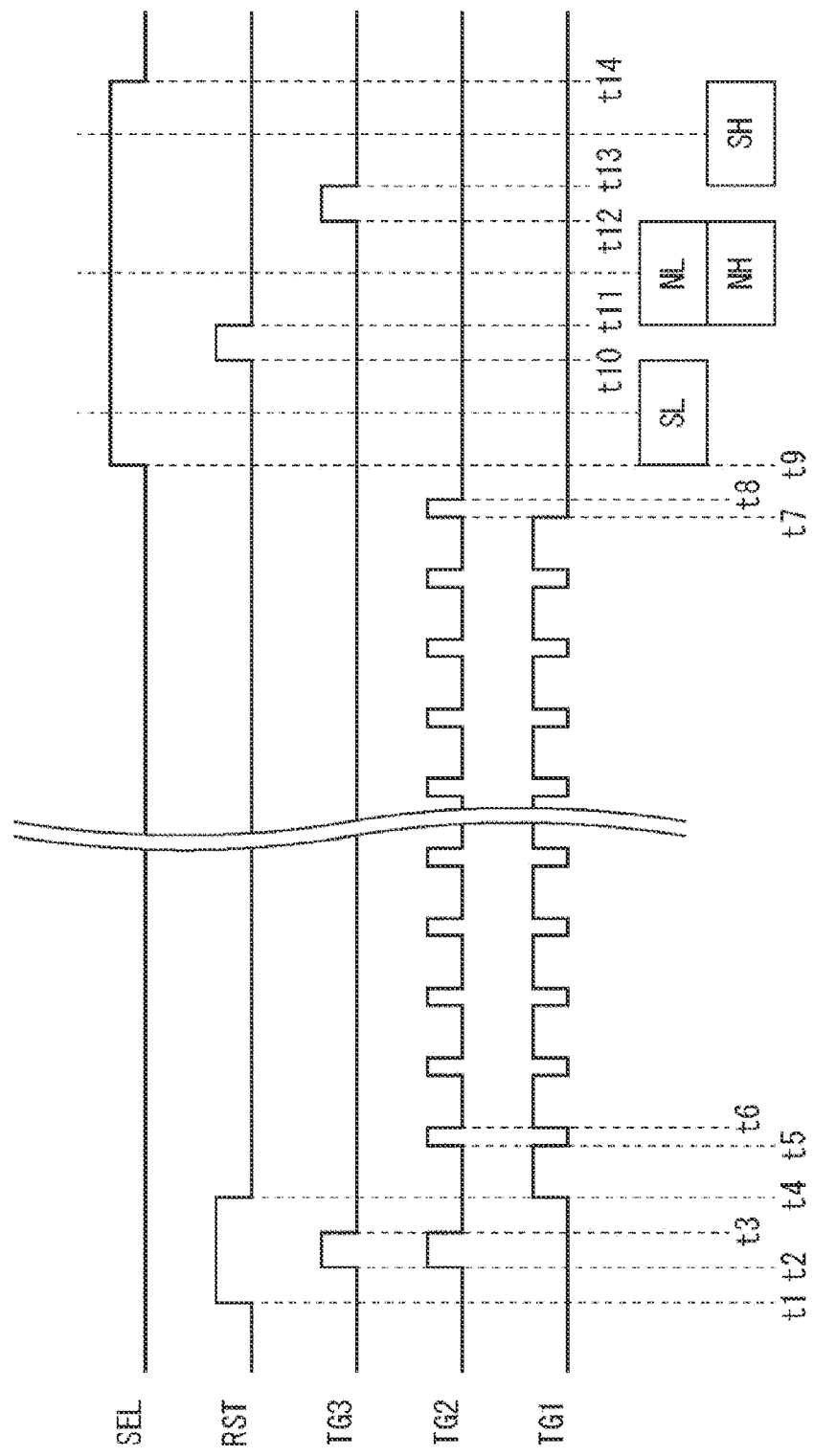
FIG. 7 is a diagram for illustrating an operation of the unit pixel in the first embodiment.

FIG. 7 illustrates a timing chart of the selection signal SEL of driving the selection transistor 109, the reset signal RST of driving the reset transistor 106, the transmission signal TG3 of driving the third transmission transistor 104, the transmission signal TG2 of driving the second transmission transistor 103, and the transmission signal TG1 of driving the first transmission transistor 102, of the unit pixel 100A in the first embodiment.

First, a gate portion of the reset transistor 106 is turned on, and during this period, a gate portion of each of the second transmission transistor 103 and the third transmission transistor 104 is also turned on.

With reference to the timing chart illustrated in FIG. 7, the reset signal RST is turned on at a time t1, and thus, the reset transistor 106 is turned on. The transmission signal TG2 and the transmission signal TG3 are respectively turned on at a time t2 after the time t1, and thus, the second transmission transistor 103 and the third transmission transistor 104 are respectively turned on. According to such an operation, the PD 101, the memory portion 105, and the FD portion 107 of the unit pixel 100A are respectively reset.

The PD 101, the memory portion 105, and the FD portion 107 are respectively reset, and then, the gate portion of each of the second transmission transistor 103, the third transmission transistor 104, and the reset transistor 106 is turned off.

With reference to the timing chart illustrated in FIG. 7, the transmission signal TG2 and the transmission signal TG3 are respectively turned off at a time t3, and thus, the second transmission transistor 103 and the third transmission transistor 104 are respectively turned off. The reset signal RST is turned off at a time t4 after the time t3, and thus, the reset transistor 106 is turned off.

The reset operation is performed, and then, an accumulation period in which the charge generated as a result of the photoelectric conversion of the PD 101 is accumulated, is started. In the accumulation period, the second transmission transistor 103 and the first transmission transistor 102 are alternately turned on and off.

In other words, the transmission signal TG1 is turned on at the time t4, and thus, the first transmission transistor 102 is turned on, and the transmission signal TG1 is turned off at a time t5, and thus, the first transmission transistor 102 is turned off.

In addition, the transmission signal TG2 is turned on at the time t5, and thus, the second transmission transistor 103 is turned on, and the transmission signal TG2 is turned off at a time t6, and thus, the second transmission transistor 103 is turned off.

The first transmission transistor 102 is turned on, and thus, a signal charge accumulated in the PD 101 is transmitted to the memory portion 105. Furthermore, the second transmission transistor 103 is turned on, and thus, the signal charge accumulated in the PD 101 is transmitted to the FD portion 107.

Thus, in the accumulation period in which the charge generated as a result of the photoelectric conversion of the PD 101 is accumulated, the first transmission transistor 102 and the second transmission transistor 103 are alternately turned on, and thus, the signal charge accumulated in the PD 101 is alternately transmitted to the memory portion 105 and the FD portion 107.

The first transmission transistor 102 is repeatedly turned on and off during a period from the time t4 to a time t7, and thus, transmits the signal charge from the PD 101 to the memory portion 105. Furthermore, the second transmission transistor 103 is repeatedly turned on and off during a period from the time t5 to a time t8, and thus, transmits the signal charge from the PD 101 to the FD portion 107.

Figure 8A:
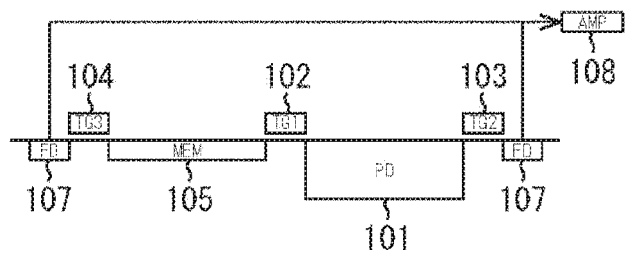
FIGS. 8A, 8B, 8C, and 8D are diagrams for illustrating a change in a potential of the unit pixel in the first embodiment.
Figure 8B:
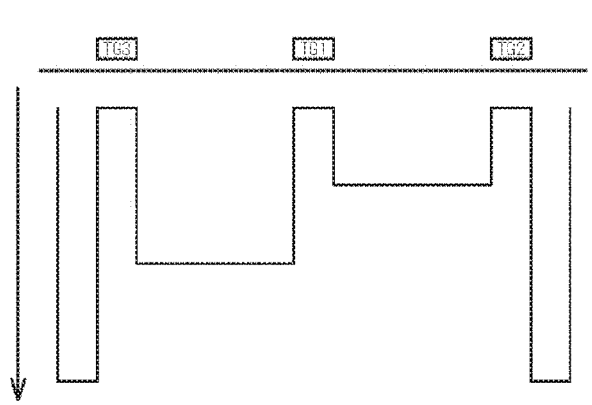
Figure 8C:
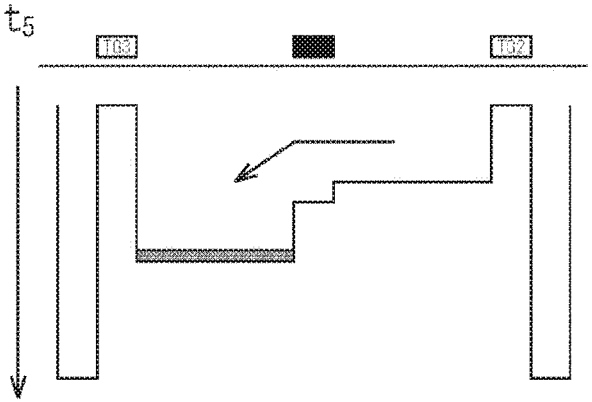
Figure 8D:
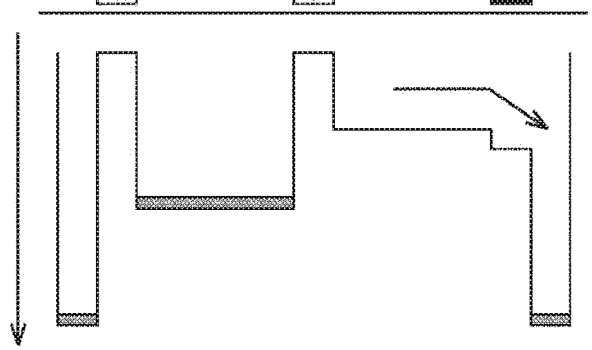

Here, the operation of the unit pixel 100A at the times t4 to t6 of the timing chart of FIG. 7 will be described in detail with reference to FIGS. 8A, 8B, 8C, and 8D. FIG. 8A illustrates a sectional structure of the unit pixel 100A, and is illustrated for referring to the sectional structure illustrated in FIG. 6. FIGS. 8B, 8C, and 8D illustrate potential diagrams of the unit pixel 100A at each of the times t4 to t6. In addition, in the drawings, a black square illustrates that the driving signal is turned on, and a white square illustrates that the driving signal is turned off.

FIG. 8B, for example, illustrates the state of the potential at the time t4, is a state before the charge is accumulated in the PD 101, and illustrates a state in which the memory portion 105 and the FD portion 107 are reset. As illustrated in FIG. 8B, the first transmission transistor 102 is disposed between the PD 101 and the memory portion 105, and the potential of the memory portion 105 is deeper than the potential of the PD 101.

The potential of the memory portion 105 is deeper than the potential of the PD 101, and thus, the signal charge can be transmitted from the PD 101 to the memory portion 105 according to the driving of the first transmission transistor 102. In a case where the charge is transmitted from the PD 101 to the memory portion 101, and the transmitted charge is accumulated in the memory portion 105, the potential of the memory portion 105 becomes shallower than the potential of the memory portion 105 illustrated in FIG. 8B, according to the amount of accumulated charge. By accumulating the charge, the potential of the memory portion 105 becomes shallow, and thus, the memory portion 105 is capable of accumulating the charge until the potential of the memory portion 105 becomes identical to the potential of the PD 101 illustrated in FIG. 8B.

In the state illustrated in FIG. 8B, in a case where the accumulation of the charge in the PD 101 is started, and the first transmission transistor 102 is turned on, as illustrated in FIG. 8C, the signal charge of the PD 101 is transmitted to the memory portion 105. Thereafter, in a case where the first transmission transistor 102 is turned off, a potential barrier is formed between the PD 101 and the memory portion 105, and the transmission of the signal charge from the PD 101 to the memory portion 105 is stopped.

In a case where the first transmission transistor 102 is turned off at the time t5, and the second transmission transistor 103 is turned on, the signal charge is transmitted from the PD 101 to the FD portion 107.

Thus, the transmission of the charge with respect to the memory portion 105 and the transmission of the charge with respect to the FD portion 107 are performed.

Such operations are alternately repeated in the exposure period, and thus, in the signal charges subjected to the photoelectric conversion of the PD 101 in the exposure period, a signal charge generated within a period in which the first transmission transistor 102 is turned on (referred to as a first period) is transmitted to the memory portion 105, and is accumulated/retained in the memory portion 105. Furthermore, in the signal charges subjected to the photoelectric conversion of the PD 101 in the exposure period, a signal charge generated within a period in which the second transmission transistor 103 is turned on (referred to as a second period) is transmitted to the FD portion 107, and is accumulated/retained in the FD portion 107.

Here, the first period is longer than the second period. In other words, the period of transmitting the signal charge from the PD 101 to the memory portion 105 is longer than the period of transmitting the signal charge to the FD portion 107. The first period and the second period correspond to the length of the exposure time, and thus, the signal charge accumulated within the first period corresponds to a signal charge accumulated in a long exposure time, and the signal charge accumulated within second period corresponds to a signal charge accumulated in a short exposure time.

In FIG. 7, the unit pixel 100A accumulates the charge generated by the light incident on the PD 101 as the signal charge, during a period from the time t4 to the time t8. More specifically, the unit pixel 100A alternately turns on or off the first transmission transistor 102 and the second transmission transistor 103 during a period from the time t4 to the time t8, and thus, accumulates the charge generated by the light incident on the PD 101 in any one of the memory portion 105 and the FD portion 107, as the signal charge.

In a case where it is assumed that the first period in which the charge is accumulated in the memory portion 105 is longer than the second period in which the charge is accumulated in the FD portion 107, the amount of signal charge accumulated/retained in the memory portion 105 is larger than the amount of signal charge accumulated/retained in the FD portion 107, during a period from the time t4 to the time t8.

For this reason, in a case where it is assumed that the first period in which the charge is accumulated in the memory portion 105 is longer than the second period in which the charge is accumulated in the FD portion 107, a signal obtained from the memory portion 105 in which more charges generated by the light incident on the PD 101 are accumulated/retained, can be referred to as a signal having a high sensitivity with respect to the light incident on the PD 101.

On the other hand, a signal obtained from the FD portion 107 in which less charges generated by the light incident on the PD 101 are accumulated/retained, can be referred to as a signal having a low sensitivity with respect to the light incident on the PD 101.

Hereinafter, the signal charge accumulated/retained in the memory portion 105 after the first transmission transistor 102 is turned on (in the signal charge accumulated/retained in the first period) will be referred to as a high-sensitivity data signal (hereinafter, referred to as a high-sensitivity data signal SH). Furthermore, the signal charge accumulated/retained in the FD portion 107 after the second transmission transistor 103 is turned on (the signal charge accumulated/retained in the second period) will be referred to as a low-sensitivity data signal (hereinafter, referred to as a low-sensitivity data signal SL).

Thus, according to the present technology, the high-sensitivity data signal SH and the low-sensitivity data signal SL can be obtained, and an image having an expanded dynamic range, can be imaged according to processing using the high-sensitivity data signal SH and the low-sensitivity data signal SL as described later.

The accumulation period as described above is ended, and then, the process proceeds to a read-out period. In the accumulation period, the processing as described above, in other words, the processing from the reset to the transmission with respect to the memory portion 105 or the FD portion 107 is simultaneously performed in all of the pixels in the pixel array portion 11, and thus, it is possible to realize a global shutter having the same accumulation time in all of the pixels.

Next, an operation in the read-out period will be described. The selection signal SEL is turned on at a time t9, and thus, the selection transistor 109 is in a turned-on state. The selection transistor 109 is turned on, and thus, the pixel signal of the level according to the charge accumulated in the FD portion 107 (in other words, the voltage of the FD portion 107) is output to the vertical signal line 17 through the amplification transistor 108.

A pixel signal read out from the FD portion 107 immediately after the accumulation period is a signal corresponding to the signal charge transmitted from the PD 101 to the FD portion 107 by the second transmission transistor 103, in other words, a signal corresponding to the signal charge accumulated in the second period. In other words, the pixel signal is the low-sensitivity data signal SL.

The low-sensitivity data signal SL is read out, and then, the high-sensitivity data signal SH is read out. First, the reset signal RST is turned on at a time t10, and thus, the reset transistor 106 is in the turned-on state. Thereafter, the reset signal RST is turned off at a time t11, and thus, the reset transistor 106 is in a turned-off state. The reset transistor 106 is turned on and off, and thus, the FD portion 107 is reset.

A signal after the FD portion 107 is reset (an FD level) is output to the vertical signal line 17 through the selection transistor 109, after the time t11. The signal will be referred to as a low-sensitivity reset signal NL. The low-sensitivity reset signal NL corresponds to a P phase with respect to the signal accumulated in the memory portion 105 to be read out next (referred to as a high-sensitivity reset signal NH).

The transmission signal TG3 is turned on at a time t12, and thus, the third transmission transistor 104 is in the turned-on state. The third transmission transistor 104 is in the turned-on state, and thus, the signal charge accumulated in the memory portion 105 is transmitted to the FD portion 107. The transmission signal TG3 is turned off at a time t13, and thus, the third transmission transistor 104 is in the turned-off state.

At this time, the selection transistor 109 is in the turned-on state, and thus, the pixel signal of the level according to the charge accumulated in the FD portion 107 (in other words, the voltage of the FD portion 107) is output to the vertical signal line 17 through the amplification transistor 108.

At this time, the pixel signal read out from the FD portion 107 is transmitted from the PD 101 to the memory portion 105 by the first transmission transistor 102 once, is a signal corresponding to the signal charge transmitted from the memory portion 105 to the FD portion 107 by the third transmission transistor 104, in other words, a signal corresponding to the signal charge accumulated within the first period. In other words, the pixel signal is the high-sensitivity data signal SH.

Thus, the low-sensitivity data signal SL is read out, and subsequently, the high-sensitivity data signal SH is read out.

As described above, the low-sensitivity data signal SL is a signal charge generated within the second period in which the second transmission transistor 103 is turned on. The second period is a period depending on time when the second transmission transistor 103 is turned on once (referred to as time T2) and the number of times in which the second transmission transistor 103 is turned on within the accumulation period.

Furthermore, as described above, the high-sensitivity data signal SH is a signal charge generated within the first period in which the first transmission transistor 102 is turned on. The first period is a period depending on time when the first transmission transistor 102 is turned on once (referred to as time T1) and the number of times in which the first transmission transistor 102 is turned on within the accumulation period.

Figure 9:
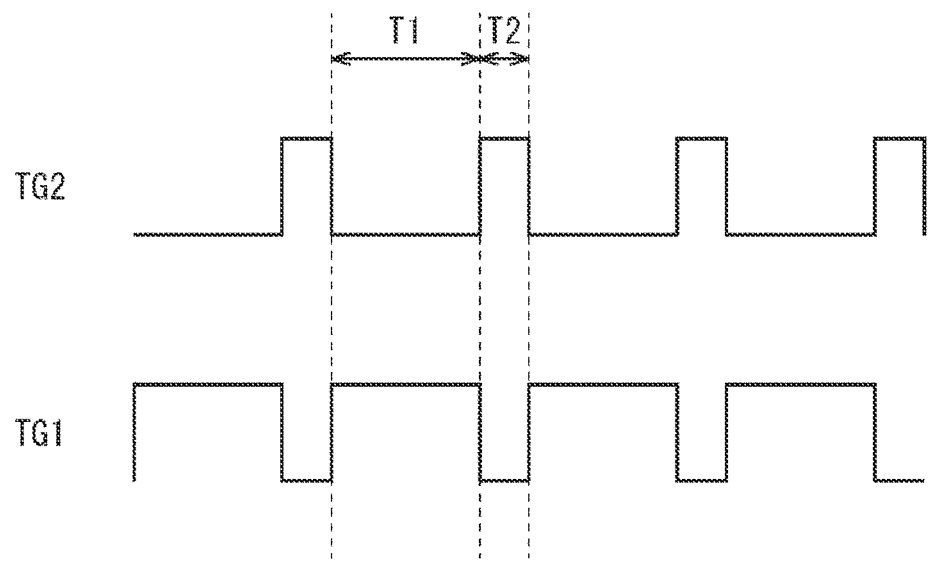

The time T1 and the time T2 will be described with reference to FIGS. 9 and 10. FIG. 9 illustrates a state in which the first transmission transistor 102 and the second transmission transistor 103 are alternately driven at a turn-on time of each of the time T1 and the time T2. The time T1 in FIG. 9 corresponds to time from the time t4 to the time t5 in FIG. 7, and the time T2 corresponds to time from the time t5 to the time t6.

According to such an operation, only a signal charge subjected to the photoelectric conversion by:

Total Exposure Time×Time $T1$/(Time $T1$+Time $T2$)

can be transmitted to the memory portion 105 through the first transmission transistor 102. In addition, only a signal charge subjected to the photoelectric conversion by:

Total Exposure Time×Time $T2$/(Time $T1$+Time $T2$)

can be transmitted to the FD portion 107 through the second transmission transistor 103.

In other words, the signal data of which the sensitivity is converted at a ratio of T1:T2 is effectively retained in each of the memory portion 105 and the FD portion 107.

This indicates that arbitrary sensitivity adjustment can be performed by changing the time T1 and the time T2. In other words, by changing the time T1 and the time T2, in other words, by adjusting the turn-on time and the turn-off time of the transmission signal TG1 and the transmission signal TG2, it is possible to adjust the sensitivity.

Furthermore, capturing is performed by providing the time T1 and the time T2 (the first period and the second period), and thus, for example, it is possible to perform the capturing without being affected by light emitting diode (LED) flicker or the like. An LED illumination is not turned on all the time, but blinks at a predetermined cycle. For this reason, when the capturing is performed with a short shutter, in a case where the exposure timing overlaps with a turn-off timing of the blinking of the LED, an image on which the LED is turned off, is captured.

For example, it is possible to realize a decrease in sensitivity in a shutter time with one short shutter, but as described above, in a case where one short shutter overlaps with the turn-off timing of the blinking of the LED, there is a possibility that an image is not capable of being imaged. However, according to the present technology, the capturing is performed by using different times such as the time T1 and the time T2, and thus, even in a case where one of the time T1 and the time T2 overlaps with the turn-off timing of the blinking of the LED, it is possible to perform the capturing at the other time.

Accordingly, it is possible to prevent an image from not being imaged due to the LED flicker or the like.

Figure 10:
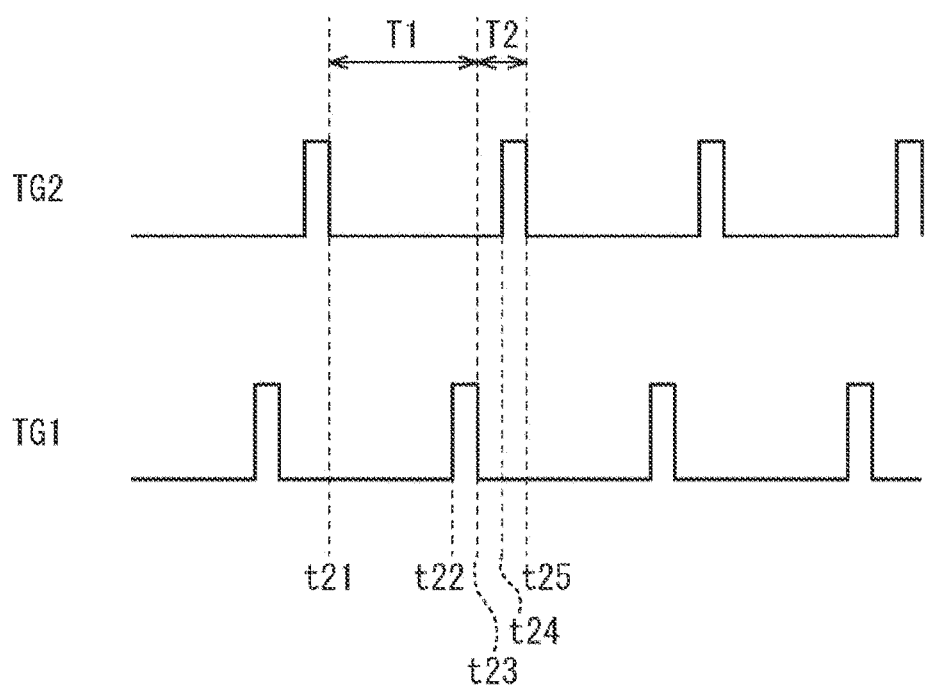

In FIG. 9, an example is illustrated in which the first transmission transistor 102 and the second transmission transistor 103 are exclusively operated, but insofar as a pulse width capable of performing complete transmission, can be obtained, an operation as illustrated in FIG. 10 can also be performed. As illustrated in FIG. 10, a period after one pulse is lowered until the other pulse is lowered may be a time T1 and a time T2.

For example, the transmission signal TG2 is turned off at a time t21, and then, the transmission signal TG1 is turned on at a time t22, and the transmission signal TG1 is turned off at a time t23. A period from the time t21 to the time t23 is the time T1. In this case, the first transmission transistor 102 is turned on during a period from the time t22 to the time t23, and then, the charge accumulated in the PD 101 during a period from the time t21 to the time t23, that is, during the time T1, is transmitted from the PD 101 to the memory portion 105.

The transmission signal TG2 is turned on at a time t24 after the time t23, and the transmission signal TG2 is turned off at a time t25. A period from the time t23 to the time t25 is the time T2. In this case, the second transmission transistor 103 is turned on during a period from the time t24 to the time t25, and then, the charge accumulated in the PD 101 during a period from the time t23 to the time t25, that is, during the time T2, is transmitted to from the PD 101 to the FD portion 107.

In such an operation, as described above, for example, as with a case described with reference to FIG. 9, it is possible to acquire the low-sensitivity data signal SL and the high-sensitivity data signal SH.

Capturing having an expanded dynamic range, which is performed by using the low-sensitivity data signal SL and the high-sensitivity data signal SH, read out as described above, will be described with reference to FIG. 11.

Figure 11:
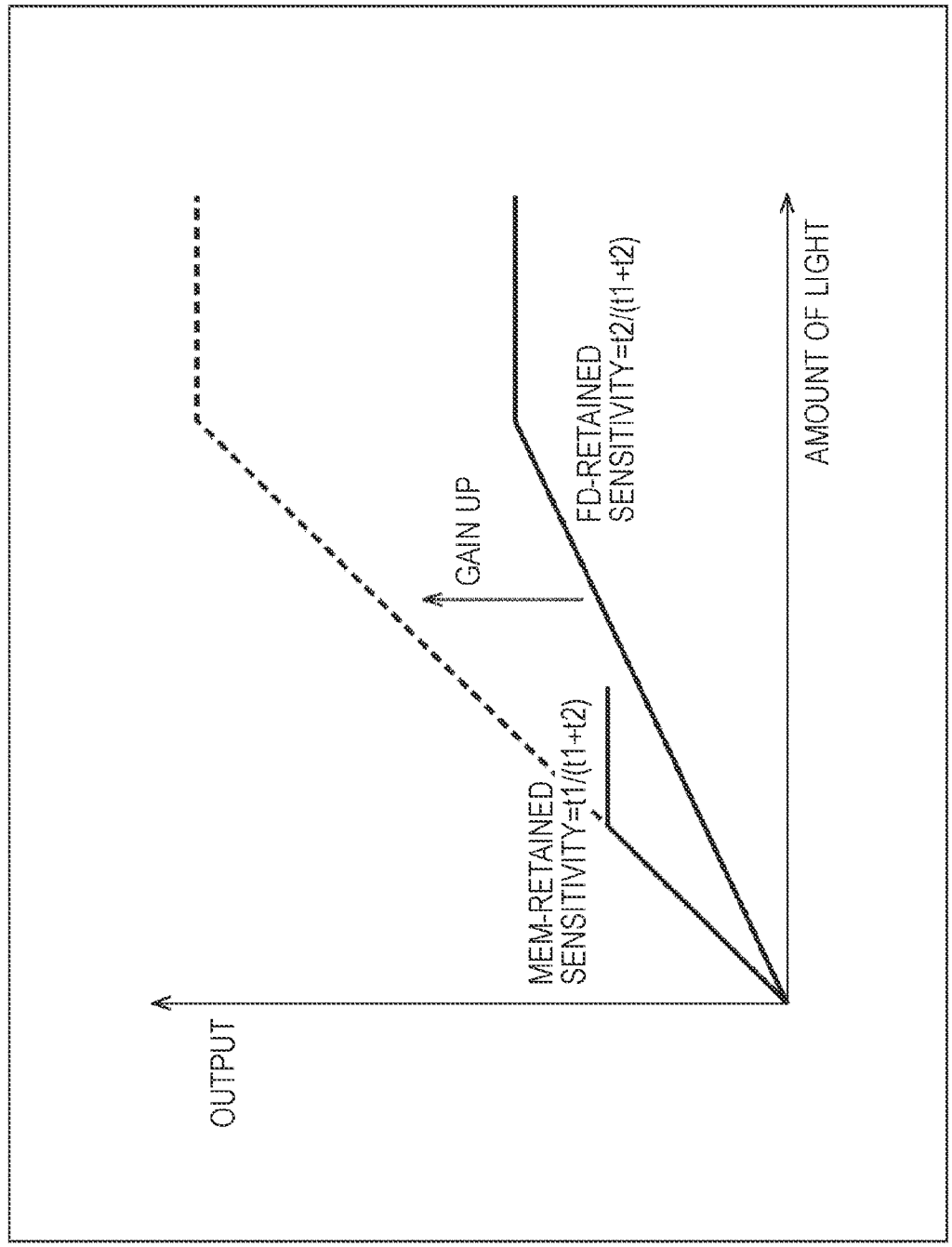
FIG. 11 is a diagram for illustrating handling of a read-out signal.

FIG. 11 illustrates input/output characteristics of the high-sensitivity data signal SH and the low-sensitivity data signal SL. In other words, the amount of light incident on the PD 101 in a signal charge accumulation period from the time t4 to the time t8 is indicated on a horizontal axis, whereas output obtained as a result of the photoelectric conversion of the PD 101 (the amount of charge accumulated as a result of the photoelectric conversion) is indicated on a vertical axis. In FIG. 11, in the output obtained as a result of the photoelectric conversion of the PD 101, the characteristics of the high-sensitivity data signal SH retained in the memory portion 105 are illustrated by a solid line with "MEM retention". Furthermore, the characteristics of the low-sensitivity data signal SL retained in the FD portion 107 are illustrated by a solid line with "FD retention".

In FIG. 11, the characteristics of the high-sensitivity data signal SH retained in the memory portion 105 are a straight line which passes through the original point of the graph, and in which the output increases at a constant inclination according to an increase in the amount of light, in a region where the amount of incident light is small. Here, the inclination of the straight line is set to k1. The accumulated charge increases according to an increase in the amount of light, and in a case where the accumulated charge reaches a saturated charge amount of the memory portion 105, in the characteristics of the high-sensitivity data signal SH, the output becomes constant even in a case where the amount of light increases over the saturated charge amount. That is, the output is saturated. Here, the amount of light at a time point when the accumulated charge reaches the saturated charge amount of the memory portion 105 is set to L1. Furthermore, the saturated charge amount of the memory portion 105 is set to C1.

In FIG. 11, the characteristics of the low-sensitivity data signal SL retained in the FD portion 107 are a straight line which passes through the original point of the graph, and in which the output increases at a constant inclination according to an increase in the amount of light, in a region where the amount of incident light is small. Here, the inclination of the straight line is set to k2. The accumulated charge increases according to an increase in the amount of light, and in a case where the accumulated charge reaches a saturated charge amount of the FD portion 107, in the characteristics of the low-sensitivity data signal SL, the output becomes constant even in a case where the amount of light increases over the saturated charge amount. That is, the output is saturated. Here, the amount of light at a time point when the accumulated charge reaches the saturated charge amount of the FD portion 107, is set to L2. Furthermore, the saturated charge amount of the FD portion 107 is set to C2.

Here, the characteristics of the high-sensitivity data signal SH and the low-sensitivity data signal SL illustrated in FIG. 11, as with FIG. 7, are based on the assumption that a first period T1 in which the charge is accumulated in the memory portion 105, is longer than a second period T2 in which the charge is accumulated in the FD portion 107, and are based on the assumption that a charge amount saturating the FD portion 107 is larger than a charge amount saturating the memory portion 105.

For this reason, in the characteristics of the high-sensitivity data signal SH and the low-sensitivity data signal SL illustrated in FIG. 11, an inclination k1 of the high-sensitivity data signal SH retained in the memory portion 105 is larger than an inclination k2 of the low-sensitivity data signal SL retained in the FD portion 107. Furthermore, an output level at which the low-sensitivity data signal SL is saturated (the charge amount) is greater than an output level at which the high-sensitivity data signal SH is saturated (the charge amount).

Moreover, the characteristics of the high-sensitivity data signal SH and the low-sensitivity data signal SL illustrated in FIG. 11 are based on the assumption that the inclination k2 of the low-sensitivity data signal SL retained in the FD portion 107 is smaller than the inclination k1 of the high-sensitivity data signal SH retained in the memory portion 105, and a charge amount C2 saturating the FD portion 107 is larger than a charge amount C1 saturating the memory portion 105, and thus, an amount L2 of light at the time point when the low-sensitivity data signal SL is saturated is larger than an amount L1 of light at the time point when the high-sensitivity data signal SH is saturated.

In the amount of light in which the high-sensitivity data signal SH is lower than the low-sensitivity data signal SL, the output is saturated. The low-sensitivity data signal SL outputs a signal according to the amount of light incident on the PD 101, even in the amount of light in which the output of the high-sensitivity data signal SH is saturated. That is, in the input/output characteristics illustrated in FIG. 11, in the low-sensitivity data signal SL, an input range (a range of the amount of light in which the output according to the amount of light incident on the PD 101 can be obtained) is widened, compared to the high-sensitivity data signal SH, and thus, an output range (a range in which the output according to the amount of light incident on the PD 101 can be obtained) is also widened. In other words, a dynamic range of the characteristics of the low-sensitivity data signal SL is wider than a dynamic range of the characteristics of the high-sensitivity data signal SH.

Therefore, the unit pixel 100A performs processing of multiplying the low-sensitivity data signal SL and a gain together, by using the amplifier for performing gain multiplication processing, which is provided in the signal processor 18. More specifically, in FIG. 11, the low-sensitivity data signal SL and the gain are multiplied together such that the inclination k1 of the high-sensitivity data signal SH before being saturated is identical to an inclination after so-called gain-up in which the low-sensitivity data signal SL before being saturated and the gain are multiplied together.

A broken line in FIG. 11 indicates a signal after the gain-up. With this arrangement, the unit pixel 100A has characteristics that linear output (the amount of charge accumulated as a result of the photoelectric conversion) is obtained with respect to the input (the amount of light incident on the PD 101) over a wide range from a range of the amount of light in which the high-sensitivity data signal SH outputs a charge according to the amount of incident light, to a range of the amount of light in which the low-sensitivity data signal SL outputs a change according to the amount of incident light, and a dynamic range is wide.

Here, in the unit pixel 100A illustrated in FIG. 4, an aspect in which the operation of alternately accumulating a charge in the memory portion 105 and the FD portion 107 is assumed as a comparative example. In other words, a unit pixel of the comparative example has the same configuration on an equivalent circuit to the unit pixel 100A illustrated in FIG. 4, and an operation of transmitting all of the charges generated by the light incident on the PD 100 in the signal charge accumulation period to the memory portion 105, and of accumulating the charges, without performing the operation of alternately accumulating the charge in the memory portion 105 and the FD portion 107 in the unit pixel 100A.

In FIG. 11, input/output characteristics of the comparative example (the amount of charge accumulated as a result of the photoelectric conversion, with respect to the amount of incident light) are considered (not illustrated). The characteristics of the comparative example are a straight line which passes through the original point of the graph of FIG. 11, and in which the output according to an increase in the amount of light increases at an constant inclination, in a range where the amount of incident light is small, as with the high-sensitivity data signal SH of the first embodiment of the present technology illustrated by the solid line in FIG. 11. Here, the inclination of the straight line is set to k0.

Further, in the characteristics of the comparative example, the charge accumulated according to an increase in the amount of light increases, and in a case where the accumulated charge reaches a saturated charge amount of the memory portion 105, the output becomes constant even in a case where the amount of light increases over the saturated charge amount. Here, the amount of light at a time point when the accumulated charge reaches the saturated charge amount of the memory portion 105, is set to L0.

The characteristics of the comparative example described above are compared with the characteristics of the first embodiment of the present technology illustrated in FIG. 11.

In the comparative example, all of the charges generated by the PD 101 in the signal charge accumulation period are transmitted to the memory portion 105, and are accumulated in the memory portion 105.

On the other hand, in the first embodiment of the present technology illustrated in FIG. 11, only an amount corresponding to a ratio of T1/(T1+T2) in the total amount of the charges generated by the PD 101 in the signal charge accumulation period, is transmitted to the memory portion 105, and is accumulated in the memory portion 105. Such characteristics are illustrated by the solid line with "MEM retention" in FIG. 11, as the characteristics of the high-sensitivity data signal SH. The inclination k1 of the straight line portion of the characteristic of the high-sensitivity data signal SH is suppressed to be T1/(T1+T2) times k0. Furthermore, the amount L1 of light at a time point when the characteristics of the high-sensitivity data signal SH are saturated increases to be (T1+T2)/T1 times L0.

Moreover, in the first embodiment of the present technology illustrated in FIG. 11, only an amount corresponding to a ratio of T2/(T1+T2) in the total amount of the charges generated by the PD 101 in the signal charge accumulation period, is transmitted to the FD portion 107, and is accumulated in the FD portion 107. Such characteristics are illustrated by the solid line with "FD retention" in FIG. 11, as the characteristics of the low-sensitivity data signal SL. The inclination k2 of the straight line portion of the characteristics of the low-sensitivity data signal SL is suppressed to be T2/(T1+T2) times k0. Furthermore, the amount L2 of light at a time point when the characteristics of the low-sensitivity data signal SL are saturated increases to be (C2/C1)×(T1+T2)/T2 times L0.

For this reason, in the characteristics of the first embodiment of the present technology in which processing of multiplying the low-sensitivity data signal SL and the gain together is performed such that the inclination k1 of the high-sensitivity data signal SH before being saturated is identical to the inclination after so-called gain-up, obtained by multiplying the low-sensitivity data signal SL before being saturated and the gain together (the broken line in FIG. 11), the input range (the range of the amount of light in which the output according to the amount of light incident on the PD 101 can be obtained) expands to be (C2/C1)×(T1+T2)/T2 times that of the comparative example. Furthermore, the output range (the range in which the output according to the amount of light incident on the PD 101 can be obtained) becomes (C2/C1)×(T1/T2) times, which is a result of multiplying a ratio of (C2/C1)×(T1+T2)/T2 in the input ranges with the comparative example, and a ratio of T1/(T1+T2) in the inclination k0 of the comparative example and the inclination k1 of the high-sensitivity data signal SH together.

Note that, the characteristics of the first embodiment of the present technology illustrated in FIG. 11 are premised on T1>T2 and C2>C1.

As a result thereof, the unit pixel 100A of the first embodiment of the present technology has a wide dynamic range in which the input range expands to be (C2/C1)×(T1+T2)/T2 times, and the output range expands to be (C2/C1)×(T1/T2) times, compared to the comparative example.

The characteristics of the first embodiment of the present technology illustrated in FIG. 11 are premised on T1>T2 and C2>C1, but insofar as T1 and T2 are set such that (C2/C1)×(T1/T2)>1 is obtained even in a condition of C2≤C1, the unit pixel 100A of the first embodiment of the present technology has characteristics that the dynamic range is wider than that of the comparative example. Similarly, insofar as C1 and C2 are set such that (C2/C1)×(T1/T2)>1 is obtained even in a condition of T1≤T2, the unit pixel 100A of the first embodiment of the present technology has characteristics that the dynamic range is wider than that of the comparative example.

Note that, in the pixel 100A of the first embodiment of the present technology, in a case where the amount of light incident on the PD 101 in the signal charge accumulation period is less than or equal to L1, as the output, it is preferable to output the high-sensitivity data signal SH, compared to the case of outputting the low-sensitivity data signal SL after the gain-up in which the low-sensitivity data signal SL and the gain are multiplied together. This is because in a case where a noise level of the high-sensitivity data signal SH retained in the memory portion 105 is identical to a noise level of the low-sensitivity data signal SL retained in the FD portion 107, a noise level of the high-sensitivity data signal SH not multiplied by the gain is lower than a noise level of the low-sensitivity data signal SL in which noise and the gain are multiplied together, and the high-sensitivity data signal SH not multiplied by the gain has an excellent signal noise ratio (an S/N ratio).

Moreover, for example, in a case where an embedded type MOS capacitor illustrated in FIG. 4(A) of Japanese Patent Application Laid-Open No. 2011-199816 is used as the structure of the memory portion 105, and PN-junction capacity including a degenerated semiconductor region in which a plurality of free electrons exist, in apart thereof, is used as the structure of the FD portion 107, there is a high possibility that the noise level of the high-sensitivity data signal SH is lower than the noise level of the low-sensitivity data signal SL before being multiplied by the gain. In such a case, the advantage of outputting the high-sensitivity data signal SH in a case where the amount of light incident on the PD 101 in the signal charge accumulation period is less than or equal to L1, further increases.

Second Embodiment

Figure 12:
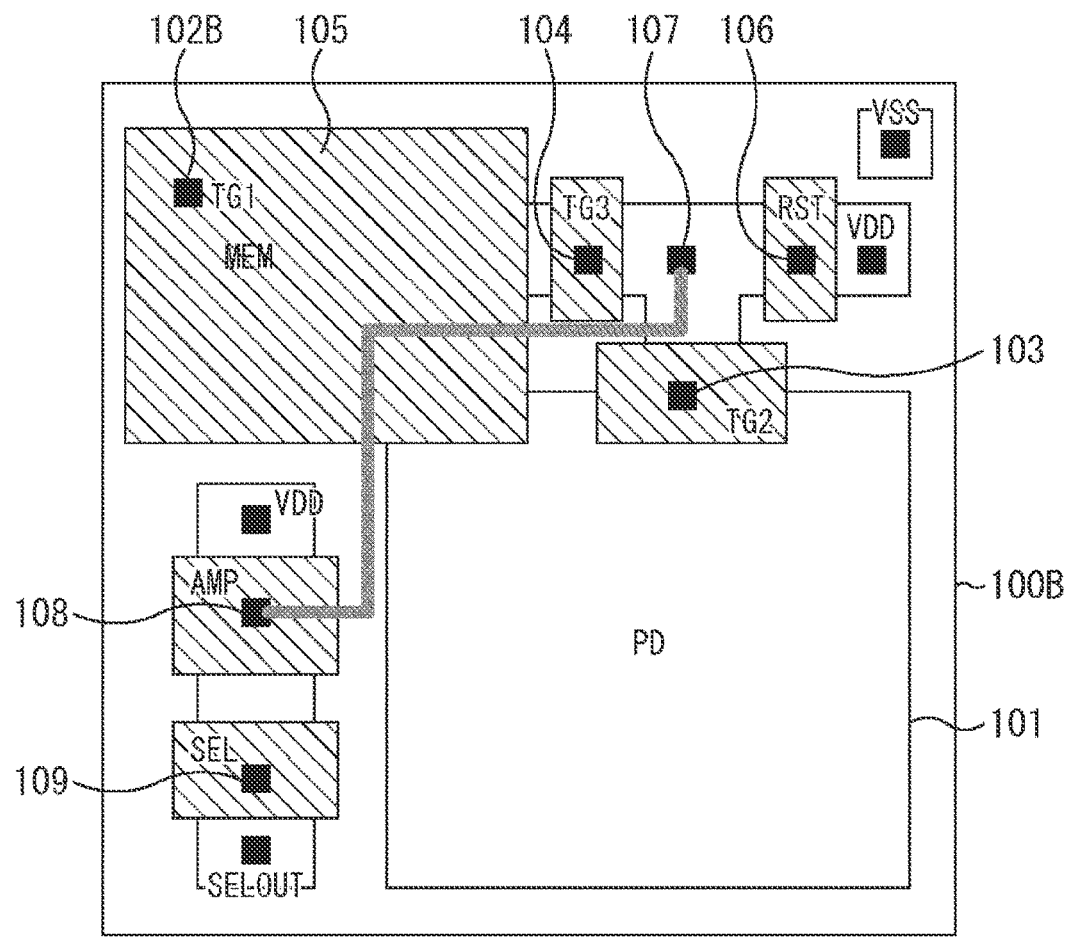
FIG. 12 is a plan layout diagram of a unit pixel in a second embodiment.

Next, a second embodiment to which the present technology is applied, will be described. FIG. 12 is a diagram illustrating a plan layout of the unit pixel 100 in the second embodiment (hereinafter, in the second embodiment, referred to as a unit pixel 100B), and FIG. 13 is a diagram illustrating a sectional structure.

Basic configurations of the unit pixel 100B in the second embodiment illustrated in FIG. 12 are identical to those of the unit pixel 100A in the first embodiment, and thus, the same reference numerals are applied to the same portions, and the description thereof will be suitably omitted.

In a comparison between the plan layout of the unit pixel 100B in the second embodiment illustrated in FIG. 12 and the plan layout of the unit pixel 100A in the first embodiment illustrated in FIG. 3, the unit pixel 100B is different from the unit pixel 100A in the first embodiment in that the first transmission transistor 102 is formed on the memory portion 105.

Figure 13:
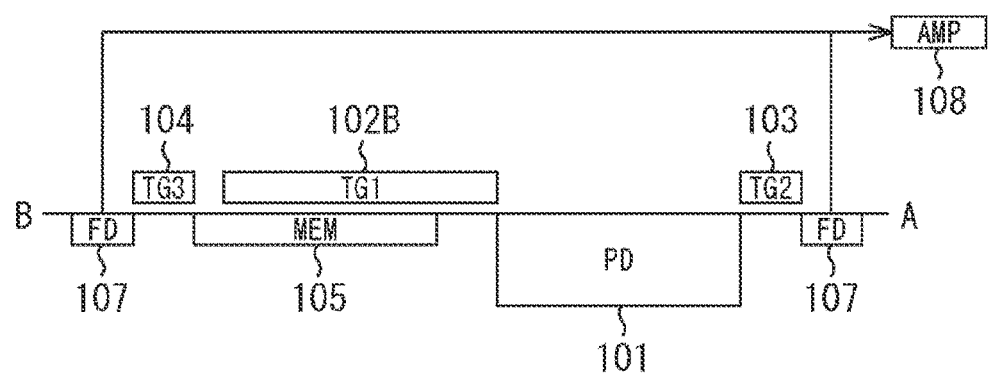
FIG. 13 is a sectional view of the unit pixel in the second embodiment.

In comparison between the sectional structure of the unit pixel 100B in the second embodiment illustrated in FIG. 13 and the sectional structure of the unit pixel 100A in the first embodiment illustrated in FIG. 6, the unit pixel 100B in the second embodiment is different from the unit pixel 100A in the first embodiment in that the first transmission transistor 102 is formed not only between the PD 101 and the memory portion 105, but also on the memory portion 105 by being extended, in the unit pixel 100B.

With reference to FIGS. 12 and 13, the second transmission transistor 103 is formed between the FD portion 107 and the PD 101. Such a configuration is identical to that of the unit pixel 100A in the first embodiment. A first transmission transistor 102B is formed between the PD 101 and the memory portion 105, and is formed on the upper portion of the memory portion 105. Such a configuration is different from that of the unit pixel 100A in the first embodiment.

Furthermore, the third transmission transistor 104 is formed between the memory portion 105 and the FD portion 107, and the FD portion 107 is connected to the amplification transistor 108 by wiring. Such a configuration is identical to that of the unit pixel 100A in the first embodiment.

Thus, the unit pixel 100B to which the present technology is applied, includes the first transmission transistor 102B and the third transmission transistor 104 for transmitting the charge accumulated in the PD 101 to the FD portion 107 after accumulating the charge in the memory portion 105 once. Furthermore, the unit pixel 100B includes the second transmission transistor 103 for transmitting the charge accumulated in the PD 101 to the FD portion 107. Furthermore, the first transmission transistor 102B expands onto the memory portion 105.

Thus, the first transmission transistor 102B is disposed on the upper portion of the memory portion 105, and thus, in a case where the first transmission transistor 102B is turned on, the potential of the memory portion 105 becomes deep together, and thus, it is possible to make the potential of the memory portion 105 deep. This will be described with reference to FIGS. 14A, 14B, 14C, and 14D.

Note that, in the second embodiment, a circuit diagram of the unit pixel 100B is identical to the circuit diagram of the unit pixel 100A in the first embodiment, as illustrated in FIG. 4, and thus, the description thereof will be omitted. Furthermore, a basic operation is also similar to that described with reference to the timing chart illustrated in FIG. 7, and thus, the description thereof will be omitted.

Figure 14A:
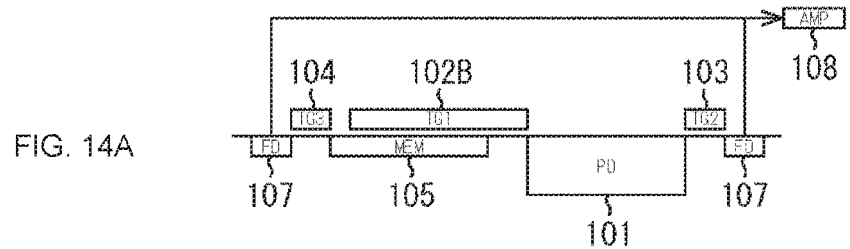
FIGS. 14A, 14B, 14C, and 14D are diagrams for illustrating a change in a potential of the unit pixel in the second embodiment.

FIGS. 14A, 14B, 14C, and 14D is identical to FIGS. 8A, 8B, 8C, and 8D, and are diagrams for illustrating the details of the operation of the unit pixel 100B at the times t4 to t6 of the timing chart of FIG. 7. FIG. 14A illustrates the sectional structure of the unit pixel 100B, and is illustrated for referring to the sectional structure illustrated in FIG. 13.

Figure 14B:
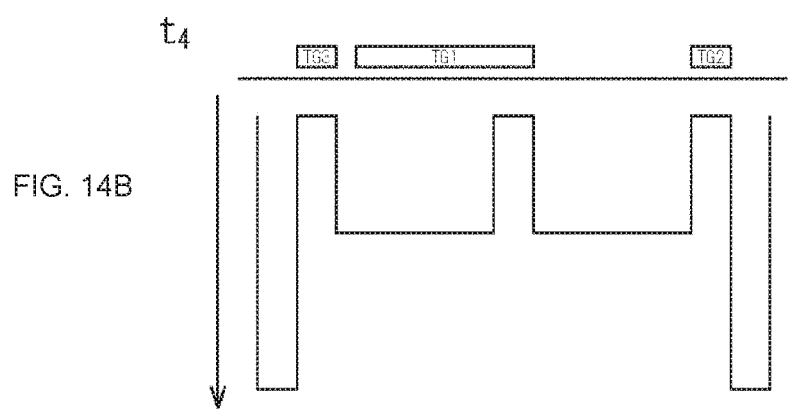
Figure 14C:
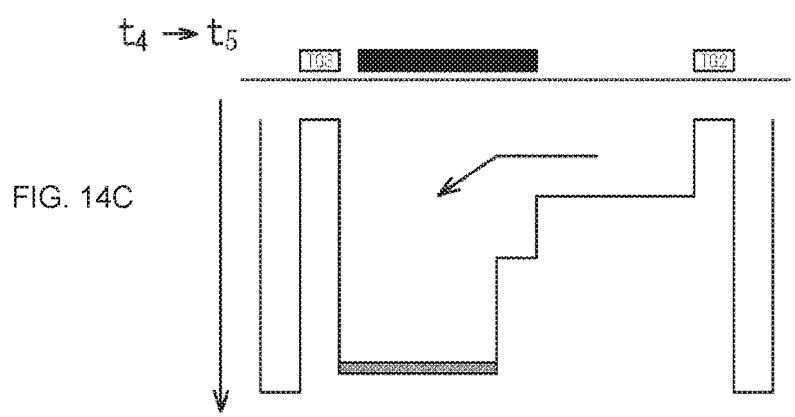
Figure 14D:
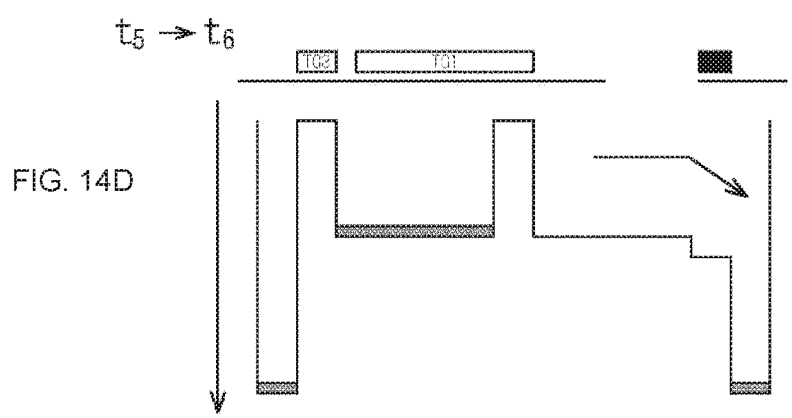

FIG. 14B, FIG. 14C, and FIG. 14D illustrate potential diagrams of the unit pixel 100B at each of the times t4 to t6. In addition, in the drawings, a black square indicates that the driving signal is turned on, and a white square indicates that the driving signal is turned off.

FIG. 14B, for example, illustrates the state of the potential at the time t4, is a state before the charge is accumulated in the PD 101, and illustrates a state in which the memory portion 105 and the FD portion 107 are reset. As illustrated in FIG. 14B, the first transmission transistor 102B is disposed between the PD 101 and the memory portion 105, and expands onto the memory portion 105, and the potential of the memory portion 105 is approximately at the same level as the potential of the PD 101.

In the state as illustrated in FIG. 14B, in a case where the accumulation of the charge in the PD 101 is started, and the first transmission transistor 102B is turned on, as illustrated in FIG. 14C, the signal charge of the PD 101 is transmitted to the memory portion 105. In a case where the first transmission transistor 102B is turned on, the potential barrier between the PD 101 and the memory portion 105, and the potential of the memory portion 105 become deep together, and thus, a state is obtained in which the signal charge can be transmitted from the PD 101 to the memory portion 105.

Thus, in a case where the first transmission transistor 102B is turned on, the potential barrier between the PD 101 and the memory portion 105, and the potential of the memory portion 105 become deep together, and thus, as described above, the potential of the memory portion 105 can be approximately at the same level as the potential of the PD 101.

In the first embodiment, as described with reference to FIGS. 8A, 8B, 8C, and 8D, it is necessary that the potential of the memory portion 105 is deeper than the potential of the PD 101, but in the second embodiment, the potential of the memory portion 105 can be approximately at the same level as the potential of the PD 101.

Note that, in the second embodiment, it is obvious that the potential of the memory portion 105 may be deeper than the potential of the PD 101.

In a case where the first transmission transistor 102B is turned off, the potential barrier is formed between the PD 101 and the memory portion 105, and the transmission of the signal charge from the PD 101 to the memory portion 105 is stopped. Then, in a case where the first transmission transistor 102B is turned off at the time t5, and the second transmission transistor 103 is turned on, the signal charge is transmitted from the PD 101 to the FD portion 107.

Thus, the transmission of the charge with respect to the memory portion 105 and the transmission of the charge with respect to the FD portion 107 are performed.

Such operations are alternately repeated in the exposure period, and thus, in the signal charges subjected to the photoelectric conversion of the PD 101 in the exposure period, the signal charge generated within the period in which the first transmission transistor 102B is turned on (referred to as the first period) is transmitted to the memory portion 105, and is accumulated/retained in the memory portion 105. Furthermore, in the signal charges subjected to the photoelectric conversion of the PD 101 in the exposure period, the signal charge generated within the period in which the second transmission transistor 103 is turned on (referred to as the second period) is transmitted to the FD portion 107, and is accumulated/retained in the FD portion 107.

Such operations are similar to those of the first embodiment. In other words, in the second embodiment, as with the first embodiment, it is possible to acquire the low-sensitivity data signal SL and the high-sensitivity data signal SH, and to perform imaging in which a dynamic range expands.

Third Embodiment

Figure 15:
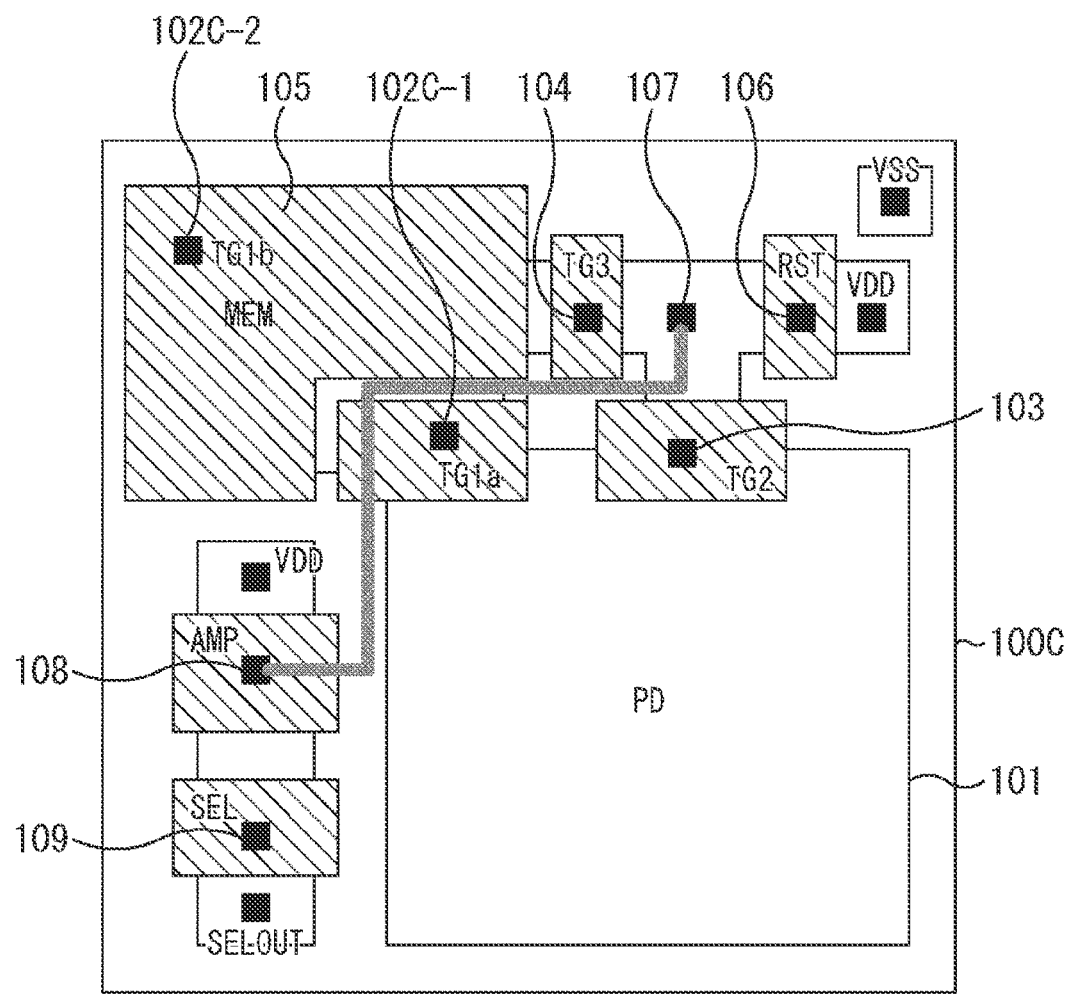
FIG. 15 is a plan layout diagram of a unit pixel in a third embodiment.
Figure 16:
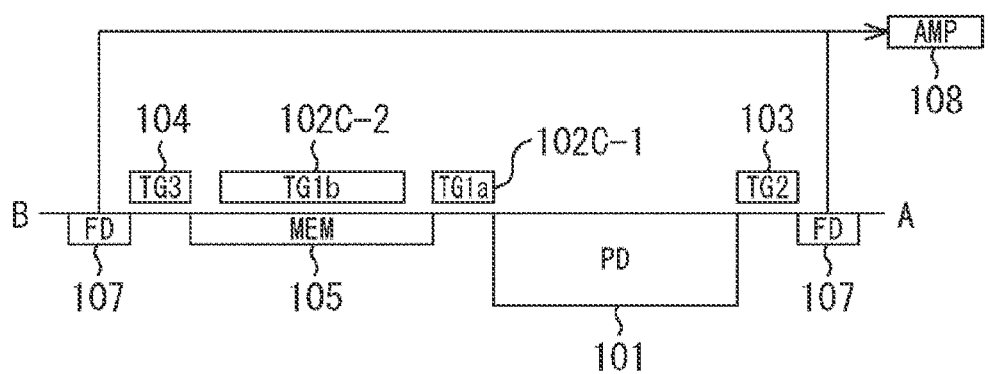
FIG. 16 is a sectional view of the unit pixel in the third embodiment.

Next, a third embodiment to which the present technology is applied, will be described. FIG. 15 is a diagram illustrating a plan layout of the unit pixel 100 in the third embodiment (hereinafter, in the third embodiment, referred to as a unit pixel 100C), and FIG. 16 is a diagram illustrating a sectional structure.

Basic configurations of the unit pixel 100C in the third embodiment illustrated in FIG. 15 are identical to those of the unit pixel 100A (100B) in the first embodiment or the second embodiment, and thus, the same reference numerals are applied to the same portions, and the description thereof will be suitably omitted.

In a comparison between the plan layout of the unit pixel 100C in the third embodiment illustrated in FIG. 15 and the plan layout of the unit pixel 100A in the first embodiment illustrated in FIG. 3 or the plan layout of the unit pixel 100B in the second embodiment illustrated in FIG. 12, the unit pixel 100C is different from the unit pixel 100A in the first embodiment but is identical to the unit pixel 100B in the second embodiment, in that the first transmission transistor 102 is formed on the memory portion 105.

The unit pixel 100C in the third embodiment is different from the unit pixel 100B in the second embodiment in that the first transmission transistor 102 is divided into two transmission transistors. In other words, a first transmission transistor 102C of the unit pixel 100C includes a first transmission transistor 102C-1 and a first transmission transistor 102C-2.

In comparison between the sectional structure of the unit pixel 100C in the third embodiment illustrated in FIG. 16 and the sectional structure of the unit pixel 100A in the first embodiment illustrated in FIG. 6 or the sectional structure of the unit pixel 100B in the second embodiment illustrated in FIG. 13, the unit pixel 100C is different from the unit pixel 100A in the first embodiment but is identical to the unit pixel 100B in the second embodiment, in that the first transmission transistor 102 is also formed on the memory portion 105.

The unit pixel 100C in the third embodiment is different from the unit pixel 100B in the second embodiment in that the first transmission transistor 102 is divided into two transmission transistors. In other words, the first transmission transistor 102C of the unit pixel 100C includes the first transmission transistor 102C-1 and the first transmission transistor 102C-2. Then, the first transmission transistor 102C-1 is disposed between the PD 101 and the memory portion 105, and the first transmission transistor 102C-2 is disposed on the memory portion 105.

Thus, the first transmission transistor 102C-1 is formed between the PD 101 and the memory portion 105, and the first transmission transistor 102C-2 is formed on the memory portion 105. The first transmission transistor 102C-1 and the first transmission transistor 102C-2 are identical to the first transmission transistor 102 in the first embodiment or the first transmission transistor 102B in the second embodiment, and are disposed as a transmission transistor transmitting the signal charge from the PD 101 to the memory portion 105.

Furthermore, the second transmission transistor 103 is formed between the FD portion 107 and the PD 101, the third transmission transistor 104 is formed between the memory portion 105 and the FD portion 107, and the FD portion 107 is connected to the amplification transistor 108 by wiring. Such a configuration is identical to that of the unit pixel 100A in the first embodiment (the unit pixel 100B in the second embodiment).

Thus, the unit pixel 100C to which the present technology is applied, includes the first transmission transistor 102C and the third transmission transistor 104 for transmitting the charge accumulated in the PD 101 to the FD portion 107 after accumulating the charge in the memory portion 105 once. Furthermore, the unit pixel 100C includes the third transmission transistor 104 for transmitting the charge accumulated in the PD 101 to the FD portion 107. Furthermore, the first transmission transistor 102C is divided, the first transmission transistor 102C-1 is formed between the PD 101 and the memory portion 105, and the first transmission transistor 102C-2 is formed on the memory portion 105.

Thus, the first transmission transistor 102C-2 configuring the first transmission transistor 102C is disposed on the upper portion of the memory portion 105, and thus, as with the second embodiment, in a case where the first transmission transistor 102C-2 is turned on, the potential of the memory portion 105 becomes deep together, and thus, it is possible to make the potential of the memory portion 105 deep. This will be described later with reference to FIGS. 18A, 18B, 18C, 18D, and 18E.

In the third embodiment, a circuit diagram of the unit pixel 100C is identical to the circuit diagram of the unit pixel 100A in the first embodiment, as illustrated in FIG. 4, and thus, the description thereof will be omitted. Here, the first transmission transistor 102C is different from the first transmission transistor 102 illustrated in FIG. 4, in that the first transmission transistor 102C includes the first transmission transistor 102C-1 and the first transmission transistor 102C-2.

The operation of the unit pixel 100C in the third embodiment will be described with reference to a timing chart illustrated in FIG. 17.

Figure 17:
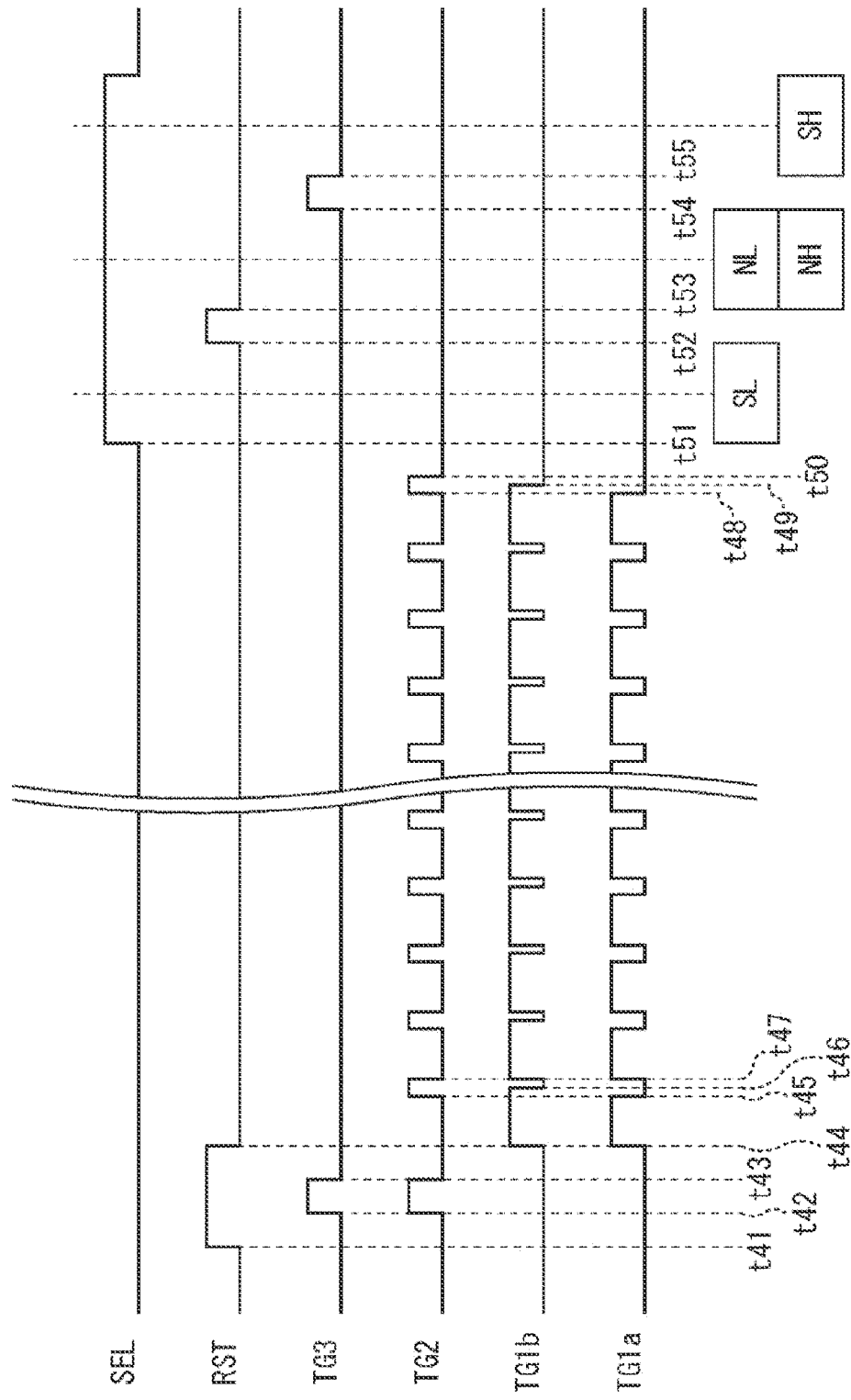
FIG. 17 is a diagram for illustrating an operation of the unit pixel in the third embodiment.

FIG. 17 illustrates a timing chart of the selection signal SEL of driving the selection transistor 109, the reset signal RST of driving the reset transistor 106, the transmission signal TG3 of driving the third transmission transistor 104, the transmission signal TG2 of driving the second transmission transistor 103, a transmission signal TG1$b$ of driving the first transmission transistor 102C-2, and a transmission signal TG1$a$ of driving the first transmission transistor 102C-1, of the unit pixel 100C in the third embodiment.

First, the gate portion of the reset transistor 106 is turned on, and during this period, the gate portion of each of the second transmission transistor 103 and the third transmission transistor 104 is also turned on.

With reference to the timing chart illustrated in FIG. 17, the reset signal RST is turned on at a time t41, and thus, the reset transistor 106 is turned on. The transmission signal TG2 and the transmission signal TG3 are respectively turned on at a time t42 after the time t41, and thus, the second transmission transistor 103 and the third transmission transistor 104 are respectively turned on. According to such an operation, the PD 101, the memory portion 105, and the FD portion 107 of the unit pixel 100C are respectively reset.

The PD 101, the memory portion 105, and the FD portion 107 are respectively reset, and then, the gate portion of each of the second transmission transistor 103, the third transmission transistor 104, and the reset transistor 106 is turned off.

With reference to the timing chart illustrated in FIG. 17, the transmission signal TG2 and the transmission signal TG3 are respectively turned off at a time t43, and thus, the second transmission transistor 103 and the third transmission transistor 104 are respectively turned off. The reset signal RST is turned off at a time t44 after the time t43, and thus, the reset transistor 106 is turned off.

The reset operation is performed, and then, an accumulation period in which the charge generated as a result of the photoelectric conversion of the PD 101 is accumulated, is started. In the accumulation period, the second transmission transistor 103 and the first transmission transistor 102C are alternately turned on and off.

In other words, the transmission signal TG1$a$ and the transmission signal TG1$b$ are turned on at the time t44, and thus, the first transmission transistor 102C-1 and the first transmission transistor 102C-2 are respectively turned on, and the transmission signal TG1$a$ is turned off at a time t45, and thus, the first transmission transistor 102C-1 is turned off.

In addition, the transmission signal TG2 is turned on at the time t45, and thus, the second transmission transistor 103 is turned on, and the transmission signal TG2 is turned off at a time t47, and thus, the second transmission transistor 103 is turned off.

The transmission signal TG1$b$ is turned off at a time t46 which is a time after the time t45 and before a time t47, and thus, the first transmission transistor 102C-2 is turned off.

Thus, the first transmission transistor 102C-1 and the first transmission transistor 102C-2 are simultaneously turned on, and the first transmission transistor 102C-1 is turned off prior to the first transmission transistor 102C-2. Furthermore, when the first transmission transistor 102C-1 is turned off, the second transmission transistor 103 is turned on.

The first transmission transistor 102C-1 and the first transmission transistor 102C-2 are turned on together, and thus, the signal charge accumulated in the PD 101 is transmitted to the memory portion 105. Thereafter, in a case where the first transmission transistor 102C-1 is turned off, the transmission from the PD 101 to the memory portion 105 is stopped. Furthermore, the second transmission transistor 103 is turned on, and thus, the signal charge accumulated in the PD 101 is transmitted to the FD portion 107.

Thus, in the accumulation period in which the charge generated as a result of the photoelectric conversion of the PD 101 is accumulated, the first transmission transistor 102C and the second transmission transistor 103 are alternately turned on, and thus, the signal charge accumulated in the PD 101 is alternately transmitted to the memory portion 105 and the FD portion 107.

The first transmission transistor 102C is repeatedly turned on and off during a period from the time t44 to a time t49, and thus, transmits the signal charge from the PD 101 to the memory portion 105. Furthermore, the second transmission transistor 103 is repeatedly turned on and off during a period from the time t45 to a time t50, and thus, transmits the signal charge from the PD 101 to the FD portion 107.

Figure 18A:
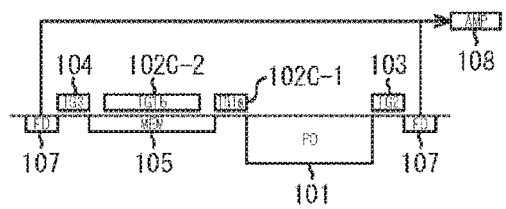
FIGS. 18A, 18B, 18C, 18D, and 18E are diagrams for illustrating a change in a potential of the unit pixel in the third embodiment.

Here, the operation of the unit pixel 100C at the times t44 to t47 of the timing chart of FIG. 17 will be described in detail with reference to FIGS. 18A, 18B, 18C, 18D, and 18E. FIG. 18A illustrates a sectional structure of the unit pixel 100C, and is illustrated for referring to the sectional structure illustrated in FIG. 16.

FIG. 18B, FIG. 18C, FIG. 18D, and FIG. 18E illustrate potential diagrams of the unit pixel 100C at each of the times t44 to t47. In addition, in the drawings, a black square illustrates that the driving signal is turned on, and a white square illustrates that the driving signal is turned off.

Figure 18B:
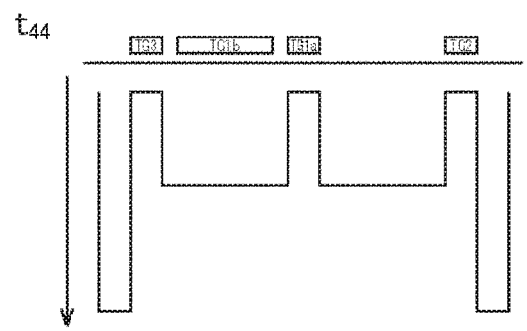

FIG. 18B, for example, illustrates the state of the potential at the time t44, is a state before the charge is accumulated in the PD 101, and illustrates a state in which the memory portion 105 and the FD portion 107 are reset.

As illustrated in FIG. 18B, the first transmission transistor 102C-1 is formed between the PD 101 and the memory portion 105, and the first transmission transistor 102C-2 is disposed on the memory portion 105, and thus, as with the second embodiment, the potential of the memory portion 105 can be approximately at the same level as the potential of the PD 101.

Note that, in the third embodiment, it is obvious that the potential of the memory portion 105 may be deeper than the potential of the PD 101.

Figure 18C:
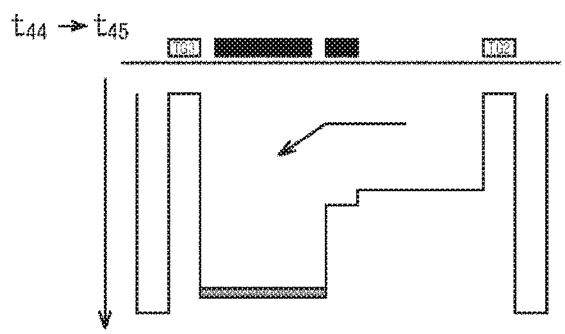

In the state as illustrated in FIG. 18B, in a case where the accumulation of the charge in the PD 101 is started, and the first transmission transistor 102C-1 and the first transmission transistor 102C-2 are turned on together, as illustrated in FIG. 18C, the signal charge of the PD 101 is transmitted to the memory portion 105.

In a case where the first transmission transistor 102C-1 is turned on, the potential barrier between the PD 101 and the memory portion 105 becomes deep, and in a case where the first transmission transistor 102C-2 is turned on, the potential of the memory portion 105 becomes deep. Thus, in a case where the potential of the memory portion 105 becomes deeper than the potential of the PD 101, the signal charge is transmitted from the PD 101 to the memory portion 105.

Figure 18D:
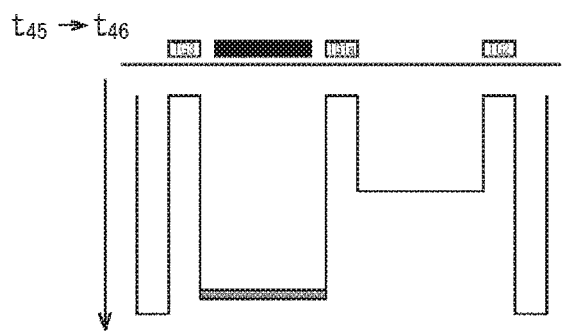

As illustrated in FIG. 18D, in a case where the first transmission transistor 102C-1 is turned off, the potential barrier is formed between the PD 101 and the memory portion 105, and the transmission of the signal charge from the PD 101 to the memory portion 105 is stopped. At this time (at the time t45), the first transmission transistor 102C-2 is still turned on, and thus, a state is maintained in which the potential of the memory portion 105 is lower than the potential of the PD 101.

Figure 18E:
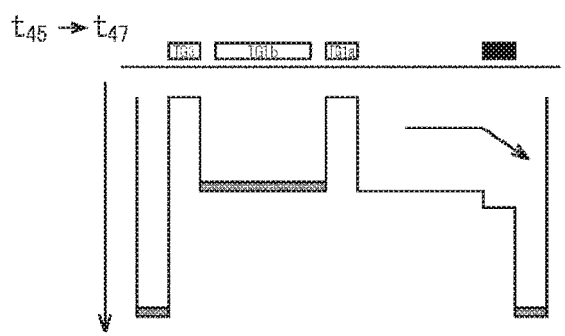

After that (at the time t46), in a case where the first transmission transistor 102C-2 is turned off, as illustrated in FIG. 18E, the potential of the memory portion 105 returns to the original potential, but the potential barrier is formed between the PD 101 and the memory portion 105 since the first transmission transistor 102C-1 is turned off, and thus, it is possible to prevent a backward flow of the signal charge from the memory portion 105 to the PD 101.

Then, in a case where the first transmission transistor 102C-2 is turned off at the time t46, and the third transmission transistor 104 is turned on, the signal charge is transmitted from the PD 101 to the FD portion 107.

Thus, the transmission of the charge with respect to the memory portion 105 and the transmission of the charge with respect to the FD portion 107 are performed.

Such operations are alternately repeated in the exposure period, and thus, in the signal charges subjected to the photoelectric conversion of the PD 101 in the exposure period, the signal charge generated within the period in which the first transmission transistor 102C is turned on (referred to as the first period) is transmitted to the memory portion 105, and is accumulated/retained in the memory portion 105. Furthermore, in the signal charges subjected to the photoelectric conversion of the PD 101 in the exposure period, the signal charge generated within the period in which second transmission transistor 103 is turned on (referred to as the second period) is transmitted to the FD portion 107, and is accumulated/retained in the FD portion 107.

Such operations are similar to those of the first embodiment. In other words, in the third embodiment, as with the first embodiment, it is possible to acquire the low-sensitivity data signal SL and the high-sensitivity data signal SH, and to perform imaging in which a dynamic range expands.

Furthermore, in the third embodiment, the first transmission transistor 102C is divided into the first transmission transistor 102-1 and the first transmission transistor 102C-2, and the first transmission transistor 102C-1 and the first transmission transistor 102C-2 are turned on together, and thus, the charge is transmitted from the PD 101 to the memory portion 105, and then, the first transmission transistor 102C-1 is turned off prior to the first transmission transistor 102C-2, and the potential barrier is formed between the PD 101 and the memory portion 105.

Then, the potential barrier is formed, and then, the first transmission transistor 102C-2 is turned off, and thus, even in a case where the first transmission transistor 102C-2 is lowered, an effect of preventing the backward flow of the charge from the memory portion 105 to the PD 101 (in particular, at the time of being saturated) can be obtained according to the third embodiment.

The accumulation period as described above is ended, and then, the process proceeds to the read-out period. In the accumulation period, the processing as described above, in other words, the processing from the reset to the transmission with respect to the memory portion 105 or the FD portion 107 is simultaneously performed in all of the pixels in the pixel array portion 11, and thus, it is possible to realize a global shutter having the same accumulation time in all of the pixels.

The operation within the read-out period is performed as similar to that of the first embodiment, and thus, the description thereof will be omitted.

In the third embodiment, as with the first embodiment and the second embodiment, it is possible to acquire the low-sensitivity data signal SL and the high-sensitivity data signal SH, and to perform imaging in which a dynamic range expands.

Fourth Embodiment

Figure 19:
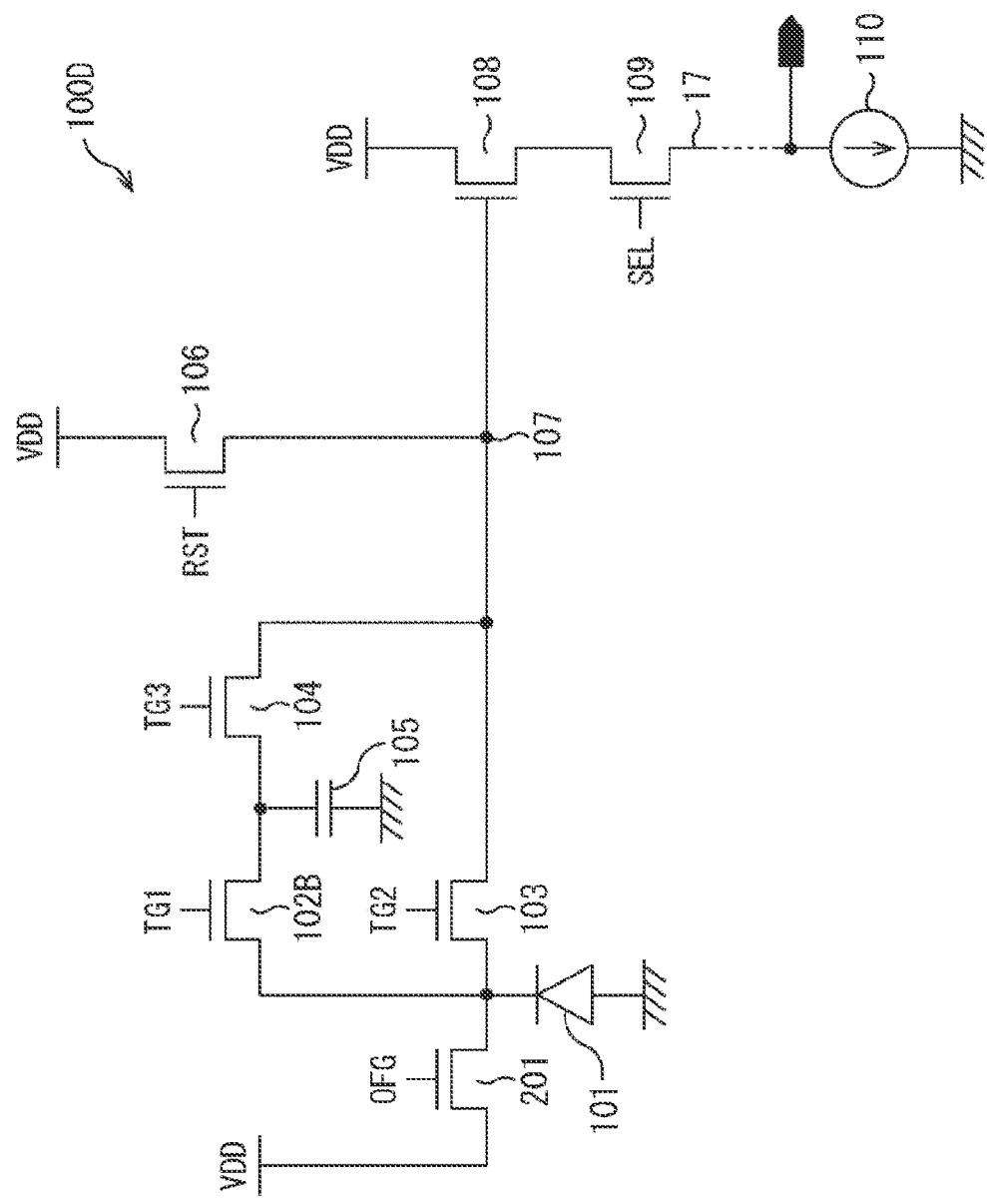
FIG. 19 is a circuit diagram illustrating a configuration example of a unit pixel in a fourth embodiment.

Next, a fourth embodiment to which the present technology is applied, will be described. FIG. 19 is a circuit diagram of the unit pixel 100 in the fourth embodiment (hereinafter, in the fourth embodiment, referred to as a unit pixel 100D).

The unit pixel 100D in the fourth embodiment illustrated in FIG. 19 has a configuration in which a discharge transistor 201 is added to the unit pixel 100A in the first embodiment, and the other portions are identical to those of the unit pixel 100A in the first embodiment, and thus, the same reference numerals are applied to the same portions, and the description thereof will be suitably omitted.

In a comparison between the circuit diagram of the unit pixel 100D in the fourth embodiment illustrated in FIG. 19 and the circuit diagram of the unit pixel 100A in the first embodiment illustrated in FIG. 4, the unit pixel 100D is different from the unit pixel 100A in that the discharge transistor 201 is added to the unit pixel 100A, and the discharge transistor 201 is connected to a cathode terminal of the PD 101.

When a global shutter operation is performed, the charge is retained in the memory portion 105 and the FD portion 107, and the read-out is performed for each row, but at this time, the signal charge is generated by the PD 101 in a case where incident light is blocked by a mechanical shutter or the like. In a case where the signal charge flows into the memory portion 105 and the FD portion 107 before being read out, the data is damaged. In order to prevent the data from being damaged, the discharge transistor 201 is turned on after the accumulation is completed, and the signal charge generated by the PD 101 is discharged to a drain (VDD).

Figure 20:
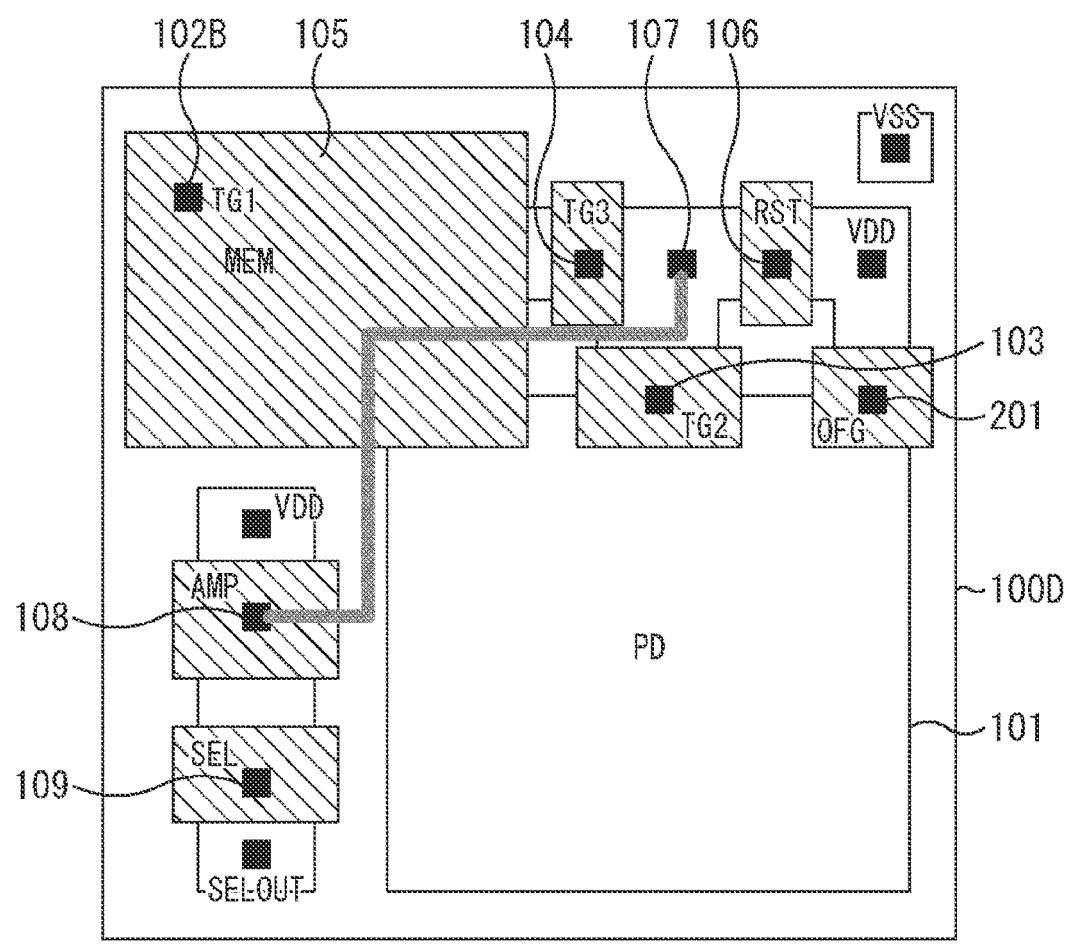
FIG. 20 is a plan layout diagram of the unit pixel in the fourth embodiment.

FIG. 20 is a diagram illustrating a plan layout of the unit pixel 100D in the fourth embodiment. The plan layout of the unit pixel 100D illustrated in FIG. 20 is basically similar to the plan layout of the unit pixel 100B in the second embodiment illustrated in FIG. 12, except that the discharge transistor 201 is added.

In other words, the PD 101, the first transmission transistor 102, the second transmission transistor 103, the third transmission transistor 104, the memory portion 105, the reset transistor 106, the FD portion 107, the connection portion with respect to the power source VDD, and the discharge transistor 201 are formed on the continuous first active region. Furthermore, the discharge transistor 201 is formed between the connection portion with respect to the power source VDD and the PD 101.

In FIG. 20, a configuration is illustrated in which the discharge transistor 201 is added to the unit pixel 100B in the second embodiment (FIG. 12), but a configuration can be used in which the discharge transistor 201 is added to the unit pixel 100A in the first embodiment (FIG. 5). In other words, in the unit pixel 100D of the fourth embodiment, as illustrated in FIG. 5, the first transmission transistor 102 may be disposed between the PD 101 and the memory portion 105, and as illustrated in FIG. 12, the first transmission transistor 102 may be disposed between the PD 101 and the memory portion 105, and may extend onto the upper portion of the memory portion 105.

Moreover, a configuration can be used in which the discharge transistor 201 is added to the unit pixel 100C in the third embodiment (FIG. 15). In other words, in the unit pixel 100D of the fourth embodiment, as illustrated in FIG. 15, the first transmission transistor 102 may be configured such that the first transmission transistor 102C-1 is disposed between the PD 101 and the memory portion 105, and the first transmission transistor 102C-2 is disposed on the upper portion of the memory portion 105.

The operation of the unit pixel 100D in the fourth embodiment will be described with reference to a timing chart illustrated in FIG. 21.

Figure 21:
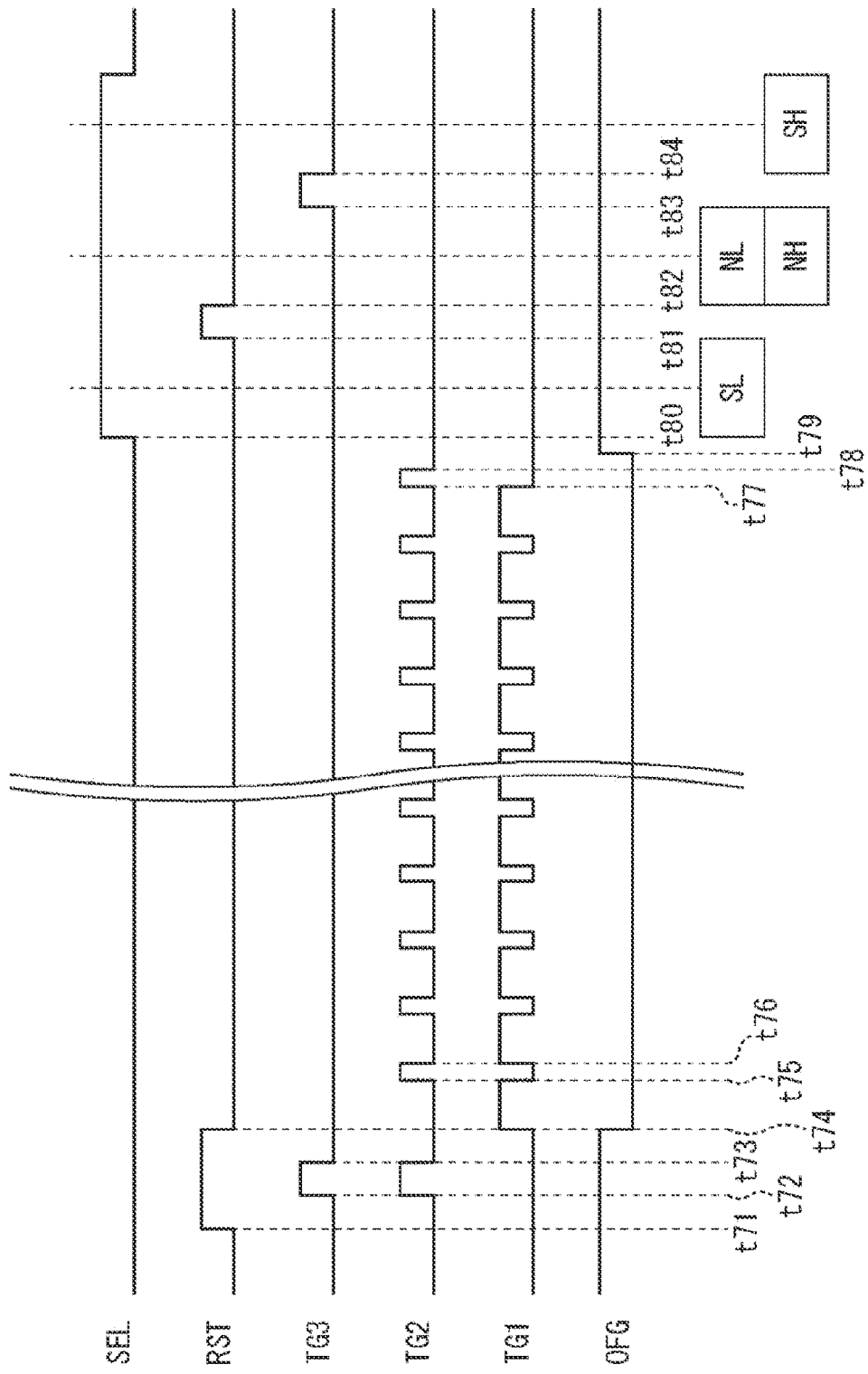
FIG. 21 is a diagram for illustrating an operation of the unit pixel in the fourth embodiment.

FIG. 21 illustrates a timing chart of the selection signal SEL of driving the selection transistor 109, the reset signal RST of driving the reset transistor 106, the transmission signal TG3 of driving the third transmission transistor 104, the transmission signal TG2 of driving the second transmission transistor 103, the transmission signal TG1 of driving the first transmission transistor 102B, and a discharge signal OFG of driving the discharge transistor 201, of the unit pixel 100D in the fourth embodiment.

The operation of the unit pixel 100D in the fourth embodiment is an operation basically similar to that of the unit pixel 100B in the second embodiment, and is an operation in which the operation of the discharge transistor 201 is added to the operation of the unit pixel 100B. Here, the operation of the discharge transistor 201, which is the added operation, will be described, and the description of the other similar operations will be suitably omitted.

A period from a time t74 to a time t79 is the accumulation period of the charge, and is a period in which the charge accumulated by the PD 101 is alternately transmitted to the memory portion 105 and the FD portion 107, and is retained in the memory portion 105 and the FD portion 107. The reset is performed at a time point before the accumulation period, and in a reset period, a state is obtained in which the discharge signal OFG is turned on, and the discharge transistor 201 is turned on.

In other words, in the reset period, the discharge transistor 201 performs an operation for discharging the signal charge generated by the PD 101 to the drain (VDD). Then, during the accumulation period, a state is obtained in which the discharge signal OFG is turned off, and the discharge transistor 201 is turned off.

The process proceeds to the read-out period after the accumulation period, and during the read-out period (after a time t80), a state is obtained in which the discharge signal OFG is turned on, and the discharge transistor 201 is turned on. During the read-out period, the charge is not transmitted from the PD 101 to the memory portion 105 or the FD portion 107, but there is a possibility that the PD 101 receives light and accumulates the charge. During such a period, a state is obtained in which the discharge transistor 201 performs the operation for discharging the signal charge generated by the PD 101 to the drain (VDD).

In the fourth embodiment, the first transmission transistor 102B and the second transmission transistor 103 are alternately turned on, in the accumulation period in which the charge generated as a result of the photoelectric conversion of the PD 101 is accumulated, and thus, the signal charge accumulated by the PD 101 is alternately transmitted to the memory portion 105 and the FD portion 107.

Such operations are alternately repeated in the exposure period, and thus, in the signal charges subjected to the photoelectric conversion of the PD 101 in the exposure period, the signal charge generated within the period in which the first transmission transistor 102B is turned on (referred to as the first period) is transmitted to the memory portion 105, and is accumulated/retained in the memory portion 105. Furthermore, in the signal charges subjected to the photoelectric conversion of the PD 101 in the exposure period, the signal charge generated within the period in which the second transmission transistor 103 is turned on (referred to as the second period) is transmitted to the FD portion 107, and is accumulated/retained in the FD portion 107.

Such operations are similar to those of the first embodiment. In other words, in the fourth embodiment, as with the first embodiment to the third embodiment, it is possible to acquire the low-sensitivity data signal SL and the high-sensitivity data signal SH, and to perform imaging in which a dynamic range expands.

Furthermore, in the fourth embodiment, the discharge transistor 201 is provided, and the operation for discharging the charge generated by the PD 101 to the drain (VDD) is performed in the reset period or the read-out period (a period other than the accumulation period), and thus, it is possible to prevent the charge generated by the PD 101 in the reset period or the read-out period from flowing into the memory portion 105 or the FD portion 107, and to prevent the data from being damaged.

Fifth Embodiment

Next, a fifth embodiment will be described. The unit pixel 100 in the fifth embodiment has a configuration similar to that of the unit pixel 100D in the fourth embodiment, and thus, the description thereof will be omitted. The operation of the unit pixel 100D in the fifth embodiment will be described with reference to FIG. 22 and FIG. 23.

Figure 22:
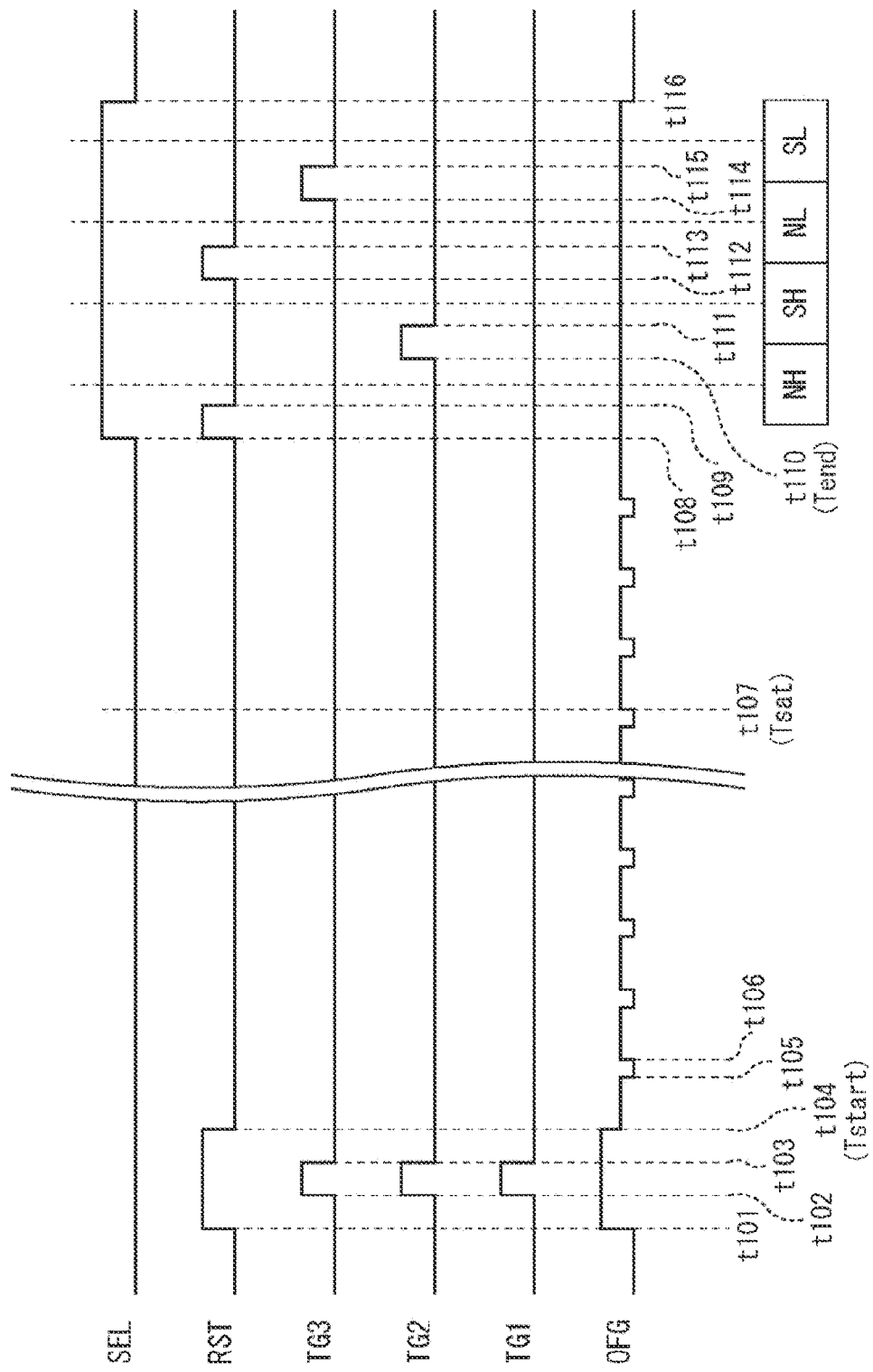
FIG. 22 is a diagram for illustrating an operation of a unit pixel in a fifth embodiment.

FIG. 22 illustrates a timing chart of the selection signal SEL of driving the selection transistor 109, the reset signal RST of driving the reset transistor 106, the transmission signal TG3 of driving the third transmission transistor 104, the transmission signal TG2 of driving the second transmission transistor 103, the transmission signal TG1 of driving the first transmission transistor 102B, and the discharge signal OFG of driving the discharge transistor 201, of the unit pixel 100D in the fifth embodiment.

Figure 23:
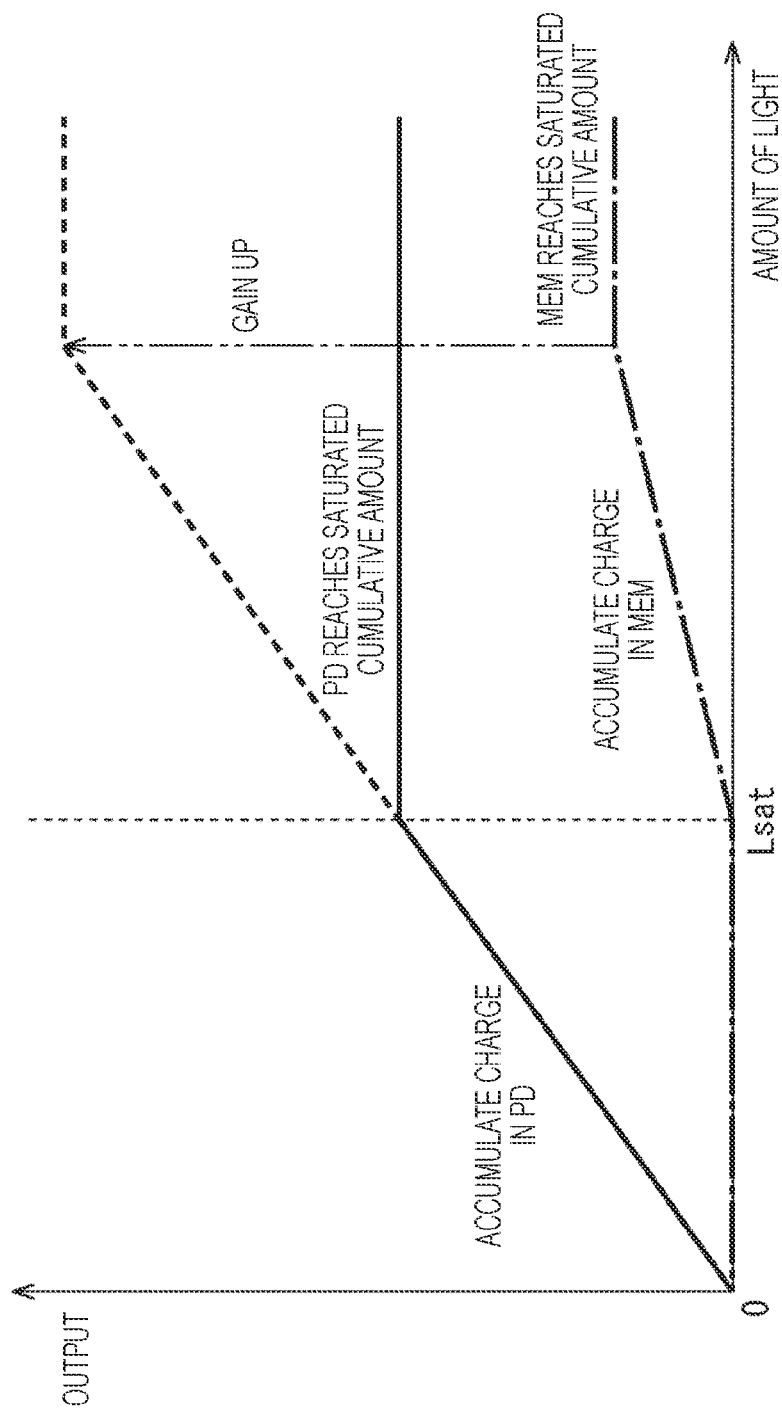
FIG. 23 is a diagram for illustrating an effect obtained by the unit pixel in the fifth embodiment.

In FIG. 23, the amount of light received by a pixel of the fifth embodiment in a period of the accumulation operation in which the charge generated as a result of the photoelectric conversion is accumulated, is indicated on a horizontal axis, whereas the output obtained as a result of the photoelectric conversion (for example, the amount of accumulated charge) is indicated on a vertical axis. In FIG. 23, a solid line indicates the amount of charge accumulated in the PD 101, with respect to the amount of received light in the period of the accumulation operation. In FIG. 23, a dot-and-dash line indicates the amount of charge accumulated in the memory portion 105, with respect to the amount of received light in the period of the accumulation operation.

The reset signal RST and the discharge signal OFG are respectively turned on at a time t101, and thus, the gate portion of the reset transistor 106 and the discharge transistor 201 is turned on.

Then, the transmission signal TG1, the transmission signal TG2, and the transmission signal TG3 are turned on during a period in which the reset transistor 106 and the discharge transistor 201 are turned on (a time t102), and thus, the gate portion of each of the first transmission transistor 102B, the second transmission transistor 103, and the third transmission transistor 104 is turned on. According to such operations, the PD 101, the memory portion 105, and the FD portion 107 of the unit pixel 100D are respectively reset.

The PD 101, the memory portion 105, and the FD portion 107 are reset, and then, the gate portion of each of the second transmission transistor 103, the third transmission transistor 104, and the reset transistor 106 is turned off. Furthermore, the gate portion of the first transmission transistor 102B and the discharge transistor 201 is also closed.

In the fifth embodiment, for example, in a case where the first transmission transistor 102B applies the first voltage (for example, the negative voltage) to the gate portion, an impurity concentration of a channel region is set such that the overflow path is formed in the channel region under the gate electrode. In a case where high-intensity light is incident on the PD 101, and the charge generated by the incident light is greater than the saturated cumulative amount of the PD 101, the charge overflowed from the PD 101 is transmitted to the memory portion 105 through the overflow path.

Furthermore, as with the first transmission transistor 102B, the discharge transistor 201 also includes the overflow path in the channel region under the gate electrode. Further, as illustrated in FIG. 22, the discharge transistor 201 is ternary-driven.

That is, the impurity concentration of the channel region is set such that in a case where the first voltage (for example, the negative voltage) is applied to the gate portion of the discharge transistor 201, the potential of the overflow path of the discharge transistor 201 becomes shallower than the potential of the overflow path of the first transmission transistor 102B, and in a case where a second voltage (for example, a ground voltage) is applied to the gate portion of the discharge transistor 201, the potential of the overflow path of the discharge transistor 201 becomes deeper than the potential of the overflow path of the first transmission transistor 102B. Further, in a case where a third voltage (for example, a VDD power source voltage) is applied to the gate portion of the discharge transistor 201, the discharge transistor 201 is turned on.

Then, when the reset operation is performed, and then, the gate portion of the first transmission transistor 102B and the discharge transistor 201 is closed, the gate portion is closed such that the potential of the channel under the gate electrode becomes deeper in the discharge transistor 201 than in the first transmission transistor 102B. For this reason, the second voltage (for example, the ground voltage) is applied to the gate portion of the discharge transistor 201.

According to such operations, the first transmission transistor 102B and the discharge transistor 201 are closed to include the overflow path in the channel region, the second transmission transistor 103, the third transmission transistor 104, and the reset transistor 106 are also closed, and the first transmission transistor 102B and the discharge transistor 201 are closed such that the potential of the channel becomes deeper than that in the second transmission transistor 103.

From such a time point (a time t104), the accumulation period in which the charge generated as a result of the photoelectric conversion of the PD 101 is accumulated in the PD 101, is started. In FIG. 22, a timing when the accumulation of the charge generated as a result of the photoelectric conversion is started, is the time t104, and will be suitably described as Tstart. At a time point when the accumulation operation is started, the amount of received light in the period of the accumulation operation is still 0, and thus, in FIG. 23, the timing of Tstart corresponds to the original point of the graph.

During the period in which the charge generated as a result of the photoelectric conversion is accumulated, the driving signal is applied to the gate electrode of the discharge transistor 201 such that two periods of:

a first period T11 in which the potential of the channel of the discharge transistor 201 is in a state of being deeper than the potential of the channel of the first transmission transistor 102B (in FIG. 22, for example, a period from the time t104 to a time t105); and a second period T12 in which the potential of the channel of the discharge transistor 201 is in a state of being shallower than the potential of the channel of the first transmission transistor 102B (in FIG. 22, for example, a period from the time t105 to a time t106) are alternately repeated.

Until the amount of charge generated as a result of the photoelectric conversion during the accumulation period reaches the saturated cumulative amount of the PD 101, the generated charge is accumulated in the PD 101. In FIG. 22, a timing when the amount of charge generated as a result of the photoelectric conversion during the accumulation period reaches the saturated cumulative amount of the PD 101, is described as Tsat.

In addition, in FIG. 23, the amount of light in which the amount of charge generated as a result of the photoelectric conversion during the accumulation period reaches the saturated cumulative amount of the PD 101, is described as Lsat.

PD 101 receives the amount of light of the amount Lsat of light until the time Tsat, and the charge accumulated in the PD 101 reaches the saturated charge amount of the PD 101 by the charge generated as a result of the photoelectric conversion. Until the amount of light received by the PD 101 reaches the amount Lsat of light, the charge generated in proportion to the amount of received light is accumulated in the PD 101. At this time, the charge is not accumulated in the memory portion 105.

In a case where the amount of charge generated as a result of the photoelectric conversion during the accumulation period is greater than the saturated cumulative amount of the PD 101, the charge generated over the saturated cumulative amount:

is discharged to an overflow drain ahead the discharge transistor 201 (for example, the power source VDD) through the overflow path of the discharge transistor 201, in the first period in which the potential of the channel of the discharge transistor 201 becomes deeper than the potential of the channel of the first transmission transistor 102B; and is accumulated in the memory portion 105 through the overflow path of the first transmission transistor 102B, in the second period in which the potential of the channel of the discharge transistor 201 becomes shallower than the potential of the channel of the first transmission transistor 102B.

According to such operations, a part of the charge generated over the saturated cumulative amount of the PD 101 during the accumulation period described above, is accumulated in the memory portion 105, at a constant ratio which is a ratio of the first period T11 and the second period T12 described above.

In FIG. 23, in a case where the accumulation period is longer than the time Tsat in the PD 101, and the amount of received light during the accumulation period is greater than the amount Lsat of light, the PD 101 reaches the saturated charge amount, and thus, after that, the charge amount accumulated in the PD 101 becomes constant while maintaining the saturated charge amount.

On the other hand, in a case where the accumulation period is longer than the time Tsat in the PD 101, and the amount of received light in the accumulation period is greater than the amount Lsat of light, the charge generated over the saturated cumulative amount of the PD 101 is discharged to the overflow drain in the first period T11, and is accumulated in the memory portion 105 in the second period T12. As a result of such an operation, in a period in which the accumulation period is longer than the time Tsat, and the amount of received light in the accumulation period is greater than the amount Lsat of light, an amount corresponding to a ratio of T12/(T11+T12) in the total amount of the charges generated in the period is accumulated in the first memory portion 105.

For this reason, in an inclination in the graph of FIG. 23 illustrating the amount of accumulated charge with respect to the amount of received light, an inclination in the graph while the charge is accumulated in the memory portion 105 after the amount of received light reaches the amount Lsat of light, is smaller than an inclination in the graph while the charge is accumulated in the PD 101 before the amount of received light reaches the amount Lsat of light, and the latter inclination in the graph is suppressed to be T12/(T11+T12) times the former inclination in the graph.

The level of the discharge transistor 201 is fixed to the second voltage before a desired accumulation period is ended (a time point before a time t108). Furthermore, the gate portion of the reset transistor 106 is turned on at the time t108, and the FD portion 107 is reset again.

The FD portion 107 is reset, and then, the gate portion of the reset transistor 106 is turned off at a time t109. The gate portion of the reset transistor 106 is turned off, and then, the voltage of the FD portion 107 at this time point is read out to the vertical signal line 17 through the amplification transistor 108 and the selection transistor 109, as the last high-sensitivity reset signal NH of reading out the charge accumulated in the PD 101.

The high-sensitivity reset signal NH is read out, and then, the gate portion of the second transmission transistor 103 is turned on at a time t110. With this arrangement, the accumulation period in which the charge generated by the PD 101 is accumulated, is ended, and the charge accumulated in the PD 101 in the past is transmitted to the FD portion 107. In FIG. 22, a timing when the accumulation of the charge is ended, is set as the time t110, and will be suitably described as a time Tend.

As described above, as a result of performing the transmission, a voltage of a state in which a voltage change occurring due to the charge transmitted from the PD 101 to the FD portion 107 is added to a reset level of the FD portion 107 is read out to the vertical signal line 17 through the amplification transistor 108 and the selection transistor 109, as the high-sensitivity data signal SH.

The high-sensitivity data signal SH is read out, and then, the gate portion of the reset transistor 106 is turned on at a time t112, and the FD portion 107 is reset again.

The FD portion 107 is reset, and then, the gate portion of the reset transistor 106 is turned off at a time t113. The gate portion of the reset transistor 106 is turned off, and then, the voltage of the FD portion 107 at this time point is read out to the vertical signal line 17 through the amplification transistor 108 and the selection transistor 109, as the last low-sensitivity reset signal NL of reading out the charge accumulated in the memory portion 105.

The low-sensitivity reset signal NL is read out, and then, the gate portion of the third transmission transistor 104 is turned on at a time t114. With this arrangement, the charge accumulated in the memory portion 105 is transmitted to the FD portion 107.

As described above, as a result of performing the transmission, a voltage of a state in which a voltage change occurring due to the charge transmitted from the memory portion 105 to the FD portion 107 is added to the reset level of the FD portion 107 is read out to the vertical signal line 17 through the amplification transistor 108 and the selection transistor 109, as the low-sensitivity data signal SL.

A difference between the high-sensitivity data signal SH and the high-sensitivity reset signal NH is calculated, and thus, a signal amount SH-NH is obtained by the charge accumulated in the PD 101 during the accumulation period. Furthermore, a difference between the low-sensitivity data signal SL and the low-sensitivity reset signal NL is calculated, and thus, a signal amount SL-NL is obtained by the charge amount accumulated in the memory portion 105 during the accumulation period.

The signal amount SL-NL obtained by the charge amount accumulated in the memory portion 105 during the accumulation period, and the gain which is an inverse number of a ratio of the second period to the accumulation period, in other words, a ratio of T12/(T11+T12) in the sensitivity during the accumulation period, are multiplied together, and is added to a signal amount SH-NH obtained by the charge accumulated in the PD 101 during the accumulation period, and thus, a signal amount corresponding to the charge amount generated as a result of the photoelectric conversion during the accumulation period (a thick broken line in FIG. 23) is obtained.

A function effect obtained by the fifth embodiment will be described with reference to FIG. 23. In a comparison between:

(A) a period in which the charge is accumulated in the PD 101 before the amount of received light reaches the amount Lsat of light; and (B) a period in which charge is accumulated in the memory portion 105 after the amount of received light reaches the amount Lsat of light, a charge amount accumulated when the PD 101 receives the unit amount of light, is suppressed to be smaller in the period of (B) than in the period of (A). In other words, the sensitivity of the pixel is suppressed to be smaller in the period of (B) than in the period of (A).

With this arrangement, during the period of (B), it is possible to accumulate the charge generated with respect to the amount of light in a wider range at smaller capacity of the charge accumulation unit, with gradation properties, compared to the period of (A).

As a result thereof, in an imaging apparatus to which the fifth embodiment is applied, an image obtained by multiplying the charge accumulated in the period of (B) and the gain which is the inverse number of the ratio of the sensitivities between the period of (A) and the period of (B) together, and then, by adding pixel data captured in the period of (A) thereto, has a wide dynamic range, compared to an image obtained by an imaging apparatus of the related art, which does not include the memory portion 105, and a mechanism intermittently transmitting the charge to the memory portion 105. With this arrangement, the imaging apparatus of the fifth embodiment has a function effect of enabling an image having a wide dynamic range to be captured.

Sixth Embodiment

Next, a sixth embodiment will be described. In the first embodiment to the fifth embodiment, a case where there is a path in which the charge from the PD 101 is transmitted to the FD portion 107 through the memory portion 105, and a path in which the charge is directly transmitted from the PD 101 to the FD portion 107, has been described as an example. The path in which the charge is directly transmitted from the PD 101 to the FD portion 107 can be used, and the path in which the charge is indirectly transmitted to the FD portion 107 through the memory portion can also be used.

Figure 24:
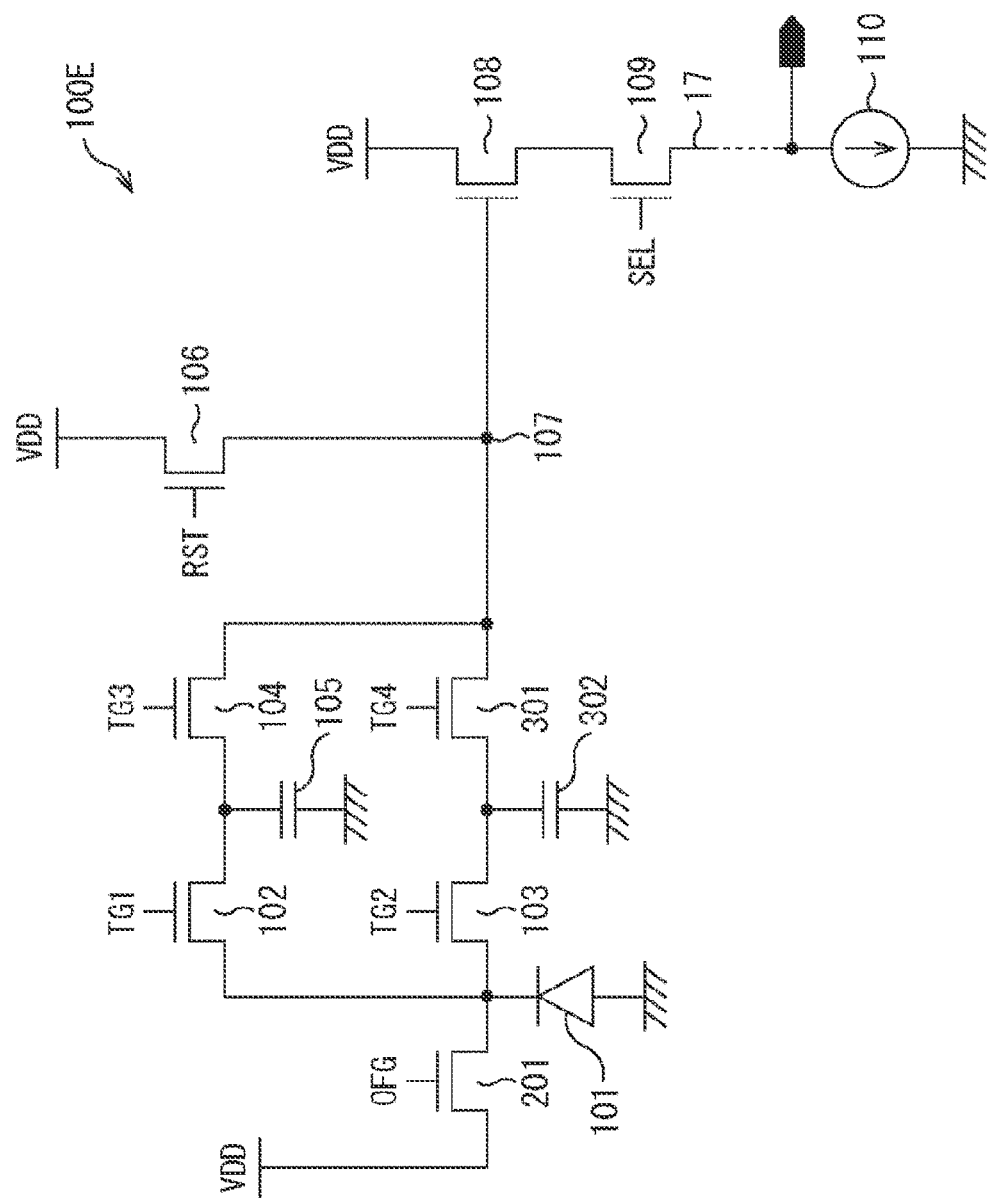
FIG. 24 is a circuit diagram illustrating a configuration example of a unit pixel in a sixth embodiment.

FIG. 24 is a circuit diagram of the unit pixel 100 in the sixth embodiment (hereinafter, in the sixth embodiment, referred to as a unit pixel 100E). In a comparison between the unit pixel 100E in the sixth embodiment illustrated in FIG. 24 and the unit pixel 100D in the fourth embodiment illustrated in FIG. 19, the unit pixel 100E is different from the unit pixel 100D in that a fourth transmission transistor 301 and a memory portion 302 are added to the unit pixel 100D, and the other portions are identical to those of the unit pixel 100D.

In the unit pixel 100E in the sixth embodiment, the charge from the PD 101 is retained in the memory portion 105 once through the first transmission transistor 102, and then, is transmitted to the FD portion 107 through the third transmission transistor 104. Furthermore, in the unit pixel 100E in the sixth embodiment, the charge from the PD 101 is retained in the memory portion 302 once through the second transmission transistor 103, and then, is transmitted to the FD portion 107 through the fourth transmission transistor 301.

In FIG. 24, a configuration including the discharge transistor 201 is illustrated, but a configuration not including the discharge transistor 201, for example, a configuration in which the fourth transmission transistor 301 and the memory portion 302 are added to the unit pixel 100A in the first embodiment illustrated in FIG. 4, may be used.

Furthermore, as with the second embodiment, in the unit pixel 100E in the sixth embodiment, the first transmission transistor 102 may be disposed onto the upper portion of the memory portion 105. Similarly, the second transmission transistor 103 may be disposed onto the upper portion of the memory portion 302.

Furthermore, as with the third embodiment, in the unit pixel 100E in the sixth embodiment, the first transmission transistor 102 may be divided into two transmission transistors, and one transmission transistor may be disposed on the upper portion of the memory portion 105. Similarly, the second transmission transistor 103 may be divided into two transmission transistors, and one transmission transistor may be disposed on the upper portion of the memory portion 302.

The operation of the unit pixel 100E will be described with reference to FIG. 25. A basic operation is similar to that of the unit pixel 100D of the fourth embodiment described with reference to FIG. 21, and is an operation in which the operation of the fourth transmission transistor 301 is added to the operation of the unit pixel 100D. Here, the operation of the fourth transmission transistor 301 will be described, and thus, the description of the operation similar to that of the unit pixel 100D of the fourth embodiment described with reference to FIG. 21 will be suitably omitted.

FIG. 25 illustrates a timing chart of the selection signal SEL of driving the selection transistor 109, the reset signal RST of driving the reset transistor 106, a transmission signal TG4 of driving the fourth transmission transistor 301, the transmission signal TG3 of driving the third transmission transistor 104, the transmission signal TG2 of driving the second transmission transistor 103, the transmission signal TG1 of driving the first transmission transistor 102, and the discharge signal OFG of driving the discharge transistor 201, of the unit pixel 100E in the sixth embodiment.

The reset signal RST is turned on in a period from a time t151 to a time t154, and the reset transistor 106 is in the turned-on state, and thus, the reset operation is performed. At this time, in a period from a time t152 to a time t153, the transmission signal TG4 and the transmission signal TG3 are turned on, and thus, the fourth transmission transistor 301 and the third transmission transistor 104 are turned on together. Furthermore, the discharge transistor 201 is also in the turned-on state.

The reset operation is performed, and thus, the PD 101, the memory portion 105, the memory portion 302, and the FD portion 107 are reset.

The reset operation is performed, and then, the process proceeds to the accumulation period. In the accumulation period from the time t154 to a time t159, the first transmission transistor 102 and the second transmission transistor 103 are alternately turned on, and thus, the signal charge accumulated in the PD 101 is alternately transmitted to the memory portion 105 and the memory portion 302.

Note that, as with the first embodiment or the like, a period in which the first transmission transistor 102 is turned on, can be set as the first period, and a period in which the second transmission transistor 103 is turned on, can be set as the second period.

Such operations are alternately repeated in the exposure period, and thus, in the signal charges subjected to the photoelectric conversion of the PD 101 in the exposure period, the signal charge generated within the period in which the first transmission transistor 102 is turned on (the first period) is transmitted to the memory portion 105, and is accumulated/retained in the memory portion 105. Furthermore, in the signal charges subjected to the photoelectric conversion of the PD 101 in the exposure period, the signal charge generated within the period in which the second transmission transistor 103 is turned on (the second period) is transmitted to the memory portion 302, and is accumulated/retained in the memory portion 302.

Here, as with the first embodiment or the like, the first period is longer than the second period. In other words, the period in which the signal charge is transmitted from the PD 101 to the memory portion 105, is a period longer than the period in which the signal charge is transmitted to the memory portion 302. Thus, in a case where the first period and the second period are set, the signal charge accumulated/retained in the memory portion 105 within the first period can be handled as the high-sensitivity data signal SH, and the signal charge accumulated/retained in the memory portion 302 within the second period can be handled as the low-sensitivity data signal SL.

In a case where the accumulation period is ended at the time t159, the process proceeds to the read-out period. A state is obtained in which the high-sensitivity data signal SH is retained in the memory portion 105 at the time t159, and the low-sensitivity data signal SL is retained in the memory portion 302.

The read-out may be performed in advance from the high-sensitivity data signal SH retained in the memory portion 105, and the read-out may be performed in advance from the low-sensitivity data signal SL retained in the memory portion 302, and here, it will be continuously described that the read-out may be performed in advance from the low-sensitivity data signal SL retained in the memory portion 302.

The selection signal SEL is turned on at the time t159, and thus, the selection transistor 109 is in the turned-on state. The reset signal RST is turned on in a period from a time t160 to a time t161, and thus, the reset transistor 106 is turned on, and the FD portion 107 is reset.

The FD portion 107 is reset, and then, the voltage of the FD portion 107 at the time point is read out to the vertical signal line 17 through the amplification transistor 108 and the selection transistor 109, as the last low-sensitivity reset signal NL of reading out the charge accumulated in the memory portion 302.

The low-sensitivity reset signal NL is read out, and then, a gate portion of the fourth transmission transistor 301 is turned on (a time t162). The gate portion of the fourth transmission transistor 301 is turned on, and thus, the charge accumulated in the memory portion 302 is transmitted to the FD portion 107.

As a result of performing such transmission, a voltage of a state in which a voltage change occurring due to the charge transmitted from the memory portion 302 to the FD portion 107 is added to the reset level of the FD portion 107, is read out to the vertical signal line 17 through the amplification transistor 108 and the selection transistor 109, as the low-sensitivity data signal SL.

After that, the reset signal RST is turned on in a period from a time t164 to a time t165, and thus, the reset transistor 106 is turned on, and the FD portion 107 is reset again.

The FD portion 107 is reset, and then, the voltage of the FD portion 107 at the time point is read out to the vertical signal line 17 through the amplification transistor 108 and the selection transistor 109, as the last high-sensitivity reset signal NH of reading out the charge accumulated in the memory portion 105.

The high-sensitivity reset signal NH is read out, and then, the transmission signal TG3 is turned on at the time t166, and thus, the gate portion of the third transmission transistor 104 is turned on. The gate portion of the third transmission transistor 104 is turned on, and thus, the charge accumulated in the memory portion 105 is transmitted to the FD portion 107.

As a result of performing such transmission, a voltage of a state in which the voltage change occurring due to the charge transmitted from the memory portion 105 to the FD portion 107 is added to the reset level of the FD portion 107 is read out to the vertical signal line 17 through the amplification transistor 108 and the selection transistor 109, as the high-sensitivity data signal SH.

A difference between the high-sensitivity data signal SH and the high-sensitivity reset signal NH is calculated, and thus, the signal amount SH-NH is obtained by the charge accumulated in the PD 101 during the accumulation period. Furthermore, a difference between the low-sensitivity data signal SL and the low-sensitivity reset signal NL is calculated, and thus, the signal amount SL-NL is obtained by the charge amount accumulated in the memory portion 105 during the accumulation period.

The signal amount SL-NL obtained by the charge amount accumulated in the memory portion 105 during the accumulation period, and a gain of correcting a ratio of the second period to the accumulation period, in other words, a ratio of T1/(T1+T1) in the sensitivities during the accumulation period are multiplied together, and are added to the signal amount SH-NH obtained by the charge accumulated in the PD 101 during the accumulation period, and thus, an amount of signal corresponding to the amount of charge generated as a result of the photoelectric conversion during the accumulation period is obtained. Note that, T1 and T2 are the time T1 and the time T2 described with reference to FIG. 9 or the like.

Thus, in the sixth embodiment, as with the first embodiment to the fifth embodiment, it is possible to acquire the low-sensitivity data signal SL and the high-sensitivity data signal SH, and to perform imaging in which a dynamic range expands.

In addition, in the sixth embodiment, a configuration can be used in which the signal charge is retained in each of the memory portion 105 and the memory portion 302, but not in the FD portion 107. In a comparison between a case where the signal is retained in the FD portion 107 and a case where the signal is retained in the memory portion 302, there is a tendency that a noise component increases in a case where the signal is retained in the FD portion 107. Thus, as with the sixth embodiment, the signal is retained in the memory portion 302 but not in the FD portion 107, and thus, it is possible to reduce the noise.

Furthermore, the signal is not retained in the FD portion 107, and thus, the configuration after the FD portion 107 can be shared with the other pixel. FIG. 26 illustrates an example of two-pixel sharing. In FIG. 26, a unit pixel 100E-1 and a unit pixel 100E-2 share the FD portion 107, the reset transistor 106, the amplification transistor 108, and the selection transistor 109 with each other.

Note that, in FIG. 26, the case of the two-pixel sharing is illustrated as an example, but the FD portion 107 or the like can be shared with two or more pixels.

Thus, the FD portion 107 or the like is shared with a plurality of pixels, and thus, it is possible to improve a layout efficiency, and to further reduce the size of the imaging apparatus.

<Description Relevant to Denoising Processing and Arithmetic Processing>

In the unit pixels 100A to 100E described above, the low-sensitivity data signal SL, the low-sensitivity reset signal NL, the high-sensitivity reset signal NH, and the high-sensitivity data signal SH are output to the vertical signal line 17. Then, in a signal processor of the latter part, for example, the column processor 13 or the signal processor 18 illustrated in FIGS. 1 to 3, predetermined denoising processing and predetermined signal processing are performed with respect to the low-sensitivity data signal SL, the low-sensitivity reset signal NL, the high-sensitivity reset signal NH, and the high-sensitivity data signal SH. Hereinafter, an example of the denoising processing in the column processor 13 of the latter part and the arithmetic processing in the signal processor 18 will be described.

{Denoising Processing}

Initially, the denoising processing of the column processor 13 will be described.

Processing Example 1 of Denoising Processing

First, Processing Example 1 of the denoising processing will be described.

First, the column processor 13 obtains a difference between the low-sensitivity data signal SL and the low-sensitivity reset signal NL, and thus, generates a low-sensitivity difference signal SNL. Accordingly, Low-Sensitivity Difference Signal SNL=Low-Sensitivity Data Signal SL−Low-Sensitivity Reset Signal NL is obtained.

Next, the column processor 13 obtains a difference between the high-sensitivity data signal SH and the high-sensitivity reset signal NH, and thus, generates high-sensitivity difference signal SNH. Accordingly, High-Sensitivity Difference Signal SNH=High-Sensitivity Data Signal SH−High-Sensitivity Reset Signal NH is obtained.

Thus, in Processing Example 1, DDS processing in which a pixel-specific fixed pattern noise such as a variation in the threshold value of the amplification transistor in the pixel is eliminated, but a reset noise is not eliminated, is performed with respect to the low-sensitivity signals SL and NL. CDS processing in which the reset noise, or the pixel-specific fixed pattern noise such as a variation in the threshold value of the amplification transistor in the pixel is eliminated, is performed with respect to the high-sensitivity signals SH and NH.

Furthermore, in Processing Example 1, the processing is arithmetic processing which is not necessary to use a frame memory, and thus, there is an advantage that a circuit configuration is simplified, and the cost is reduced.

Processing Example 2 of Denoising Processing

Next, Processing Example 2 of the denoising processing will be described.

In Processing Example 2, in order to use information of the previous frame, a storage unit, for example, a frame memory is required. Accordingly, arithmetic processing of Processing Example 2, for example, is performed by using the data storage unit 19 as the storage unit in the signal processor 18, or by using the frame memory in the external DSP circuit.

Specifically, first, the column processor 13 obtains a difference between the low-sensitivity data signal SL and a low-sensitivity reset signal NLA in the previous frame, and thus, generates the low-sensitivity difference signal SNL. Accordingly, Low-Sensitivity Difference Signal SNL=Low-Sensitivity Data Signal SL−Low-Sensitivity Reset Signal NLA is obtained.

Next, the column processor 13 obtains a difference between the high-sensitivity data signal SH and the high-sensitivity reset signal NH, and thus, generates the high-sensitivity difference signal SNH. Accordingly, High-Sensitivity Difference Signal SNH=High-Sensitivity Data Signal SH−High-Sensitivity Reset Signal NH is obtained.

Thus, in Processing Example 2, the CDS processing in which the reset noise, or the pixel-specific fixed pattern noise such as a variation in the threshold value of the amplification transistor in the pixel is eliminated, is performed with respect to the low-sensitivity signals SL and NL. With this arrangement, the storage unit such as the frame memory is required, but there is an advantage that the reset noise can be considerably suppressed, compared to Processing Example 1.

{Arithmetic Processing of Pixel Signal}

Next, the arithmetic processing of the pixel signal of the signal processor 18 (FIG. 1) in the first embodiment to the sixth embodiment described above will be described.

Processing Example 1 of Arithmetic Processing of Pixel Signal

First, Processing Example 1 of the arithmetic processing of the pixel signal will be described.

First, when the low-sensitivity difference signal SNL is within a predetermined range, the signal processor 18 calculates a ratio of the low-sensitivity difference signal SNL and the high-sensitivity difference signal SNH, as the gain, for each pixel, for each of a plurality of pixels, for each color, for each specific pixel in the shared pixel unit, or for all pixels uniformly, and generates a gain table. Then, the signal processor 18 calculates the product between the low-sensitivity difference signal SNL and the gain table as a correction value of the low-sensitivity difference signal SNL.

Here, in a case where the gain is set as G, the correction value of the low-sensitivity difference signal SNL (hereinafter, referred to as a corrected low-sensitivity difference signal) is set as SNL', the gain G and the corrected low-sensitivity difference signal SNL' can be obtained on the basis of Expressions (1) to (4) described above.

$$G = SNH/SNL = SENS\_H/SENS\_L \quad (1)$$

$$SENS\_H = T2/(T1+T2) \quad (2)$$

$$SENS\_L = T1/(T1+T2) \quad (3)$$

$$SNL' = G \times SNL \quad (4)$$

T1 and T2 are the time T1 and the time T2 described with reference to FIG. 9, and correspond to a time when the first transmission transistor 102 or the second transmission transistor 103 is turned on. The gain G is equalized with a sensitivity ratio.

FIG. 27 illustrates a relationship in the low-sensitivity difference signal SNL, the high-sensitivity difference signal SNH, and the corrected low-sensitivity difference signal SNL', with respect to the amount of incident light.

Figure 28A:
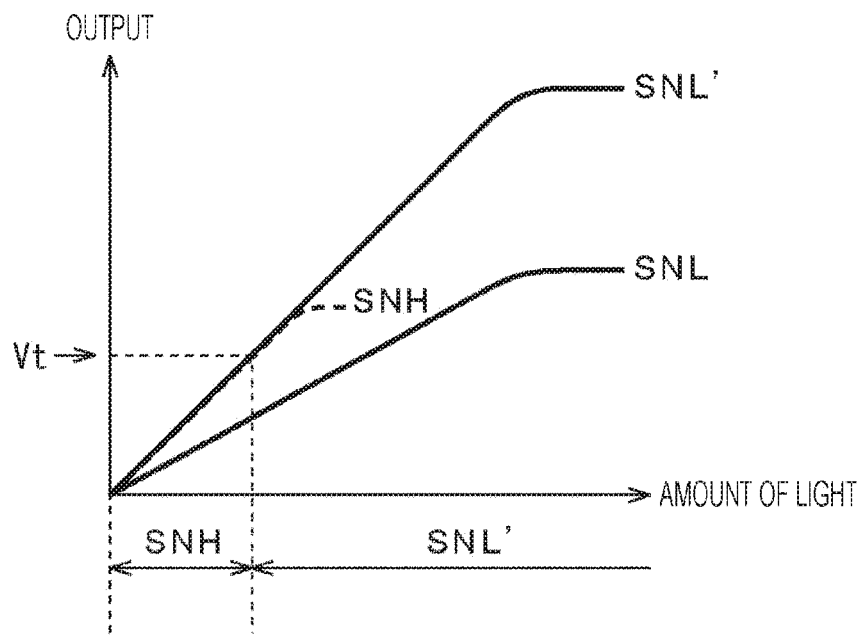
FIGS. 28A and 28B are (second) characteristic diagrams of the amount of incident light-output provided for describing the signal processing.

Next, as illustrated in FIG. 28A a predetermined threshold value Vt set in advance is used in the signal processor 18. In optical response characteristics, the threshold value Vt is set in advance in a range where the high-sensitivity difference signal SNH is not saturated yet and the optical response characteristics are linear.

Then, in a case where the high-sensitivity difference signal SNH is not greater than the predetermined threshold value Vt, the signal processor 18 outputs the high-sensitivity difference signal SNH as a pixel signal SN of the current pixel. In other words, in the case of SNH<Vt, Pixel Signal SN=High-Sensitivity Difference Signal SNH is obtained.

On the other hand, in a case where the high-sensitivity difference signal SNH is greater than the predetermined threshold value Vt, the signal processor 18 outputs the corrected low-sensitivity difference signal SNL' of the low-sensitivity difference signal SNL as the pixel signal SN of the current pixel. In other words, in the case of Vt SNH, Pixel Signal SN=Corrected Low-Sensitivity Difference Signal SNL' is obtained.

Processing Example 2 of Arithmetic Processing of Pixel Signal

Next, Processing Example 2 of the arithmetic processing of the pixel signal will be described.

Figure 28B:
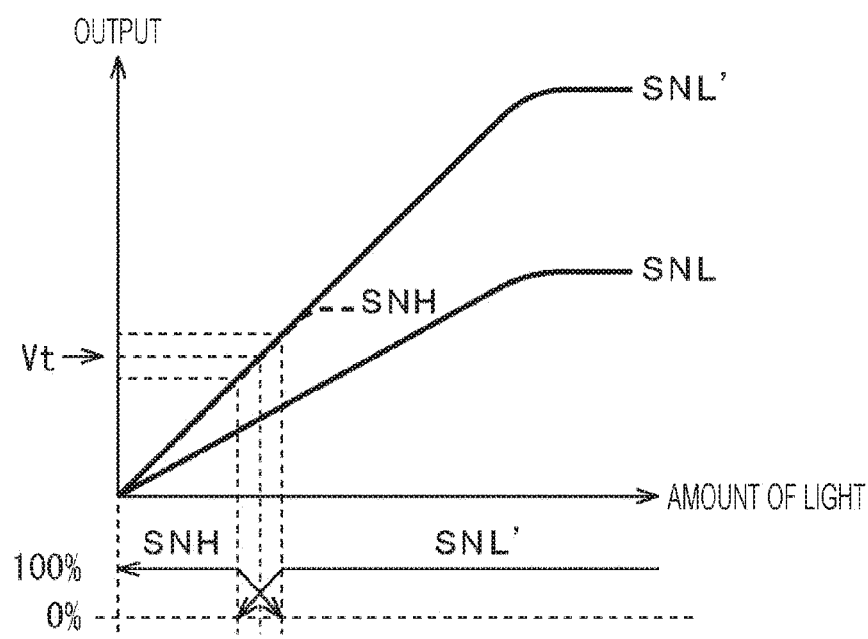

Specifically, as illustrated in FIG. 28B, in a case where high-sensitivity difference signal SNH is within a predetermined range, the signal processor 18 synthesizes the corrected low-sensitivity difference signal SNL' and the high-sensitivity difference signal SNH at a ratio set in advance, and outputs the synthesized signal as the pixel signal SN.

For example, as described below, the signal processor 18 gradually changes a synthesis ratio of the corrected low-sensitivity difference signal SNL' and the high-sensitivity difference signal SNH, in a range before and after the predetermined threshold value Vt. In the optical response characteristics, the predetermined threshold value Vt, as described above, is a value set in advance in a region where high-sensitivity difference signal SNH is not saturated yet, and the optical response characteristics are linear.

In the case of SNH<Vt×0.90, SN=SNH,
in the case of Vt×0.90 SNH<Vt×0.94, SN=0.9×SNH+0.1×SNL',
in the case of Vt×0.94 SNH<Vt×0.98, SN=0.7×SNH+0.3×SNL',
in the case of Vt×0.98 SNH<Vt×1.02, SN=0.5×SNH+0.5×SNL',
in the case of Vt×1.02 SNH<Vt×1.06, SN=0.3×SNH+0.7×SNL',
in the case of Vt×1.06 SNH<Vt×1.10, SN=0.1×SNH+0.9×SNL', and
in the case of Vt×1.10 SNH, SN=SNL'.

By performing the arithmetic processing as described above, it is possible to more smoothly switch a signal at the time of low illuminance into a signal at the time of high illuminance.

Furthermore, in the CMOS image sensors 10, 10A, and 10B, it is possible to draw up the level at which the low-sensitivity data signal SL is saturated. With this arrangement, it is possible to increase the maximum value of the dynamic range, while retaining the minimum value of the dynamic range, and to expand the dynamic range.

For example, in an in-vehicle image sensor, there is a case where a phenomenon called LED flicker that a blinking subject such as an LED light source is not capable of being imaged according to a blinking timing, occurs. The LED flicker, for example, occurs since the dynamic range of the image sensor of the related art is low, and it is necessary to adjust the exposure time for each subject.

In other words, in order to correspond to subjects of various illuminances, the image sensor of the related art sets the exposure time to be long with respect to a subject of low illuminance, and the exposure time to be short with respect to a subject of high illuminance. With this arrangement, in a low dynamic range, it is possible to correspond to the subjects of the various illuminances. On the other hand, in a case where the exposure time is set to be unit shorter than a read-out time in order to make a read-out speed constant regardless of the exposure time, light incident on the photoelectric converter other than the exposure time is subjected to the photoelectric conversion, and becomes a charge, and thus, is cancelled without being read out.

On the other hand, in the CMOS image sensors 10, 10A, and 10B, as described above, it is possible to expand the dynamic range, and to set the exposure time to be long, and thus, it is possible to suppress the occurrence of the LED flicker.

Furthermore, in the CMOS image sensors 10, 10A, and 10B, as described above, it is possible to prevent the occurrence of an artifact or a decrease in a definition, which occurs in a case where the number of divisions increases by a time-division manner or a space-division manner.

Modification Example

In the above description, the case of the same configuration as the configuration in which two photoelectric converters having different sensitivities are provided in one pixel, has been described as an example, but the same configuration as the configuration in which three or more photoelectric converters are provided in one pixel, can also be used.

Furthermore, in the embodiments described above, the case of being applied to the CMOS image sensor in which the unit pixels are arranged into the shape of a matrix, has been described as an example, but the present technology is not limited to the case of being applied to the CMOS image sensor. In other words, the present technology can be applied to the general imaging apparatus of an X-Y addressing scheme in which the unit pixels are two-dimensionally arranged into the shape of a matrix.

Moreover, the present technology is not limited to the case of being applied to an imaging apparatus configured to detect a distribution of the amount of incident light of visible light, and to image the distribution, as an image, but can also be applied to the general imaging apparatus configured to image a distribution of an incidence amount of an infrared ray or an X-ray, particles, or the like, as an image.

Note that, the imaging apparatus may be formed as a single chip, or may be formed as a module having an imaging function in which an imaging unit and a signal processor or an optical system are collectively packaged.

<Usage Example of Imaging Apparatus>

FIG. 29 is a diagram illustrating a usage example of the imaging apparatus described above.

As described below, the imaging apparatus described above, for example, can be used for various cases of sensing visible light, infrared light, ultraviolet light, an X-ray, or the like.

A device capturing an image provided for viewing, such as a digital camera or a mobile device with a camera function A device provided for traffic, such as an in-vehicle sensor capturing the front, the rear, the around, the inside, and the like of an automobile, a monitoring camera monitoring a running vehicle or a road, and a distance measurement sensor measuring a distance between vehicles, for example, in order for safe driving such as automatic stop, recognition of the state of a driver, or the like A device provided for a home electrical appliance such as a TV, a refrigerator, and an air conditioner, in order for capturing the gesture of a user and for performing a device manipulation according to the gesture A device provided for medical and healthcare purpose, such as an endoscope, or a device for angiography by receiving infrared light A device provided for security, such as a monitoring camera for crime-prevention or a camera for personal identification A device provided for beauty care, such as a skin measurement device capturing the skin, or a microscope capturing the scalp A device provided for sport, such as an action camera or a wearable camera for sporting use or the like A device provided for agriculture, such as a camera for monitoring the state of the field or the crop {Imaging Apparatus}

Figure 30:
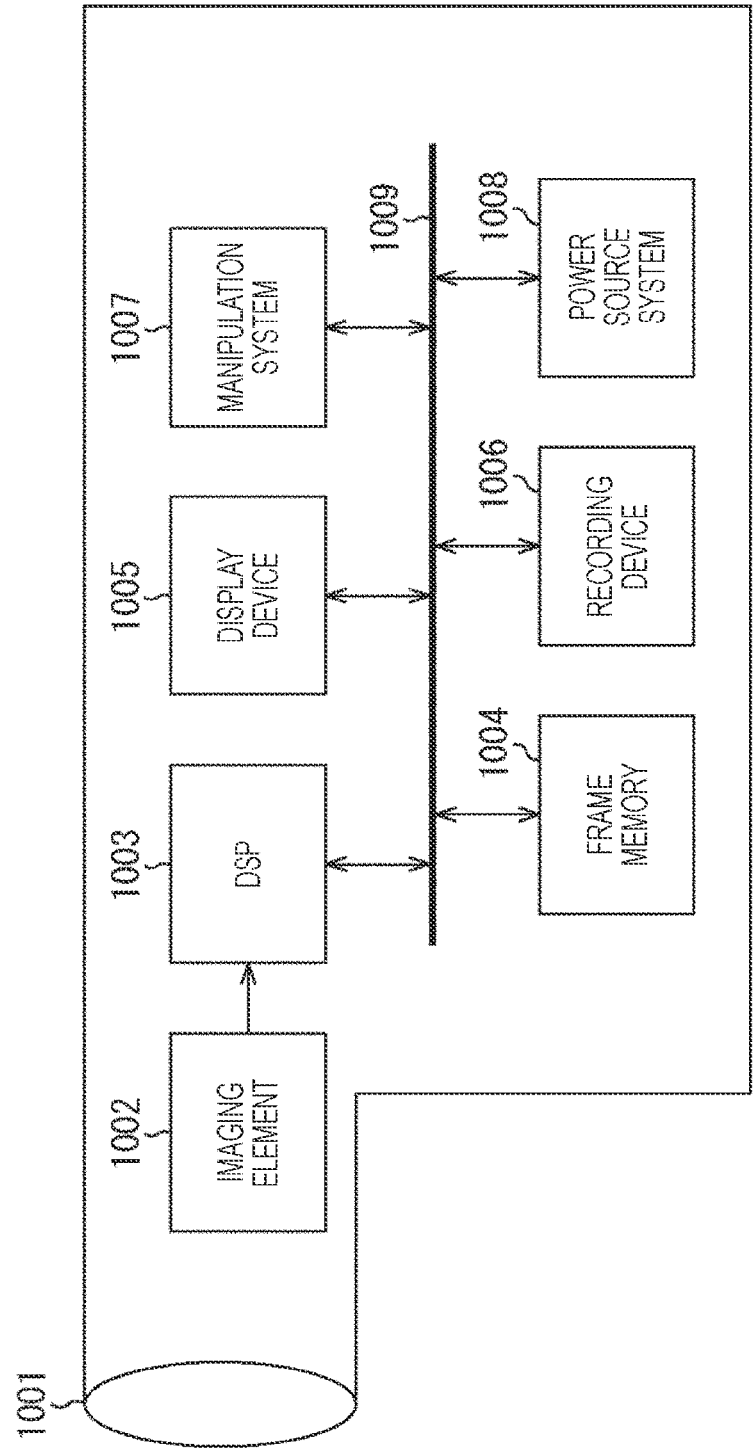
FIG. 30 is a block diagram illustrating a configuration example of an electronic device.

FIG. 30 is a block diagram illustrating a configuration example of an imaging apparatus (a camera device) 1000, which is an example of an electronic device to which the present technology is applied.

As illustrated in FIG. 30, the imaging apparatus 1000 includes an optical system including a lens group 1001 or the like, an imaging element 1002, a DSP circuit 1003 which is a camera signal processor, a frame memory 1004, a display device 1005, a recording device 1006, a manipulation system 1007, a power source system 1008, and the like. Then, the DSP circuit 1003, the frame memory 1004, the display device 1005, the recording device 1006, the manipulation system 1007, and the power source system 1008 are connected to each other through a bus line 1009.

The lens group 1001 captures incident light (image light) from the subject, and forms an image on an imaging surface of the imaging element 1002. The imaging element 1002 converts the amount of incident light subjected to image formation on the imaging surface by the lens group 1001 into an electric signal in the pixel unit, and outputs the electric signal as the pixel signal.

The display device 1005 includes a panel type display device such as a liquid crystal display device or an organic electroluminescence (EL) display device, and displays a moving image or a still image imaged by the imaging element 1002. The recording device 1006 records the moving image or the still image imaged by the imaging element 1002 in a recording medium such as a memory card, a video tape, or a digital versatile disk (DVD).

The manipulation system 1007 outputs a manipulation command with respect to various functions of this imaging apparatus 1000, under the manipulation of the user. The power source system 1008 suitably supplies various power sources, which are an operation power source of the DSP circuit 1003, the frame memory 1004, the display device 1005, the recording device 1006, and the manipulation system 1007, to a supply target.

Such an imaging apparatus 1000 is applied to a camera module for a mobile device, such as a video camera or a digital still camera, a smart phone, and a mobile phone. Then, in the imaging apparatus 1000, the imaging apparatus according to each of the embodiments described above can be used as the imaging element 1002. With this arrangement, it is possible to improve image quality of the imaging apparatus 1000.

Note that, the embodiments of the present technology are not limited to the embodiments described above, and various modifications can be performed within a range not departing from the gist of the present technology. For example, the respective embodiments described above can be combined within an allowable range.

Furthermore, herein, the system indicates the entire device configured of a plurality of devices.

Note that, herein, the effects are merely an example, the effects of the present technology are not limited thereto, and other effects may be obtained.

Note that, the embodiments of the present technology are not limited to the embodiments described above, and various modifications can be performed within a range not departing from the gist of the present technology.

Note that, the present technology is also capable of having the following configured.

(1)

An imaging apparatus including:

a pixel array portion, a plurality of unit pixels being arranged in the pixel array portion; and a driving unit configured to control an operation of the unit pixel, in which the unit pixel includes a photoelectric converter, a charge retention unit configured to retain a charge, a charge-voltage converter configured to convert the charge into a voltage, a first transmitting unit configured to transmit the charge from the photoelectric converter to the charge retention unit, a second transmitting unit configured to transmit the charge from the photoelectric converter to the charge-voltage converter, and a third transmitting unit configured to transmit the charge from the charge retention unit to the charge-voltage converter.

(2) The imaging apparatus according to (1),
in which the first transmitting unit is also formed on the charge retention unit.

(3) The imaging apparatus according to (1),
in which when the first transmitting unit is turned on, the first transmitting unit is formed in a position in which a potential of the charge retention unit becomes deep.

(4) The imaging apparatus according to any of (1) to (3),
in which the first transmitting unit includes a first division transmitting unit and a second division transmitting unit,
the first division transmitting unit is formed between the photoelectric converter and the charge retention unit, and
the second division transmitting unit is formed on the charge retention unit.

(5) The imaging apparatus according to any of (1) to (4), further including
a charge discharge unit connected to the photoelectric converter.

(6) The imaging apparatus according to any of (1) to (5), further including:
a second charge retention unit; and
a fourth transmitting unit,
in which the second transmitting unit transmits the charge from the photoelectric converter to the second charge retention unit, and
the fourth transmitting unit transmits the charge from the second charge retention unit to the charge-voltage converter.

(7) The imaging apparatus according to any of (1) to (6),
in which in an exposure period,
the transmission of the charge from the photoelectric converter to the charge retention unit and the transmission of the charge from the photoelectric converter to the charge-voltage converter are alternately performed.

(8) The imaging apparatus according to any of (1) to (7),
in which in an exposure period,
the first transmitting unit and the second transmitting unit are alternately in a turned-on state.

(9) The imaging apparatus according to (8),
in which a first period in which the first transmitting unit is turned on is longer than a second period in which the second transmitting unit is turned on.

(10) The imaging apparatus according to (8),
in which in a case where a time period from a time point at which the second transmitting unit goes into a turned-off state from a turned-on state to a time point at which the first transmitting unit goes into the turned-off state from the turned-on state is set as a first period, and a time period from the time point at which the first transmitting unit goes into the turned-off state from the turned-on state to the time point at which the second transmitting unit goes into the turned-off state from the turned-on state is set as a second period, the first period is longer than the second period.

(11) The imaging apparatus according to any of (1) to (10),
in which after a signal corresponding to the charge transmitted to the charge-voltage converter is read out when the second transmitting unit is in the turned-on state, the third transmitting unit is turned on,
the charge is transmitted from the charge retention unit to the charge-voltage converter, and
the signal corresponding to the charge transmitted to the charge-voltage converter is read out.

(12) The imaging apparatus according to (4),
in which the first division transmitting unit and the second division transmitting unit are simultaneously turned on, and
the second division transmitting unit is turned off after the first division transmitting unit is turned off.

(13) The imaging apparatus according to (12),
in which the second transmitting unit is turned on after the first division transmitting unit is turned off,
the second division transmitting unit is turned off after the second transmitting unit is turned on, and
the second transmitting unit is turned off after the second division transmitting unit is turned off.

(14) The imaging apparatus according to (5),
in which the charge discharge unit is turned on in a period other than the exposure period.

(15) The imaging apparatus according to (5), further including:
a first overflow path formed in a lower portion of a gate electrode of the first transmitting unit, the first overflow path transmitting a charge leaked from the photoelectric converter to the charge retention unit; and
a second overflow path formed in a lower portion of a gate electrode of the charge discharge unit, the second overflow path discharging the charge leaked from the photoelectric converter.

(16) The imaging apparatus according to (15),
in which the charge discharge unit is ternary-driven,
in a case where a first voltage is applied, a potential of the second overflow path becomes shallower than a potential of the first overflow path,
in a case where a second voltage is applied, the potential of the second overflow path becomes deeper than the potential of the first overflow path, and
in a case where a third voltage is applied, the charge discharge unit is in a turned-on state.

(17) The imaging apparatus according to (6),
in which the fourth transmitting unit is turned on after an accumulation period is ended,
the charge is transmitted from the second charge retention unit to the charge-voltage converter,
a signal corresponding to the charge transmitted to the charge-voltage converter is read out,
the third transmitting unit is turned on,
the charge is transmitted from the charge retention unit to the charge-voltage converter, and
a signal corresponding to the charge transmitted to the charge-voltage converter is read out.

(18) A driving method performed by an imaging apparatus including
a pixel array portion, a plurality of unit pixels being arranged in the pixel array portion, and
a driving unit configured to control an operation of the unit pixel, the unit pixel including
a photoelectric converter,
a charge retention unit configured to retain a charge,
a charge-voltage converter configured to convert the charge into a voltage,
a first transmitting unit configured to transmit the charge from the photoelectric converter to the charge retention unit,
a second transmitting unit configured to transmit the charge from the photoelectric converter to the charge-voltage converter, and
a third transmitting unit configured to transmit the charge from the charge retention unit to the charge-voltage converter, the driving method including
alternately performing the transmission of the charge from the photoelectric converter to the charge retention unit and the transmission of the charge from the photoelectric converter to the charge-voltage converter by alternately turning on the first transmitting unit and the second transmitting unit in an exposure period.

(19)

An electronic device including
an imaging apparatus including
a pixel array portion, a plurality of unit pixels being arranged in the pixel array portion, and
a driving unit configured to control an operation of the unit pixel,
in which the unit pixel includes
a photoelectric converter,
a charge retention unit configured to retain a charge,
a charge-voltage converter configured to convert the charge into a voltage,
a first transmitting unit configured to transmit the charge from the photoelectric converter to the charge retention unit,
a second transmitting unit configured to transmit the charge from the photoelectric converter to the charge-voltage converter, and
a third transmitting unit configured to transmit the charge from the charge retention unit to the charge-voltage converter.

REFERENCE SIGNS LIST 10, 10A, 10B CMOS image sensor
11 Pixel array portion
12 Vertical driving unit
13 Column processor
14 Horizontal driving unit
15 System control unit
16 Pixel driving line
17 Vertical signal line
18 Signal processor
19 Data storage unit
100A to 100E Unit pixel
101 PD
102 First transmission transistor
103 Second transmission transistor
104 Third transmission transistor
105 Memory portion
106 Reset transistor
107 FD portion
108 Amplification transistor
109 Selection transistor
201 Discharge transistor
301 Fourth transmission transistor
302 Memory portion

The invention claimed is:

1. An imaging apparatus, comprising:
a pixel array portion;
a plurality of unit pixels in the pixel array portion;
circuitry configured to control an operation of each unit pixel of the plurality of unit pixels,
wherein each unit pixel of the plurality of unit pixels includes:
a photoelectric converter,
a discharge transistor connected to the photoelectric converter,
a first memory configured to retain a first charge,
a charge-voltage converter configured to convert the first charge into a voltage,
a first transmission transistor configured to transmit the first charge from the photoelectric converter to the first memory,
a second transmission transistor configured to transmit a second charge from the photoelectric converter to the charge-voltage converter, and
a third transmission transistor configured to transmit the first charge from the first memory to the charge-voltage converter;
a first overflow path in a lower portion of a gate electrode of the first transmission transistor,
wherein the first overflow path is configured to transmit a third charge leaked from the photoelectric converter to the first memory; and
a second overflow path in a lower portion of a gate electrode of the discharge transistor,
wherein the second overflow path is configured to discharge the third charge leaked from the photoelectric converter.

2. The imaging apparatus according to claim 1, wherein the first transmission transistor is on the first memory.

3. The imaging apparatus according to claim 1, wherein the first transmission transistor is a position in which a potential of the first memory is deep based on turn on of the first transmission transistor.

4. The imaging apparatus according to claim 1, wherein the first transmission transistor includes a fourth transmission transistor unit and a fifth transmission transistor,
the fourth transmission transistor is between the photoelectric converter and the first memory, and
the fifth transmission transistor is on the first memory.

5. The imaging apparatus according to claim 4, wherein the fourth transmission transistor and the fifth transmission transistor are configured to be simultaneously turned on, and
the fifth transmission transistor is further configured to be turned off after turn off of the fourth transmission transistor.

6. The imaging apparatus according to claim 5, wherein the second transmission transistor is further configured to be turned on after the turn off of the fourth transmission transistor,
the fifth transmission transistor is further configured to be turned off after the turn on of the second transmission transistor, and
the second transmission transistor is further configured to be turned off after the turn off of the fifth transmission transistor.

7. The imaging apparatus according to claim 1, further comprising:
a second memory; and
a fourth transmission transistor, wherein
the second transmission transistor is further configured to transmit the second charge from the photoelectric converter to the second memory, and
the fourth transmission transistor is configured to transmit the second charge from the second memory to the charge-voltage converter.

8. The imaging apparatus according to claim 7, wherein
the fourth transmission transistor is further configured to be turned on based on an end of an accumulation period,
the second charge is transmitted from the second memory to the charge-voltage converter based on the turn on of the fourth transmission transistor,
the circuitry is further configured to read out a first signal corresponding to the second charge transmitted to the charge-voltage converter,
the third transmission transistor is further configured to be turned on based on the read out of the first signal,
the first charge is transmitted from the first memory to the charge-voltage converter based on the turn on of the third transmission transistor, and
the circuitry is further configured to read out a second signal corresponding to the first charge transmitted to the charge-voltage converter.

9. The imaging apparatus according to claim 1, wherein in an exposure period, the transmission of the first charge from the photoelectric converter to the first memory and the transmission of the second charge from the photoelectric converter to the charge-voltage converter are alternately performed.

10. The imaging apparatus according to claim 1, wherein in an exposure period, the first transmission transistor and the second transmission transistor are alternately in a turned-on state.

11. The imaging apparatus according to claim 10, wherein a first period in which the first transmission transistor is turned on is longer than a second period in which the second transmission transistor is turned on.

12. The imaging apparatus according to claim 10, wherein
the second transmission transistor is further configured to go into a turned-off state from the turned-on state at a first time point,
the first transmission transistor is further configured to go into the turned-off state from the turned-on state at a second time point,
the second transmission transistor is further configured to go into the turned-off state from the turned-on state at a third time point, and
a first time period between the first time point and the second time point is longer than a second time period between the second time point and the third time point.

13. The imaging apparatus according to claim 1, wherein
the circuitry is further configured to read out a first signal corresponding to the second charge transmitted to the charge-voltage converter,
the read out of the first signal is based on a turned-on state of the second transmission transistor,
the third transmission transistor is configured to be turned on based on the read out of the first signal,
the first charge is transmitted from the first memory to the charge-voltage converter based on the turn on of the third transmission transistor, and
the circuitry is further configured to read out a second signal corresponding to the first charge transmitted to the charge-voltage converter.

14. The imaging apparatus according to claim 1, wherein the discharge transistor is configured to be turned on in a period different from an exposure period.

15. The imaging apparatus according to claim 1, wherein
the discharge transistor is configured to be ternary-driven,
in a case where a first voltage is applied to the discharge transistor, a potential of the second overflow path is shallower than a potential of the first overflow path,
in a case where a second voltage is applied to the discharge transistor, the potential of the second overflow path is deeper than the potential of the first overflow path, and
in a case where a third voltage is applied to the discharge transistor, the discharge transistor is in a turned-on state.

16. A driving method, comprising:
in an imaging apparatus that includes
a pixel array portion,
a plurality of unit pixels in the pixel array portion,
circuitry configured to control an operation of each unit pixel of the plurality of unit pixels,
wherein each unit pixel of the plurality of unit pixels includes
a photoelectric converter,
a discharge transistor connected to the photoelectric converter,
a memory configured to retain a first charge,
a charge-voltage converter configured to convert the first charge into a voltage,
a first transmission transistor configured to transmit the first charge from the photoelectric converter to the memory,
a second transmission transistor configured to transmit a second charge from the photoelectric converter to the charge-voltage converter, and
a third transmission transistor configured to transmit the first charge from the memory to the charge-voltage converter,
a first overflow path in a lower portion of a gate electrode of the first transmission transistor,
wherein the first overflow path is configured to transmit a third charge leaked from the photoelectric converter to the memory, and
a second overflow path in a lower portion of a gate electrode of the discharge transistor,
wherein the second overflow path is configured to discharge the third charge leaked from the photoelectric converter:
alternately performing the transmission of the first charge from the photoelectric converter to the memory and the transmission of the second charge from the photoelectric converter to the charge-voltage converter by alternately turning on the first transmission transistor and the second transmission transistor in an exposure period.

17. An electronic device, comprising:
an imaging apparatus including:
a pixel array portion;
a plurality of unit pixels in the pixel array portion;
circuitry configured to control an operation of each unit pixel of the plurality of unit pixels, wherein each unit pixel of the plurality of unit pixels includes:
a photoelectric converter,
a discharge transistor connected to the photoelectric converter,
a memory configured to retain a first charge,
a charge-voltage converter configured to convert the first charge into a voltage,
a first transmission transistor configured to transmit the first charge from the photoelectric converter to the memory,
a second transmission transistor configured to transmit a second charge from the photoelectric converter to the charge-voltage converter, and
a third transmission transistor configured to transmit the first charge from the memory to the charge-voltage converter;
a first overflow path in a lower portion of a gate electrode of the first transmission transistor,
wherein the first overflow path is configured to transmit a third charge leaked from the photoelectric converter to the memory; and
a second overflow path in a lower portion of a gate electrode of the discharge transistor,
wherein the second overflow path is configured to discharge the third charge leaked from the photoelectric converter.

18. An imaging apparatus, comprising:
a pixel array portion;
a plurality of unit pixels in the pixel array portion; and
circuitry configured to control an operation of each unit pixel of the plurality of unit pixels,
wherein each unit pixel of the plurality of unit pixels includes:
a photoelectric converter,
a memory configured to retain a first charge,
a charge-voltage converter configured to convert the first charge into a voltage,
a first transmission transistor configured to transmit the first charge from the photoelectric converter to the memory, wherein
the first transmission transistor includes a second transmission transistor and a third transmission transistor,
the second transmission transistor is between the photoelectric converter and the memory, and
the third transmission transistor is on the memory, and
a fourth transmission transistor configured to transmit a second charge from the photoelectric converter to the charge-voltage converter, and
a fifth transmission transistor configured to transmit the first charge from the memory to the charge-voltage converter.

* * * * *